(12) United States Patent
Or-Bach et al.

(10) Patent No.: US 9,941,319 B2
(45) Date of Patent: Apr. 10, 2018

(54) SEMICONDUCTOR AND OPTOELECTRONIC METHODS AND DEVICES

(71) Applicant: Monolithic 3D Inc., San Jose, CA (US)

(72) Inventors: Zvi Or-Bach, San Jose, CA (US); Deepak C. Sekar, San Jose, CA (US)

(73) Assignee: Monolithic 3D Inc., San Jose, CA (US)

( * ) Notice: Subject to any disclaimer, the term of this patent is extended or adjusted under 35 U.S.C. 154(b) by 0 days.

(21) Appl. No.: 14/936,657

(22) Filed: Nov. 9, 2015

(65) Prior Publication Data
US 2016/0064439 A1 Mar. 3, 2016

Related U.S. Application Data

(63) Continuation-in-part of application No. 13/274,161, filed on Oct. 14, 2011, now Pat. No. 9,197,804, and a continuation-in-part of application No. 12/904,103, filed on Oct. 13, 2010, now Pat. No. 8,163,581.

(51) Int. Cl.
| | |
|---|---|
| *H04N 5/225* | (2006.01) |
| *H04N 5/232* | (2006.01) |
| *H01L 27/118* | (2006.01) |
| *H01L 21/70* | (2006.01) |
| *H01L 27/146* | (2006.01) |
| *H01L 25/075* | (2006.01) |
| *H01L 33/38* | (2010.01) |

(52) U.S. Cl.
CPC .... *H01L 27/14634* (2013.01); *H01L 27/1469* (2013.01); *H01L 27/14623* (2013.01); *H01L 27/14629* (2013.01); *H01L 27/14647* (2013.01); H01L 25/0756 (2013.01); H01L 33/382 (2013.01)

(58) Field of Classification Search
CPC .......... H01L 27/146–27/14893; H01L 27/118; H01L 21/70; H04N 5/335; H04N 5/225; H04N 5/232
USPC ........ 257/222, 225, 447; 348/308, 311, 340, 348/345, 357
See application file for complete search history.

(56) References Cited

U.S. PATENT DOCUMENTS

| | | | | |
|---|---|---|---|---|
| 2004/0229444 A1* | 11/2004 | Couillard | .......... | H01L 21/76254 438/455 |
| 2006/0108613 A1* | 5/2006 | Song | ................ | H01L 27/14601 257/233 |
| 2006/0158511 A1* | 7/2006 | Harrold | ................ | G02F 1/1333 348/51 |
| 2008/0070340 A1* | 3/2008 | Borrelli | ............. | H01L 21/76254 438/57 |
| 2009/0166627 A1* | 7/2009 | Han | ................ | H01L 27/14634 257/53 |
| 2009/0174018 A1* | 7/2009 | Dungan | ............ | H01L 21/76898 257/432 |
| 2010/0045849 A1* | 2/2010 | Yamasaki | ................ | G03B 3/10 348/349 |

(Continued)

*Primary Examiner* — Xi Wang
(74) *Attorney, Agent, or Firm* — Tran & Associates

(57) ABSTRACT

A method for processing a semiconductor wafer, the method including: providing a semiconductor wafer including an image sensor pixels layer including a plurality of image sensor pixels, the layer overlaying a wafer substrate; and then bonding the semiconductor wafer to a carrier wafer; and then cutting off a substantial portion of the wafer substrate, and then processing the substantial portion of the wafer substrate for reuse.

15 Claims, 82 Drawing Sheets

(56) References Cited

U.S. PATENT DOCUMENTS

2010/0320514 A1* 12/2010 Tredwell ........... H01L 27/14609
257/291
2010/0330728 A1* 12/2010 McCarten ........... H01L 27/1464
438/70
2012/0231572 A1* 9/2012 Or-Bach ............. H01L 31/0725
438/73

* cited by examiner

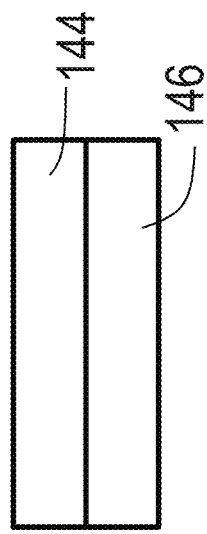
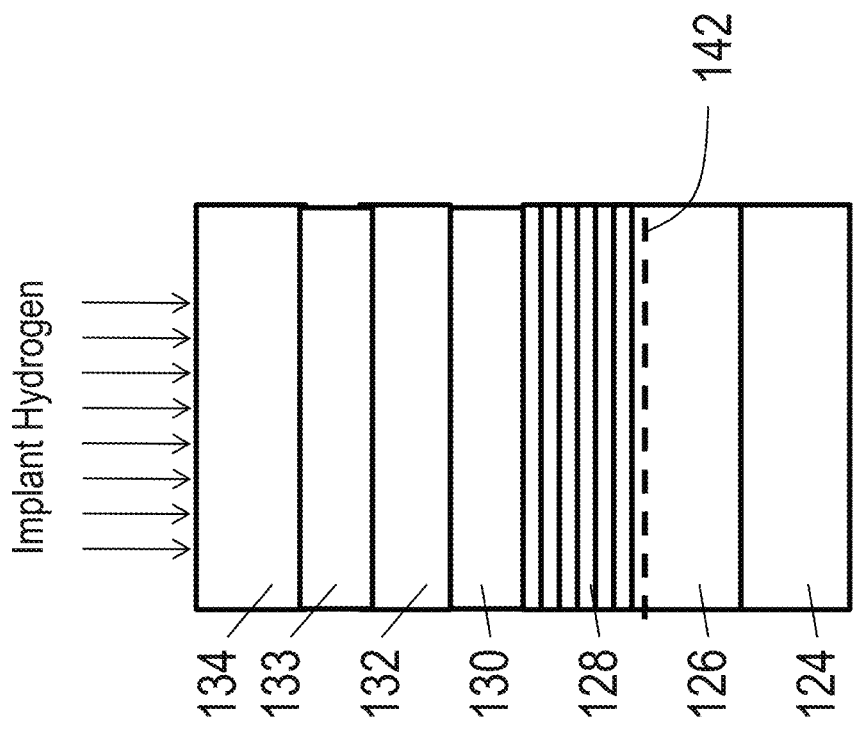

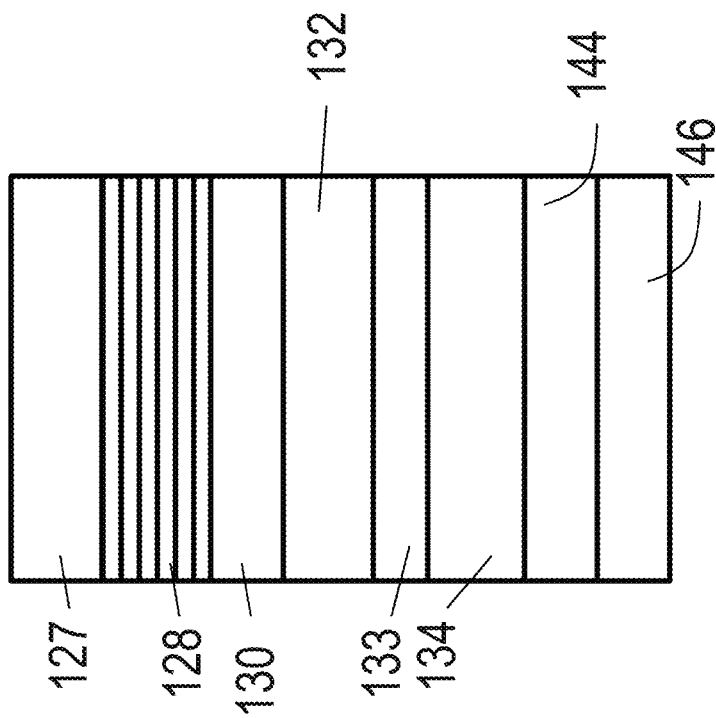
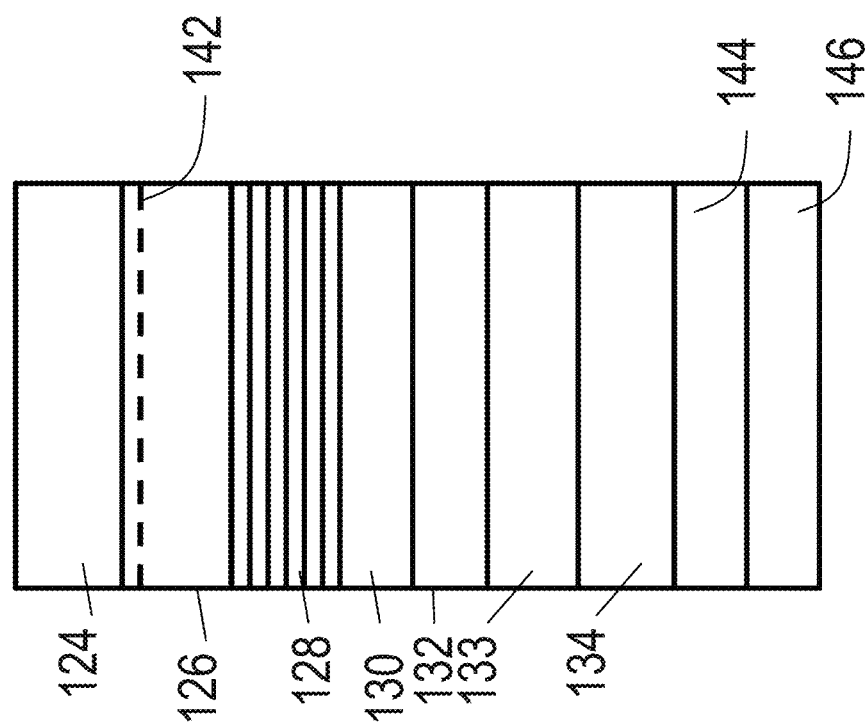

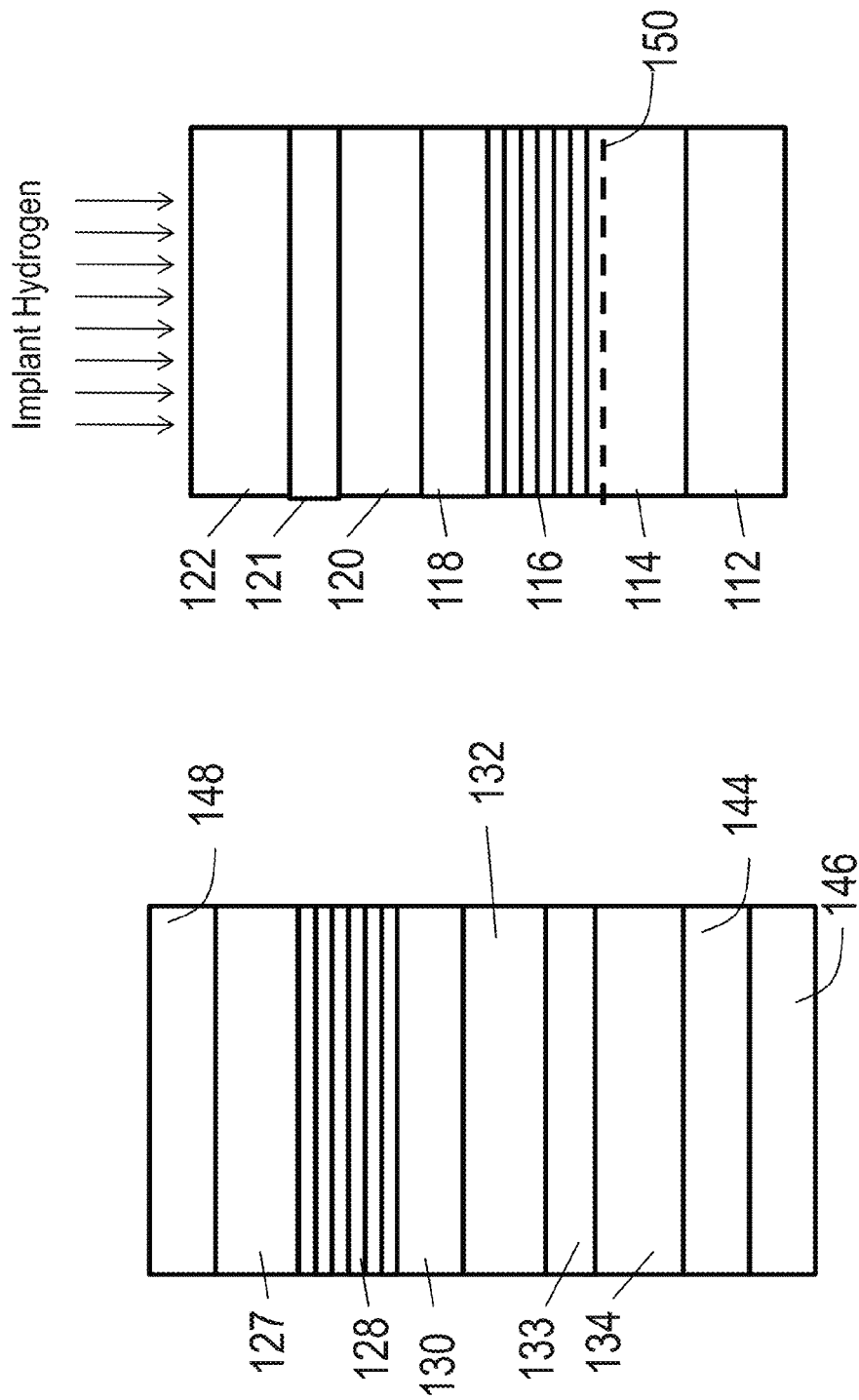

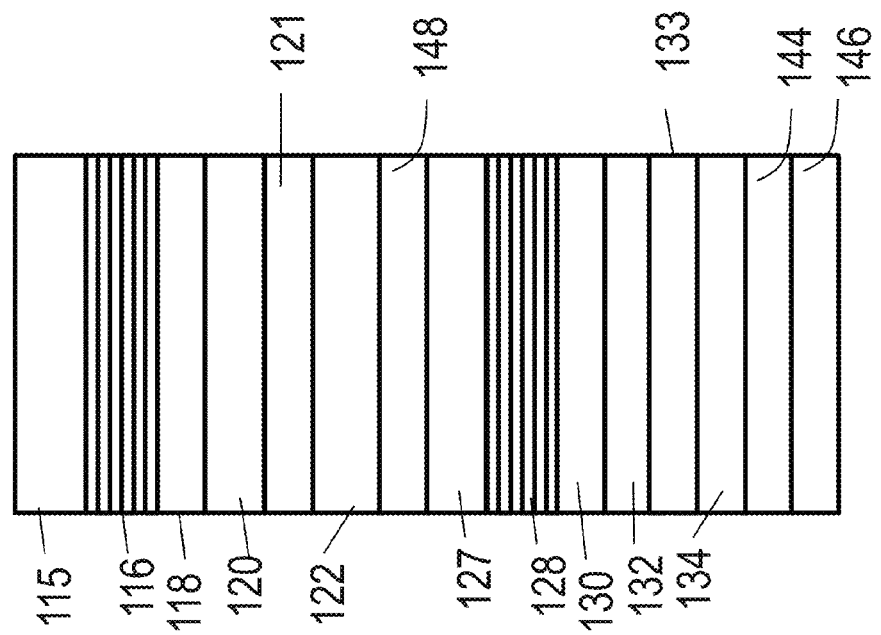
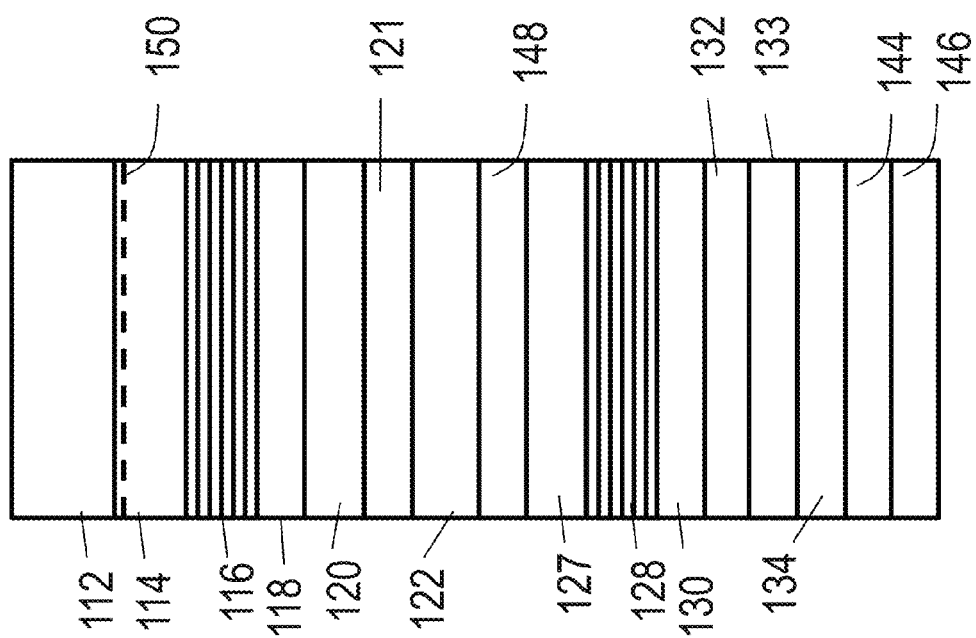

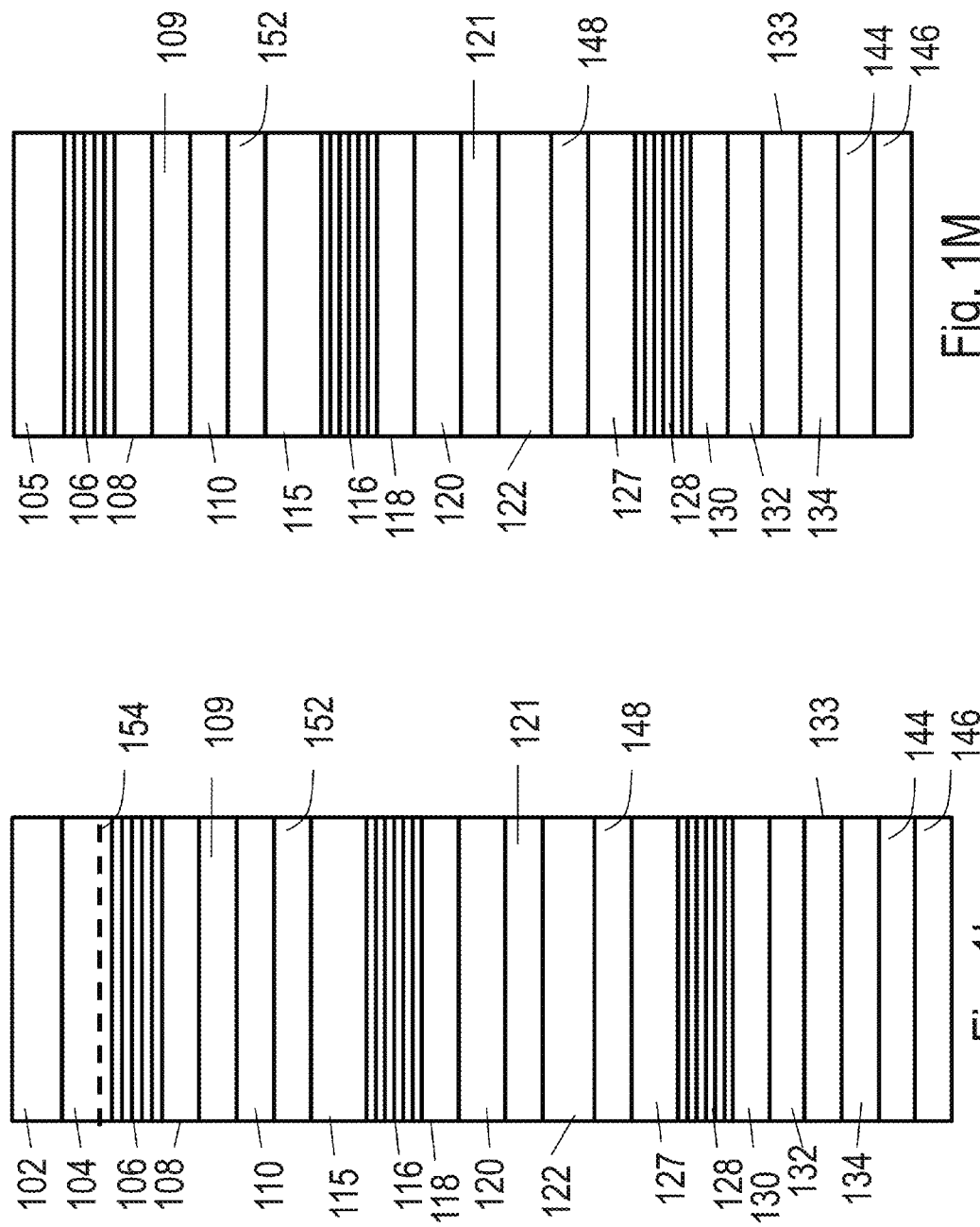

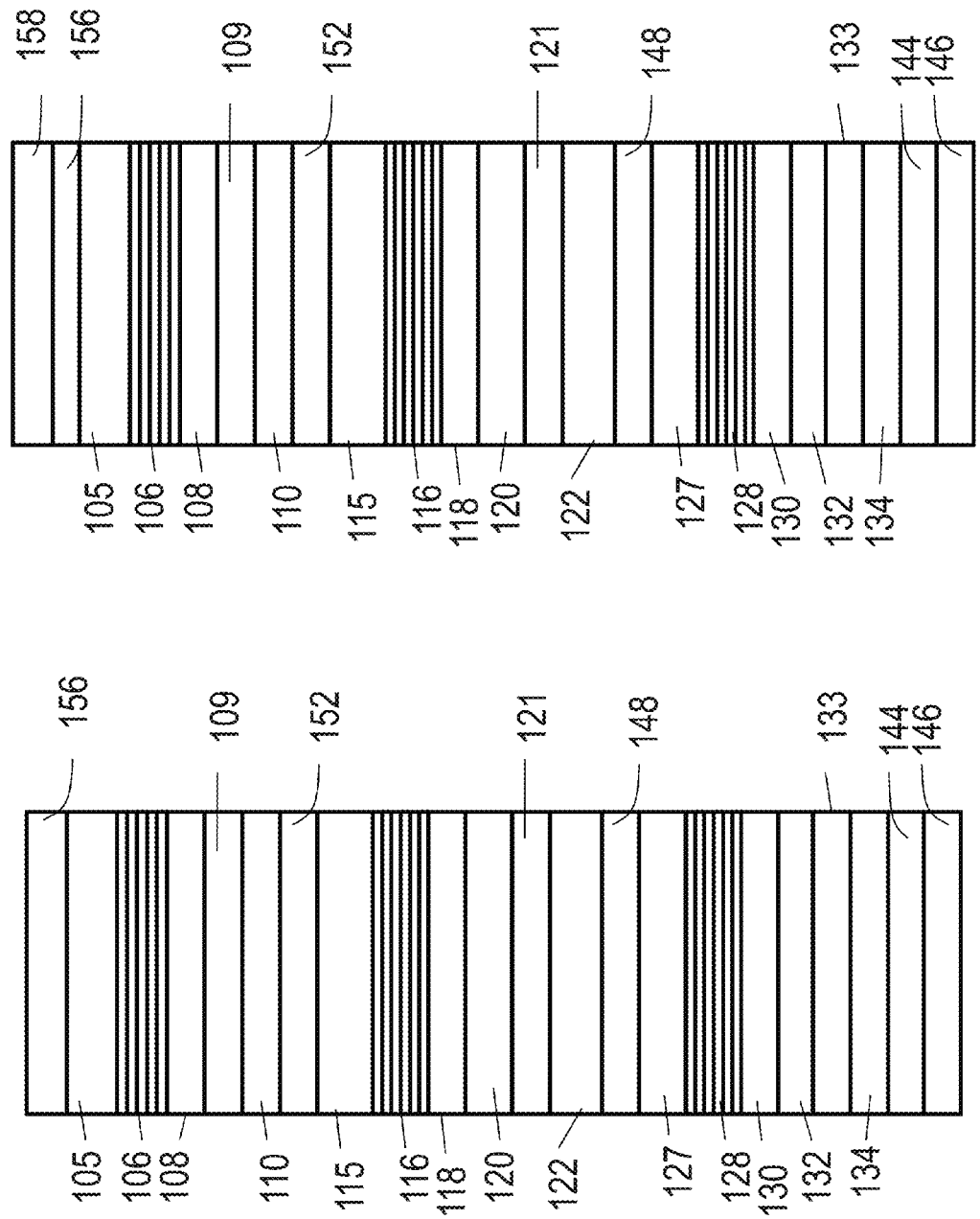

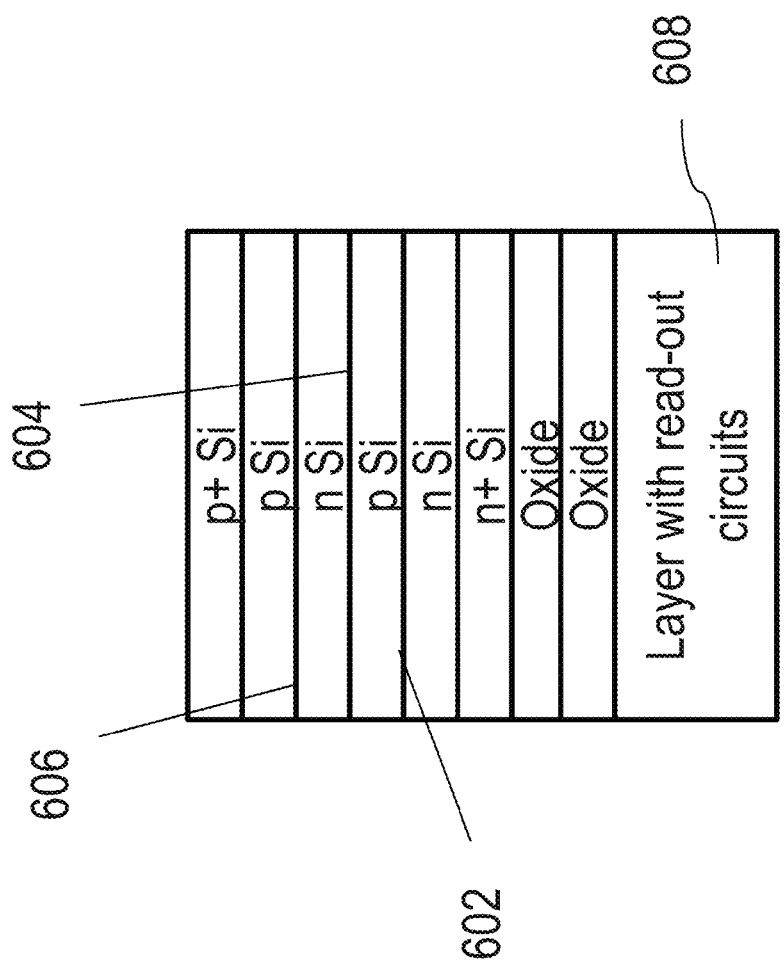

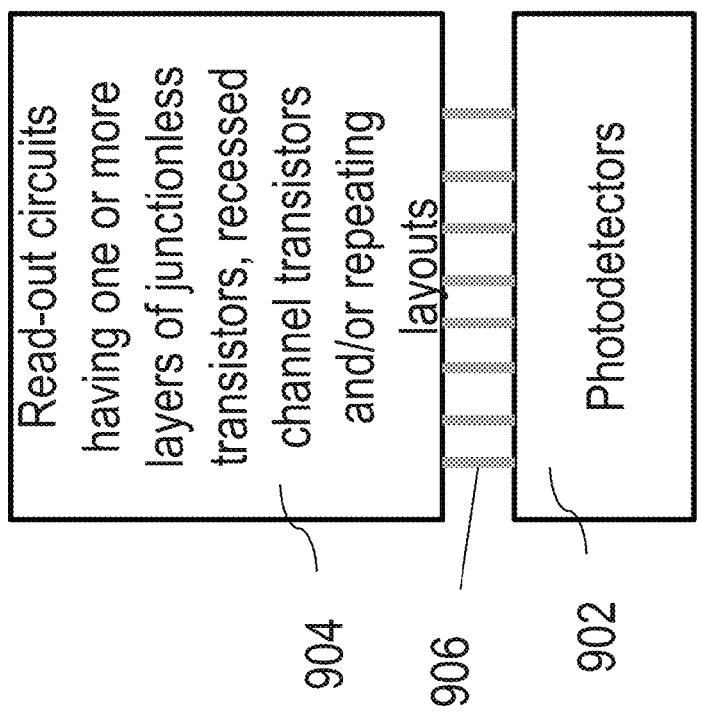

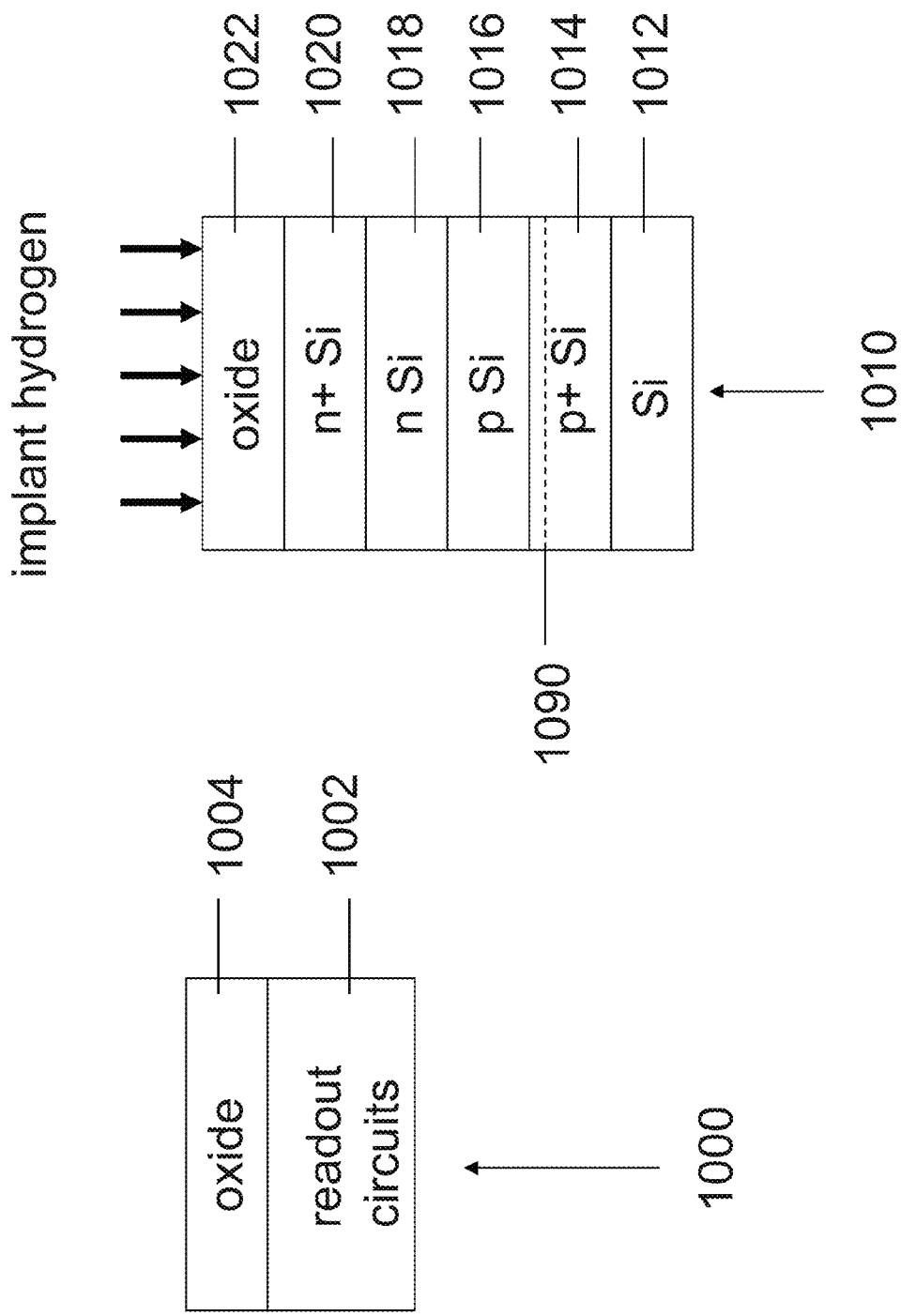

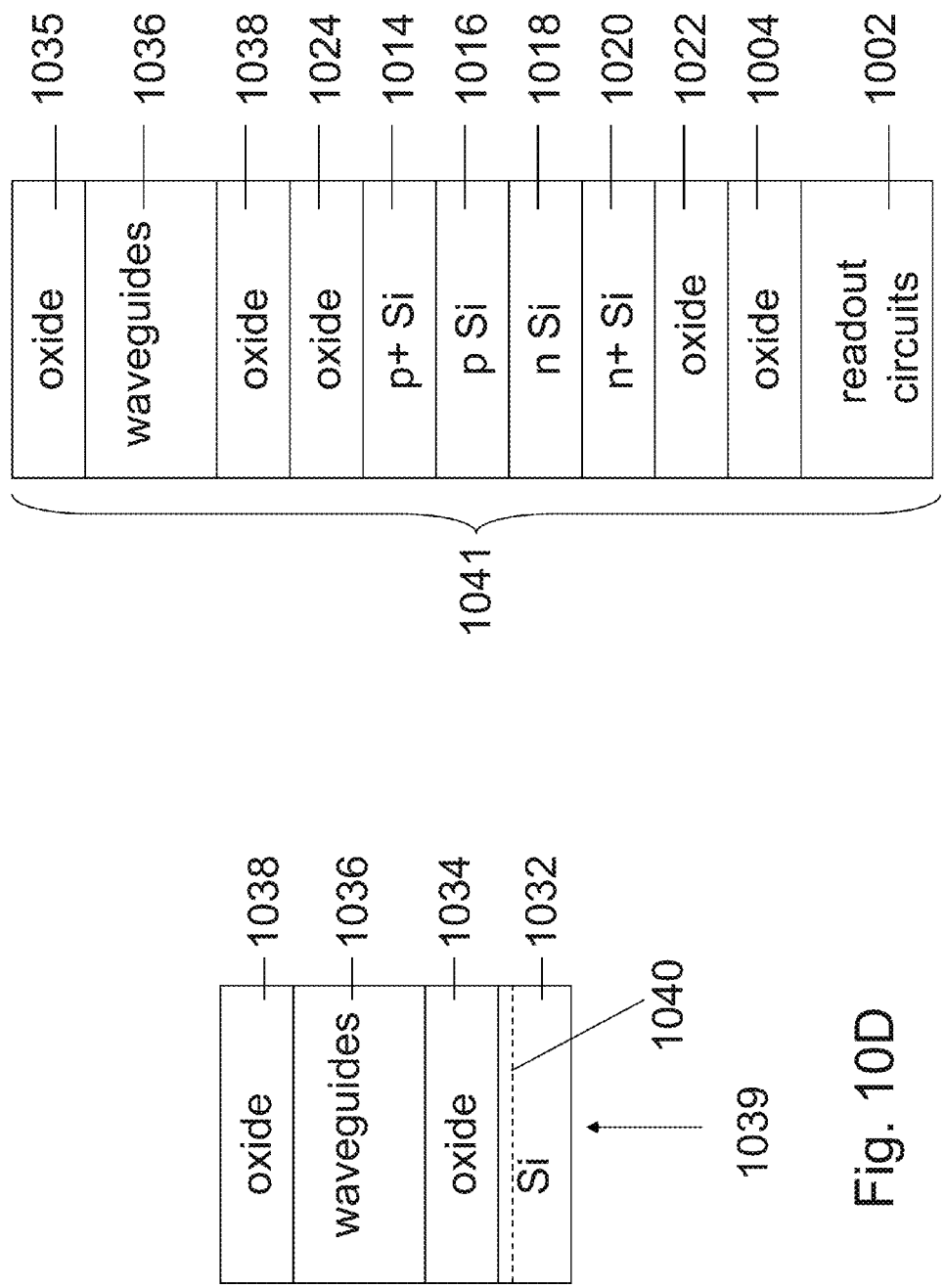

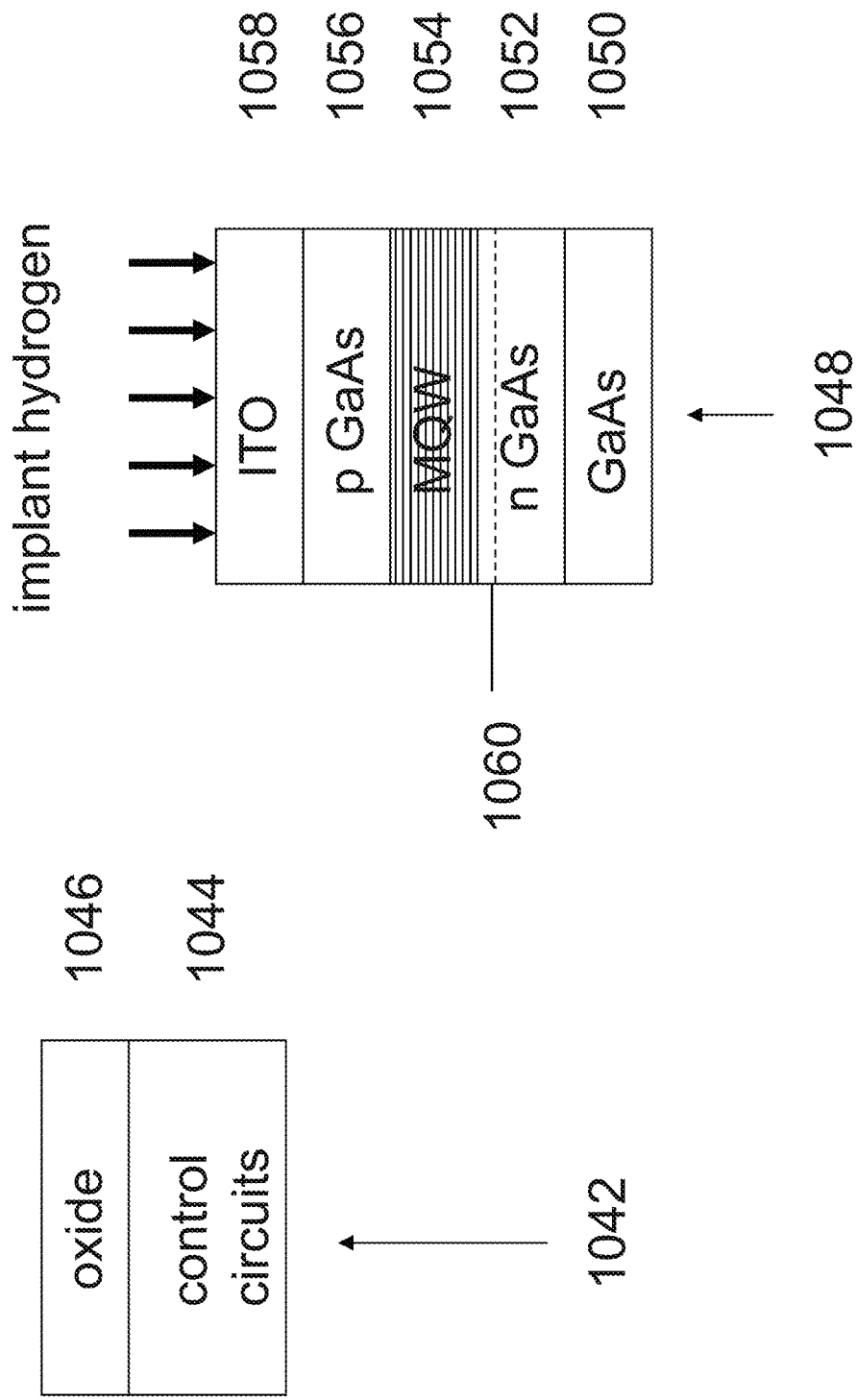

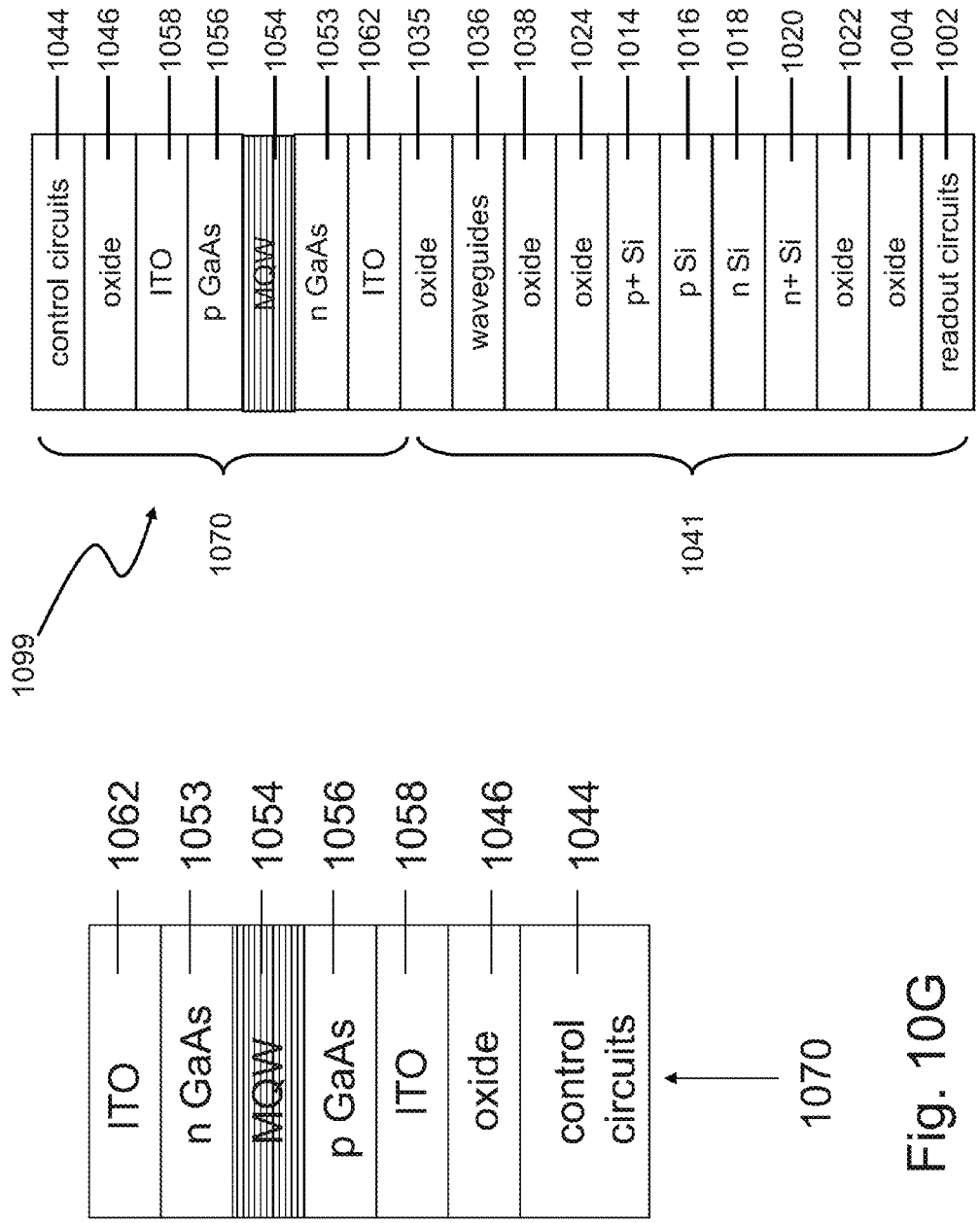

| oxide | waveguides | oxide | oxide | p+ Si | p Si | n Si | n+ Si | oxide | oxide | readout circuits |
|---|---|---|---|---|---|---|---|---|---|---|
| 1134 | 1136 | 1138 | 1124 | 1114 | 1116 | 1118 | 1120 | 1122 | 1104 | 1102 |

Fig. 11A

| | |
|---|---|
| oxide | — 1166 |
| p SiGe | — 1152 |
| undoped SiGe | — 1154 |
| SiGe/Ge MQW | — 1156 |
| undoped SiGe | — 1158 |
| n SiGe | — 1160 |
| oxide | — 1162 |
| oxide | — 1146 |
| control circuits | — 1144 |

Fig. 11C

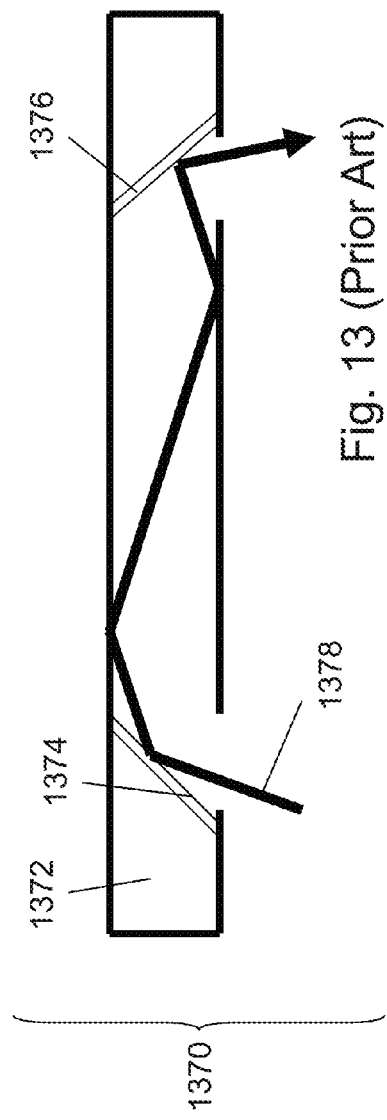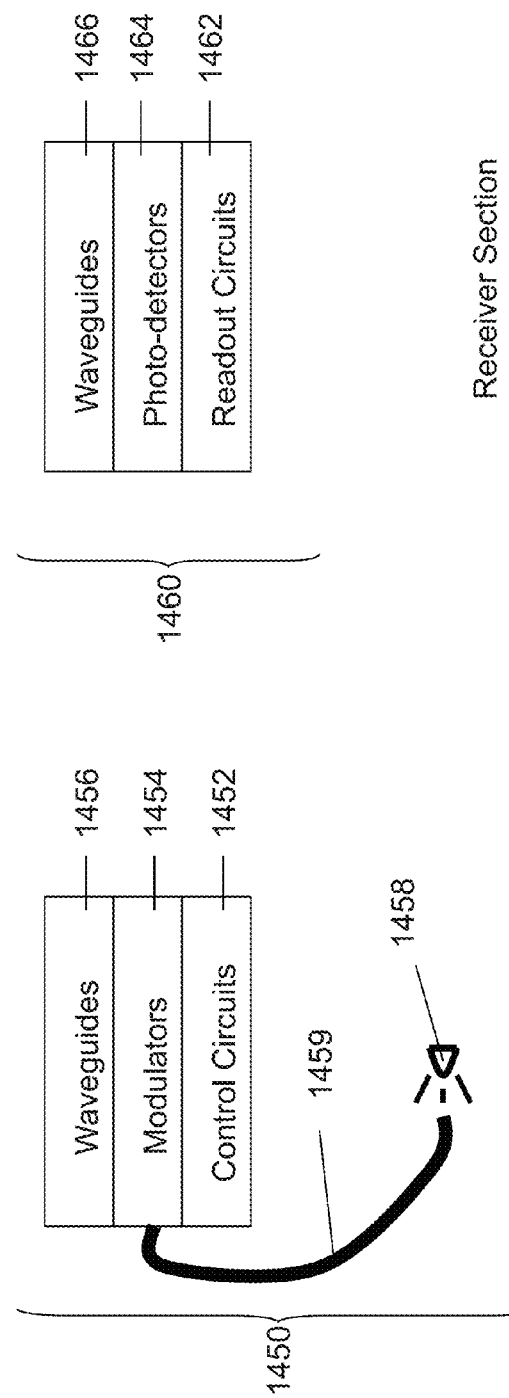

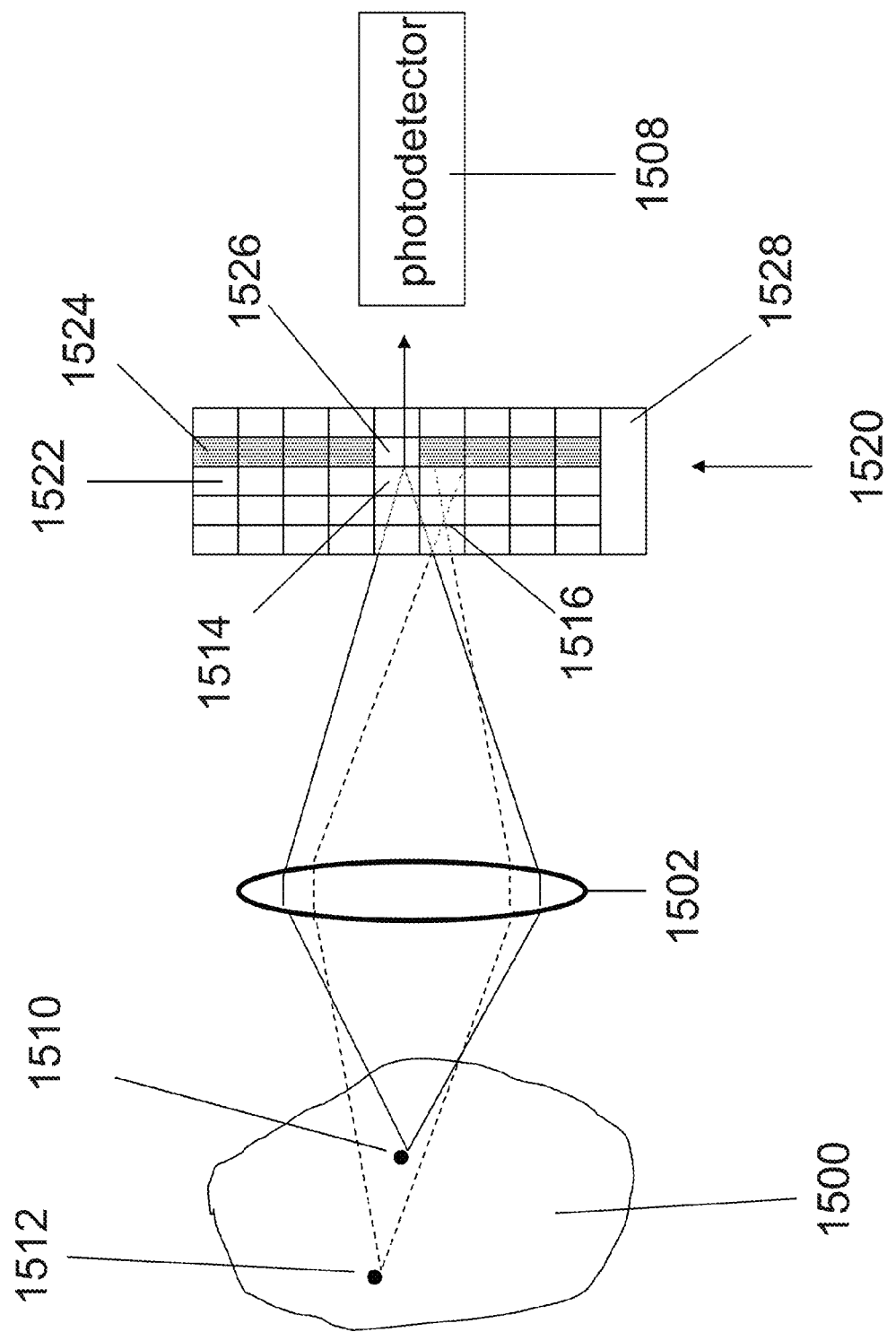

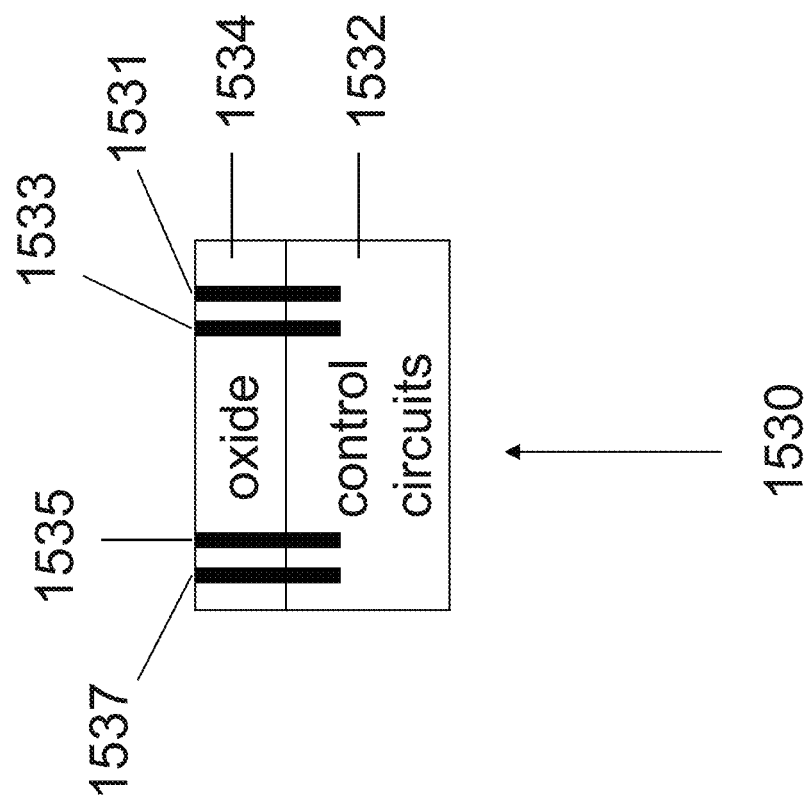

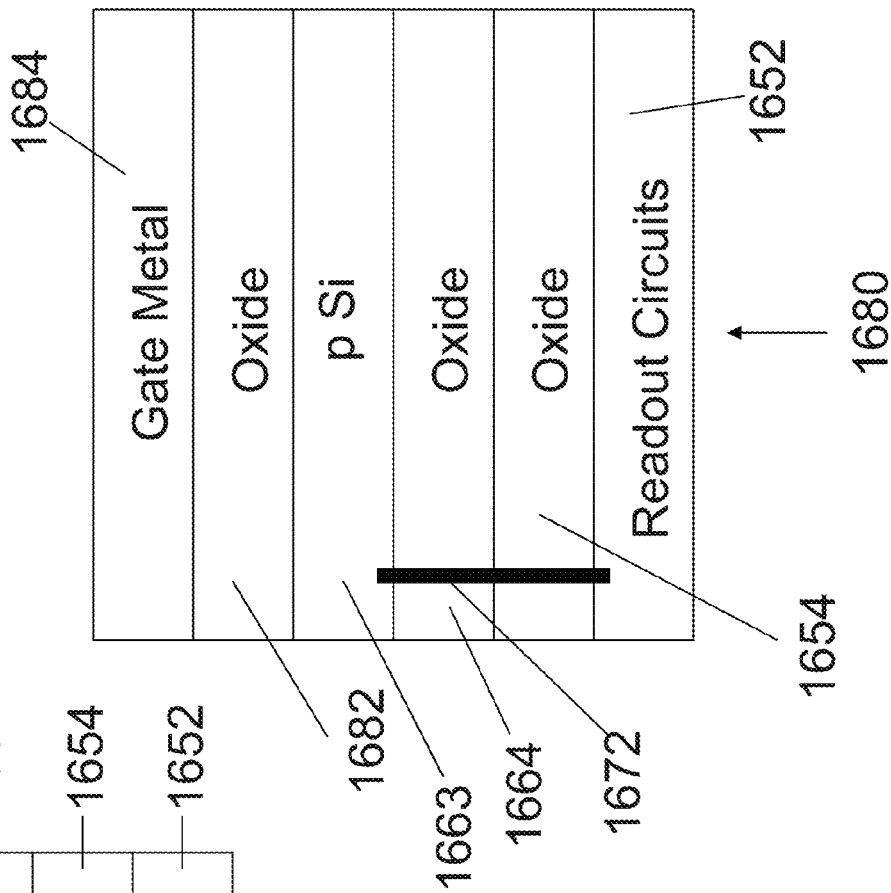
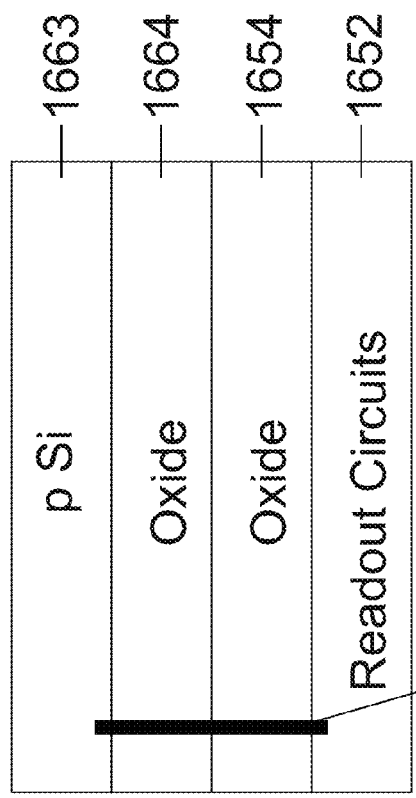
Fig. 16F
Fig. 16E

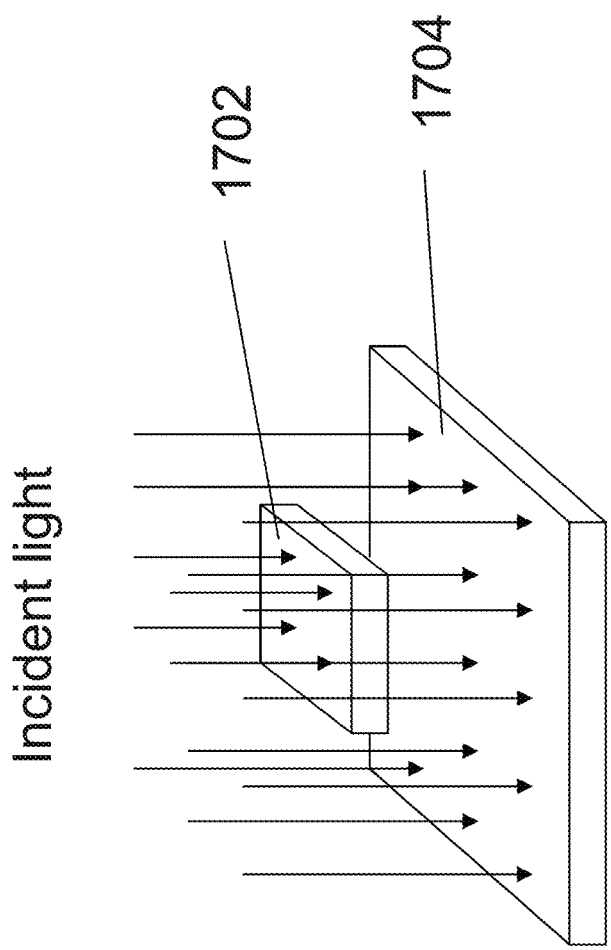

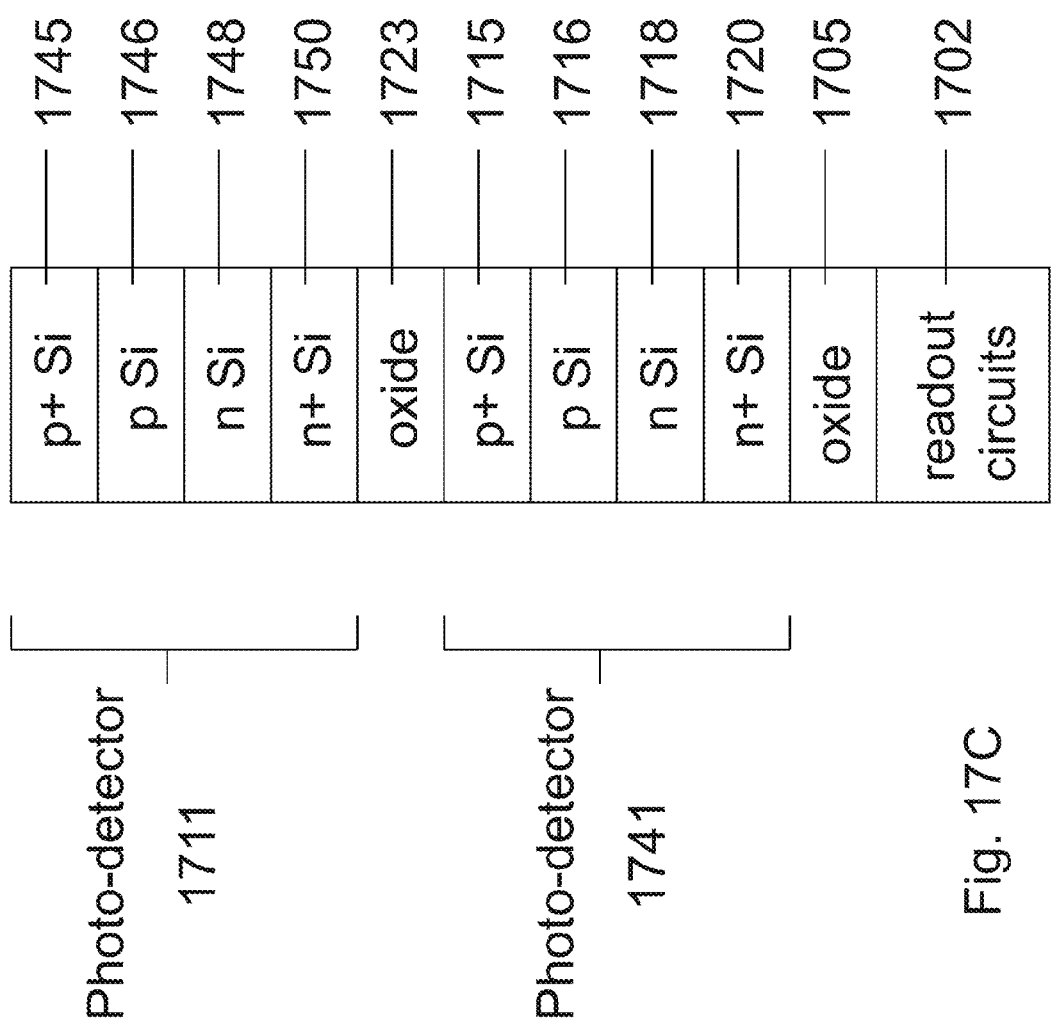

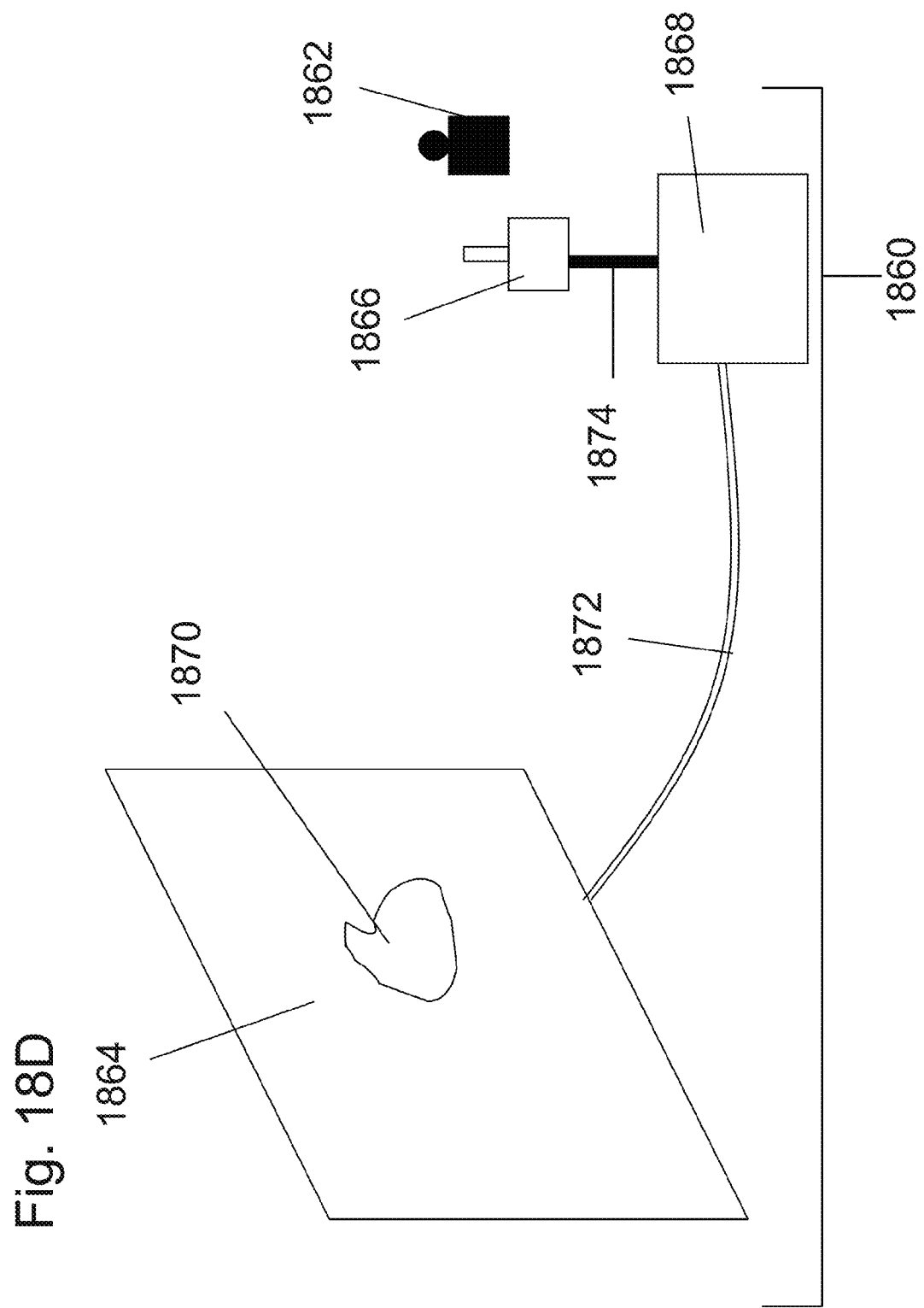

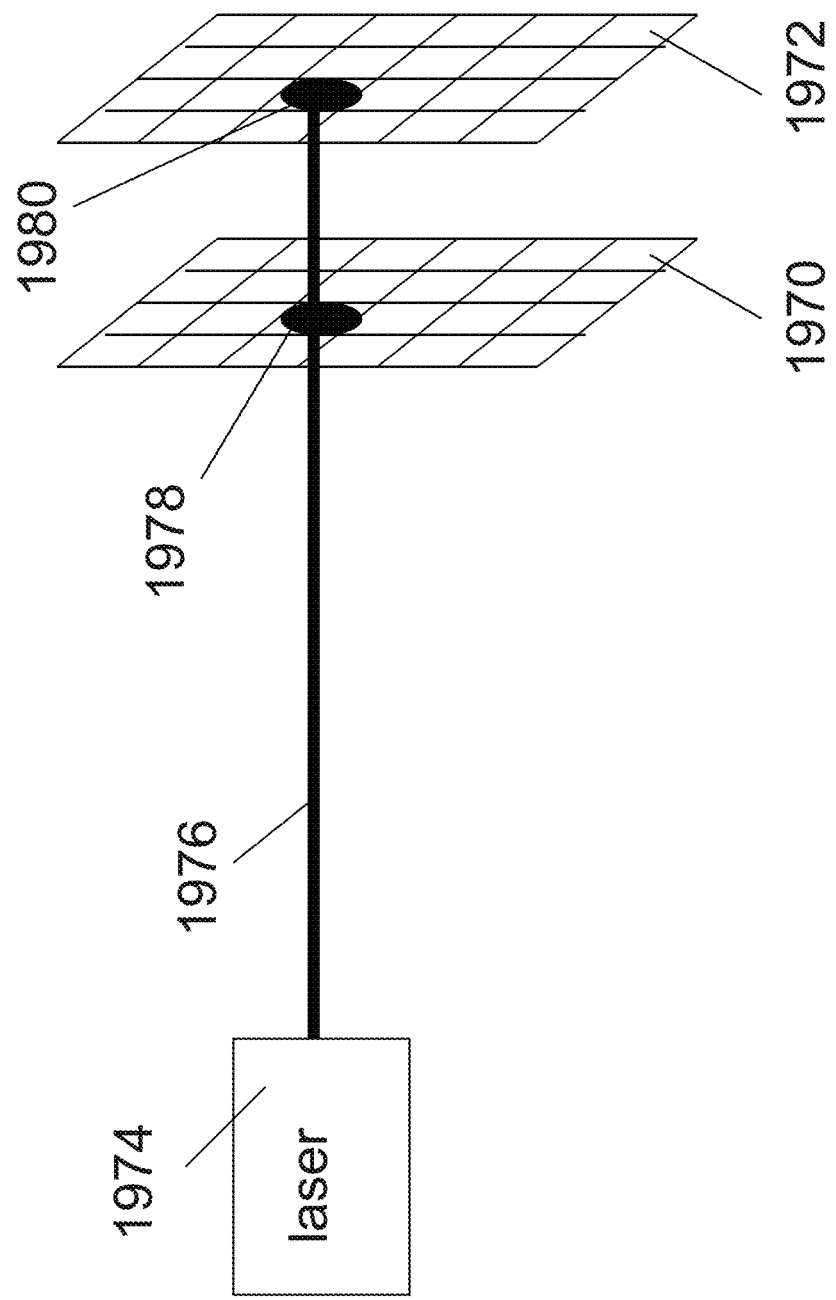

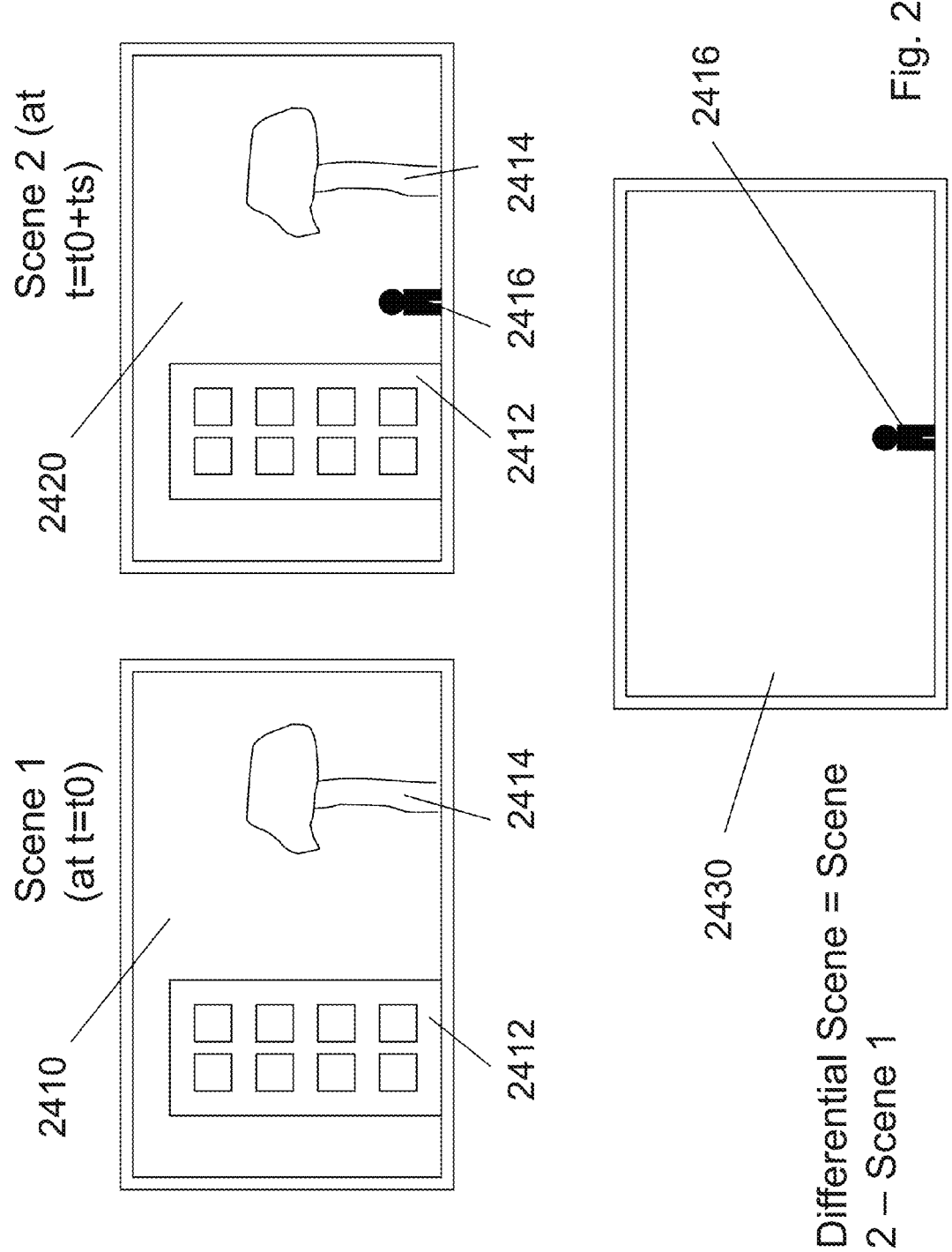

SEMICONDUCTOR AND OPTOELECTRONIC METHODS AND DEVICES

CROSS-REFERENCE OF RELATED APPLICATIONS

This application is a continuation in part of U.S. patent application Ser. No. 13/274,161 filed on Oct. 14, 2011; and this application claims priority of U.S. patent application Ser. No. 12/904,103, now U.S. Pat. No. 8,163,581, the contents of all of the preceding are incorporated herein by reference.

BACKGROUND OF THE INVENTION

(A) Field of the Invention

This invention describes applications of monolithic 3D integration to various disciplines, including but not limited to, for example, light-emitting diodes, displays, image-sensors and solar cells.

(B) Discussion of Background Art

Semiconductor and optoelectronic devices often require thin monocrystalline (or single-crystal) films deposited on a certain wafer. To enable this deposition, many techniques, generally referred to as layer transfer technologies, have been developed. These include:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology", JSAP International, Number 4, July 2001 by T. Yonehara and K. Sakaguchi ("Yonehara").

Lift-off with a temporary substrate, also referred to as epitaxial lift-off: This is described in "Epitaxial lift-off and its applications", 1993 Semicond. Sci. Technol. 8 1124 by P. Demeester, et al ("Demeester").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech Digest, p. 363 (2005) by A. W. Topol, D. C. La Tulipe, L. Shi, S. M. Alam, D J Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S Wong ("Cheung").

Rubber stamp layer transfer: This is described in "Solar cells sliced and diced", 19, May 2010, Nature News. With novel applications of these methods and recognition of their individual strengths and weaknesses, one can significantly enhance today's light-emitting diode (LED), display, image-sensor and solar cell technologies.

Background on LEDs

Light emitting diodes (LEDs) are used in many applications, including automotive lighting, incandescent bulb replacements, and as backlights for displays. Red LEDs are typically made on Gallium Arsenide (GaAs) substrates, and include quantum wells constructed of various materials such as AlInGaP and GaInP. Blue and green LEDs are typically made on Sapphire or Silicon Carbide (SiC) or bulk Gallium Nitride (GaN) substrates, and include quantum wells constructed of various materials such as GaN and InGaN.

A white LED for lighting and display applications can be constructed by either using a blue LED coated with phosphor (called phosphor-coated LED or pcLED) or by combining light from red, blue, and green LEDs (called RGB LED). RGB LEDs are typically constructed by placing red, blue, and green LEDs side-by-side. While RGB LEDs are more energy-efficient than pcLEDs, they are less efficient in mixing red, blue and green colors to form white light. They also are much more costly than pcLEDs. To tackle issues with RGB LEDs, several proposals have been made.

One RGB LED proposal from Hong Kong University is described in "Design of vertically stacked polychromatic light emitting diodes", Optics Express, June 2009 by K. Hui, X. Wang, et al ("Hui"). It involves stacking red, blue, and green LEDs on top of each other after individually packaging each of these LEDs. While this solves light mixing problems, this RGB-LED is still much more costly than a pcLED solution since three LEDs for red, blue, and green color need to be packaged. A pcLED, on the other hand, requires just one LED to be packaged and coated with phosphor.

Another RGB LED proposal from Nichia Corporation is described in "Phosphor Free High-Luminous-Efficiency White Light-Emitting Diodes Composed of InGaN Multi-Quantum Well", Japanese Journal of Applied Physics, 2002 by M. Yamada, Y Narukawa, et al. ("Yamada"). It involves constructing and stacking red, blue and green LEDs of GaN-based materials on a sapphire or SiC substrate. However, red LEDs are not efficient when constructed with GaN-based material systems, and that hampers usefulness of this implementation. It is not possible to deposit defect-free AlInGaP/InGaP for red LEDs on the same substrate as GaN based blue and green LEDs, due to a mismatch in thermal expansion co-efficient between the various material systems.

Yet another RGB-LED proposal is described in "Cascade Single chip phosphor-free while light emitting diodes", Applied Physics Letters, 2008 by X. Guo, G. Shen, et al. ("Guo"). It involves bonding GaAs based red LEDs with GaN based blue-green LEDs to produce white light. Unfortunately, this bonding process requires 600° C. temperatures, causing issues with mismatch of thermal expansion co-efficients and cracking. Another publication on this topic is "A trichromatic phosphor-free white light-emitting diode by using adhesive bonding scheme", Proc. SPIE, Vol. 7635, 2009 by D. Chuai, X. Guo, et al. ("Chuai"). It involves bonding red LEDs with green-blue LED stacks. Bonding is done at the die level after dicing, which is more costly than a wafer-based approach.

U.S. patent application Ser. No. 12/130,824 describes various stacked RGB LED devices. It also briefly mentions a method for construction of a stacked LED where all layers of the stacked LED are transferred using lift-off with a temporary carrier and Indium Tin Oxide (ITO) to semiconductor bonding. This method has several issues for constructing a RGB LED stack. First, it is difficult to manufacture a lift-off with a temporary carrier of red LEDs for producing a RGB LED stack, especially for substrates larger than 2 inch. This is because red LEDs are typically constructed on non-transparent GaAs substrates, and lift-off with a temporary carrier is done by using an epitaxial lift-off process. Here, the thin film to be transferred typically sits atop a "release-layer" (eg. AlAs), this release layer is removed by etch procedures after the thin film is attached to a temporary substrate. Scaling this process to 4 inch wafers and bigger is difficult. Second, it is very difficult to perform the bonding of ITO to semiconductor materials of a LED layer at reasonable temperatures, as described in the patent application Ser. No. 12/130,824.

It is therefore clear that a better method for constructing RGB LEDs will be helpful. Since RGB LEDs are significantly more efficient than pcLEDs, they can be used as replacements of today's phosphor-based LEDs for many applications, provided a cheap and effective method of constructing RGB LEDs can be invented.

Background on Image-Sensors:

Image sensors are used in applications such as cameras. Red, blue, and green components of the incident light are sensed and stored in digital format. CMOS image sensors typically contain a photodetector and sensing circuitry. Almost all image sensors today have both the photodetector and sensing circuitry on the same chip. Since the area consumed by the sensing circuits is high, the photodetector cannot see the entire incident light, and image capture is not as efficient.

To tackle this problem, several researchers have proposed building the photodetectors and the sensing circuitry on separate chips and stacking them on top of each other. A publication that describes this method is "Megapixel CMOS image sensor fabricated in three-dimensional integrated circuit technology", Intl. Solid State Circuits Conference 2005 by Suntharalingam, V., Berger, R., et al. ("Suntharalingam") These proposals use through-silicon via (TSV) technology where alignment is done in conjunction with bonding. However, pixel size is reaching the 1 μm range, and successfully processing TSVs in the 1 μm range or below is very difficult. This is due to alignment issues while bonding. For example, the International Technology Roadmap for Semiconductors (ITRS) suggests that the 2-4 um TSV pitch will be the industry standard until 2012. A 2-4 μm pitch TSV will be too big for a sub-1 μm pixel. Therefore, novel techniques of stacking photodetectors and sensing circuitry are required.

A possible solution to this problem is given in "Setting up 3D Sequential Integration for Back-Illuminated CMOS Image Sensors with Highly Miniaturized Pixels with Low Temperature Fully-depleted SOI Transistors," IEDM, p. 1-4 (2008) by P. Coudrain et al. ("Coudrain"). In the publication, transistors are monolithically integrated on top of photodetectors. Unfortunately, transistor process temperatures reach 600° C. or more. This is not ideal for transistors (that require a higher thermal budget) and photodetectors (that may prefer a lower thermal budget).

Background on Displays:

Liquid Crystal Displays (LCDs) can be classified into two types based on manufacturing technology utilized: (1) Large-size displays that are made of amorphous/polycrystalline silicon thin-film-transistors (TFTs), and (2) Microdisplays that utilize single-crystal silicon transistors. Microdisplays are typically used where very high resolution is needed, such as camera/camcorder view-finders, projectors and wearable computers.

Microdisplays are made in semiconductor fabs with 200 mm or 300 mm wafers. They are typically constructed with LCOS (Liquid-Crystal-on-Silicon) Technology and are reflective in nature. An exception to this trend of reflective microdisplays is technology from Kopin Corporation (U.S. Pat. No. 5,317,236, filed December 1991). This company utilizes transmittive displays with a lift-off layer transfer scheme. Transmittive displays may be generally preferred for various applications.

While lift-off layer transfer schemes are viable for transmittive displays, they are frequently not used for semiconductor manufacturing due to yield issues. Therefore, other layer transfer schemes will be helpful. However, it is not easy to utilize other layer transfer schemes for making transistors in microdisplays. For example, application of "smart-cut" layer transfer to attach monocrystalline silicon transistors to glass is described in "Integration of Single Crystal Si TFTs and Circuits on a Large Glass Substrate", IEDM 2009 by Y. Takafuji, Y. Fukushima, K. Tomiyasu, et al. ("Takafuji"). Unfortunately, hydrogen is implanted through the gate oxide of transferred transistors in the process, and this degrades performance. Process temperatures are as high as 600° C. in this paper, and this requires costly glass substrates. Several challenges therefore need to be overcome for efficient layer transfer, and require innovation.

Background on Solar Cells:

Solar cells can be constructed of several materials such as, for example, silicon and compound semiconductors. The highest efficiency solar cells are typically multi junction solar cells that are constructed of compound semiconductor materials. These multi junction solar cells are typically constructed on a germanium substrate, and semiconductors with various band-gaps are epitaxially grown atop this substrate to capture different portions of the solar spectrum.

There are a few issues with standard multi junction solar cells. Since multiple junctions are grown epitaxially above a single substrate (such as Germanium) at high temperature, materials used for different junctions are restricted to those that have lattice constants and thermal expansion co-efficients close to those of the substrate. Therefore, the choice of materials used to build junctions for multi junction solar cells is limited. As a result, most multi junction solar cells commercially available today cannot capture the full solar spectrum. Efficiency of the solar cell can be improved if a large band of the solar spectrum is captured. Furthermore, multi junction solar cells today suffer from high cost of the substrate above which multiple junctions are epitaxially grown. Methods to build multi junction solar cells that tackle both these issues will be helpful.

A method of making multi junction solar cells by mechanically bonding two solar cells, one with a Germanium junction and another with a compound semiconductor junction is described in "Towards highly efficient 4-terminal mechanical photovoltaic stacks", III-Vs Review, Volume 19, Issue 7, September-October 2006 by Giovanni Flamand, Jef Poortmans ("Flamand") In this work, the authors make the compound semiconductor junctions on a Germanium substrate epitaxially. They then etch away the entire Germanium substrate after bonding to the other substrate with the Germanium junction. The process uses two Germanium substrates, and is therefore expensive.

Techniques to create multi junction solar cells with layer transfer have been described in "Wafer bonding and layer transfer processes for 4-junction high efficiency solar cells," *Photovoltaic Specialists Conference, 2002. Conference Record of the Twenty-Ninth IEEE*, vol., no., pp. 1039-1042, 19-24 May 2002 by Zahler, J. M.; Fontcuberta i Morral, A.; Chang-Geun Ahn; Atwater, H. A.; Wanlass, M. W.; Chu, C. and Iles, P. A. An anneal is used for ion-cut purposes, and this anneal is typically done at temperatures higher than 350-400° C. (if high bond strength is desired). When that happens, cracking and defects can be produced due to mismatch of co-efficients of thermal expansion between various layers in the stack. Furthermore, semiconductor layers are bonded together, and the quality of this bond not as good as oxide-to-oxide bonding, especially for lower process temperatures.

Background on CCD Sensors:

Image sensors based on Charge-Coupled Device (CCD) technology has been around for several decades. The CCD technology relies on a collect and shift scheme, wherein charges are collected in individual cells according to the luminosity of the light falling on each of them, then the charges are sequentially shifted towards one edge of the sensor where readout circuits read the sequence of charges one at a time.

The advantage of CCD technology is it has better light sensitivity since almost the entire CCD cell area is dedicated to light collecting, and the control and readout circuits are all on one edge not blocking the light. On the other hand, in a CMOS sensor, the photodiodes in each cell have to share space with the control and readout circuits adjacent to them, and so their size and light sensitivity are therefore limited.

The main issue with CCD technology is this sequential shifting of image information from cell to cell is slow and limits the speed and cell density of CCD image sensors. A potential solution is to put the readout circuits directly under each CCD cell, so that the information is read in parallel rather than in time sequence, thus removing the shifting delay entirely.

Background on High Dynamic Range (HDR) Sensors:

Ever since the advent of commercial digital photography in the 1990s, achieving High Dynamic Range (HDR) imaging has been a goal for most camera manufacturers in their image sensors. The idea is to use various techniques to compensate for the lower dynamic range of image sensors relative to the human eye. The concept of HDR however, is not new. Combining multiple exposures of a single image to achieve a wide range of luminosity was actually pioneered in the 1850s by Gustave Le Gray to render seascapes showing both the bright sky and the dark sea. This was necessary to produce realistic photographic images as the film used at that time had exptremely low dynamic range compared to the human eye.

In digital cameras, the typical approach is to capture images using exposure bracketing, and then combining them into a single HDR image. The issue with this is that multiple exposures are performed over some period of time, and if there is movement of the camera or target during the time of the exposures, the final HDR image will reflect this by loss of sharpness. Moreover, multiple images may lead to large data in storage devices. Other methods use software algorithms to extract HDR information from a single exposure, but as they can only process information that is recordable by the sensor, there is a permanent loss of some details.

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,557,632, 8,298,875, 8,642,416, 8,362,482, 8,378,715, 8,379,458, 8,450,804, 8,574,929, 8,581,349, 8,642,416, 8,687,399, 8,742,476, 8,674,470, 8,803,206, 8,902,663, 8,994,404, 9,021,414, 9,023,688, 9,030,858; US patent publications 2011/0092030 and 2013/0020707; and pending U.S. patent application Ser. Nos. 13/836,080, 62/077,280, 62/042,229, 13/803,437, 61/932,617, 14/607,077, 14/642,724, 62/139,636, 62/149,651, and 62/198,126. The entire contents of the foregoing patents, publications, and applications are incorporated herein by reference.

Electro-Optics: There is also work done for integrated monolithic 3D including layers of different crystals, such as U.S. Pat. No. 8,283,215, U.S. Pat. Nos. 8,163,581, 8,753,913, 8,823,122, and U.S. patent application Ser. Nos. 13/274,161 and 14/461,539. The entire contents of the foregoing patents, publications, and applications are incorporated herein by reference.

SUMMARY

Techniques to utilize layer transfer schemes such as ion-cut to form novel light emitting diodes (LEDs), CMOS image sensors, displays, microdisplays and solar cells are discussed.

In one aspect, a light-emitting integrated wafer structure includes three overlying layers, wherein each of said three overlying layers emits light at a different wavelength and wherein at least one of said three overlying layers is transferred to the light-emitting integrated wafer structure using one of atomic species implants assisted cleaving, laser lift-off, etch-back, or chemical-mechanical-polishing (CMP).

In another aspect, an integrated image sensor includes two overlying layers, wherein one of said two overlying layers is an image sensor layer and at least one of said two overlying layers is less than 5 microns thick, and wherein said two overlying layers are constructed at a temperature not exceeding 450° C.

In another aspect, a display device with junctionless transistors is disclosed.

In yet another aspect, a method for fabricating a light-emitting integrated device, includes overlying three layers, wherein each of said three layers emits light at a different wavelength, and wherein said overlying comprises one of: performing an atomic species implantation, performing a laser lift-off, performing an etch-back, or chemical-mechanical polishing (CMP).

In another aspect, a method for fabricating an integrated image sensor, includes overlying a first layer on a second layer to form a combined layer, wherein one of the first and second layers is an image sensor layer and at least one of the first and second layers is less than 5 microns thick, and wherein said overlying is performed at a temperature not exceeding 450° C.

In yet another aspect, a method is disclosed for forming a display whose pixels are controlled by junctionless transistors.

In another aspect, a method for fabricating an optical interconnect system consisting of five stacked layers, wherein the first of said multiple layers may contain the control circuits to regulate the LEDs or modulators, the second of said five layers may contain LEDs or modulators that generate or shape the light to be used for data transmission, the third of said five layers may contain waveguides to distribute the pulsed light containing the data, the fourth of said five layers may contain photo-detectors to act as receivers for the optical signals, and the fifth of said five layers may contain the readout circuits to convert the data from the photo-detectors into electrical form.

In another aspect, a method for fabricating an optical interconnect system where a thin waveguide layer stacked on the active components of the chip may be used to allow for on-chip communication.

In another aspect, a method for fabricating an equivalent to a scanning screen with an aperture in a 3D confocal microscopy system by using a 3D stack of optical modulators, which then form a fixed electronically controlled screen and aperture that performs the equivalent scanning without need for mechanical actuation nor movement.

In another aspect, a method using layer transfer for fabricating a CCD sensor with readout circuits underneath so as to collect image data from each cell in parallel, thus eliminating the shifting delay inherent in the traditional CCD charge transfer sequencing scheme.

In another aspect, a method using layer transfer for fabricating an image sensor consisting of one layer of photo-detectors with small light-sensitive areas, stacked on top of another layer of photo-detectors with larger light-sensitive areas.

In another aspect, a method for enabling 3D viewing of objects in an image through actual physical distances of individual objects to the viewer displayed separately on a display screen actuated by a fast motor.

In another aspect, given the existence of 3D details of the objects in the image, a method of using an external joystick to rotate the stage of the image to present different vantage points to the viewer.

In another aspect, a method using layer transfer for fabricating two image sensor arrays monolithically stacked on top of each other with an insulating layer between them and underlying control, readout, and memory circuits.

In another aspect, algorithms for reconstructing objects from images detected by a camera which includes a lens and two image sensor arrays of distinct distances from the lens.

In another aspect, a gesture remote control system using images detected by a camera which includes a lens and two image sensor arrays of distinct distances from the lens.

In another aspect, a surveillance camera system using images detected by a camera which includes a lens and two image sensor arrays of distinct distances from the lens.

In another aspect, a method of constructing a camera which includes a lens and two image sensor arrays of distinct effective distances from the lens, wherein images from the lens are split between the two image sensors by a beam-splitter.

In another aspect, a method of constructing a camera which includes a lens, an image sensor array, and a fast motor, wherein the fast motor actuates the image sensor's position relative to the lens so as to record images from the lens at distinct effective distances from the lens.

In another aspect, a camera system including, a first image sensor array and a second image sensor array wherein the first image sensor array is designed for a first focal plane in front of the camera, and the second image sensor array is designed for a second focal plane in front of the camera, wherein the distance to the first focal plane is substantially different than the distance to the second focal plane.

In another aspect, a camera system including, an image sensor sub system and a memory subsystem and a control subsystem wherein the camera is designed wherein the image sensor can provide the memory of at least a first image and a second image for the same scene in front of the camera, wherein the first image is for a first focal plane in front of the camera, and the second image is for a second focal plane in front of the camera, wherein the distance to the first focal plane is substantially different than the distance to the second focal plane.

In another aspect, a camera system including, a first image sensor array and a second image sensor array wherein the first image sensor array includes a first mono-crystallized silicon layer, and the second image sensor array includes a second mono-crystallized silicon layer, wherein between the first mono-crystallized silicon layer and second mono-crystallized silicon layer there is a thin isolation layer, wherein through the thin isolation layer there are a multiplicity conducting vias wherein the conducting vias radius is less than 400 nm.

In another aspect, a camera system including, a first image sensor array and a second image sensor array wherein the first image sensor array includes a first mono-crystallized silicon layer, and the second image sensor array includes a second mono-crystallized silicon layer, wherein between the first mono-crystallized silicon layer and second mono-crystallized silicon layer there is a thin isolation layer, wherein the second mono-crystallized silicon layer thickness is less than 400 nm.

In another aspect, a method for processing a semiconductor wafer, the method including: providing a semiconductor wafer including an image sensor pixels layer including a plurality of image sensor pixels, the layer overlaying a wafer substrate; and then bonding the semiconductor wafer to a carrier wafer; and then cutting off a substantial portion of the wafer substrate, and then processing the substantial portion of the wafer substrate for reuse.

In another aspect, an image sensor wafer, including: a mono-crystallized silicon layer including a plurality of image sensor pixels, the mono-crystallized silicon layer bonded to a carrier wafer; where the bonded leaves a re-useable base wafer used to hold the mono-crystallized silicon layer.

In another aspect, an image sensor wafer, including: a mono-crystallized silicon layer including a plurality of image sensor pixels, the mono-crystallized silicon layer bonded to a carrier wafer; where the bonded leaves a re-useable base wafer used to hold the mono-crystallized silicon layer, an oxide overlaying the mono-crystallized silicon layer; and a second mono-crystal layer overlaying the oxide, where the second mono-crystal layer includes a plurality of single crystal transistors aligned to the image sensor pixels.

BRIEF DESCRIPTION OF THE DRAWINGS

Various embodiments of the invention will be understood and appreciated more fully from the following detailed description, taken in conjunction with the drawings in which:

FIGS. 6A-6B illustrate an embodiment of this invention, where red, green and blue photodetectors are stacked monolithically atop read-out circuits using ion-cut technology for a different configuration (for an image sensor);

FIG. 9 illustrates an embodiment of this invention, where read-out circuits are constructed monolithically above photodetectors in an image sensor;

FIGS. 10A-10H illustrate an embodiment of this invention, where a LED-driven chip-to-chip optical interconnect is constructed by monolithically stacking using layer transfer techniques;

FIGS. 11A-11D illustrate an embodiment of this invention, where a laser-driven chip-to-chip optical interconnect is constructed by monolithically stacking using layer transfer techniques;

FIG. 13 illustrates a typical hollow-metal waveguide (HMWG) structure which enables on-chip communication via waveguides stacked on top of the active layer of the chip (prior art);

FIGS. 14A-14C illustrate an embodiment of this invention, where a laser-driven on-chip optical interconnect is constructed by monolithically stacking using layer transfer techniques;

FIGS. 15A-15B illustrate a comparison between a typical confocal microscopy technique (prior art) and another confocal microscopy technique with an electronic screen constructed with stacks of modulators;

FIGS. 15C-15G illustrate an embodiment of this invention where arrays of modulators are monolithically stacked using layer transfer processes;

FIGS. 16C-16F illustrate an embodiment of this invention where a CCD sensor is monolithically stacked onto its control circuits using layer transfer, allowing for parallel readout of sensor data;

FIGS. 17A-17D illustrate an embodiment of this invention where an image sensor with three layers is monolithically stacked, the first layer with photo-detectors of smaller light-sensitive region, the second layer with photo-detectors of larger light-sensitive region, and the third layer with readout circuits to collect sensor data;

FIGS. 18A-18D illustrate embodiments of this invention, where multiple screens which may be actuated by motors are used to render displays in 3D;

FIGS. 19A-19C illustrate an embodiment of this invention, where two image sensor arrays are monolithically stacked on top of each other with an insulating layer between them using layer transfer processes;

FIGS. 24A-24B illustrates an embodiment of this invention, where a surveillance system tracks dynamic objects which are reconstructed by a camera system that includes a lens and two image sensor arrays parallel to each other and to the lens, wherein each sensor array is of distinct distance from the lens. An algorithm is described to time-step through multiple images and subtract images of static objects;

DETAILED DESCRIPTION

Embodiments of the present invention are now described with reference to FIGS. 1-25, it being appreciated that the figures illustrate the subject matter not to scale or to measure.

Figure 1A:
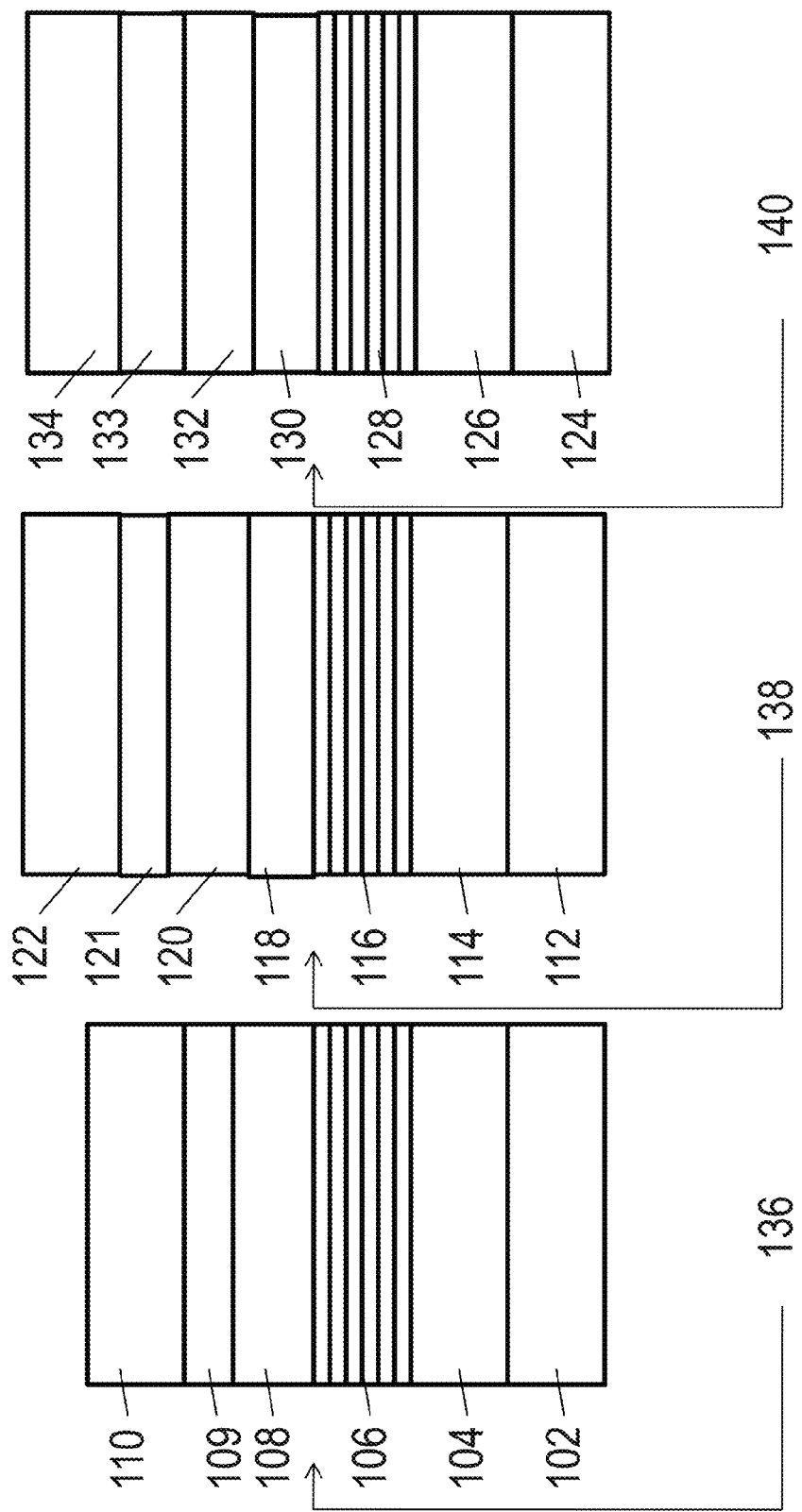
FIGS. 1A-1S illustrate an embodiment of this invention, where RGB LEDs are stacked with ion-cut technology, flip-chip packaging and conductive oxide bonding.
Figure 1K:
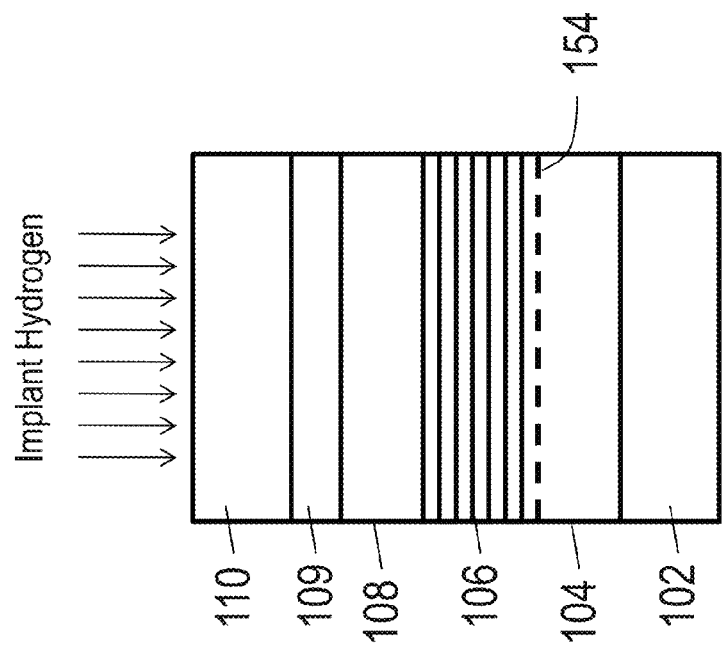
Figure 1J:
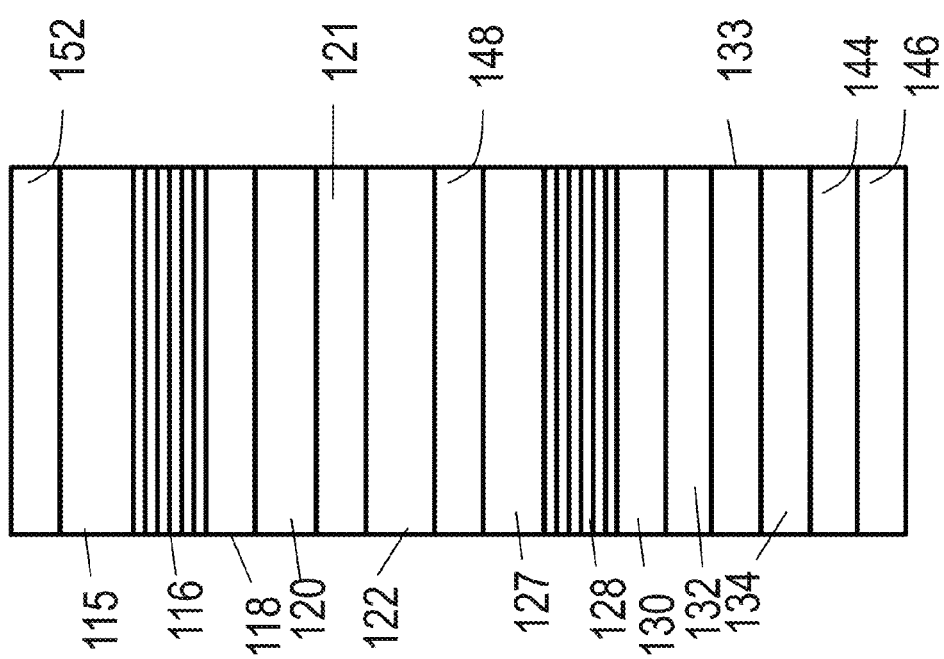
Figure 1P:
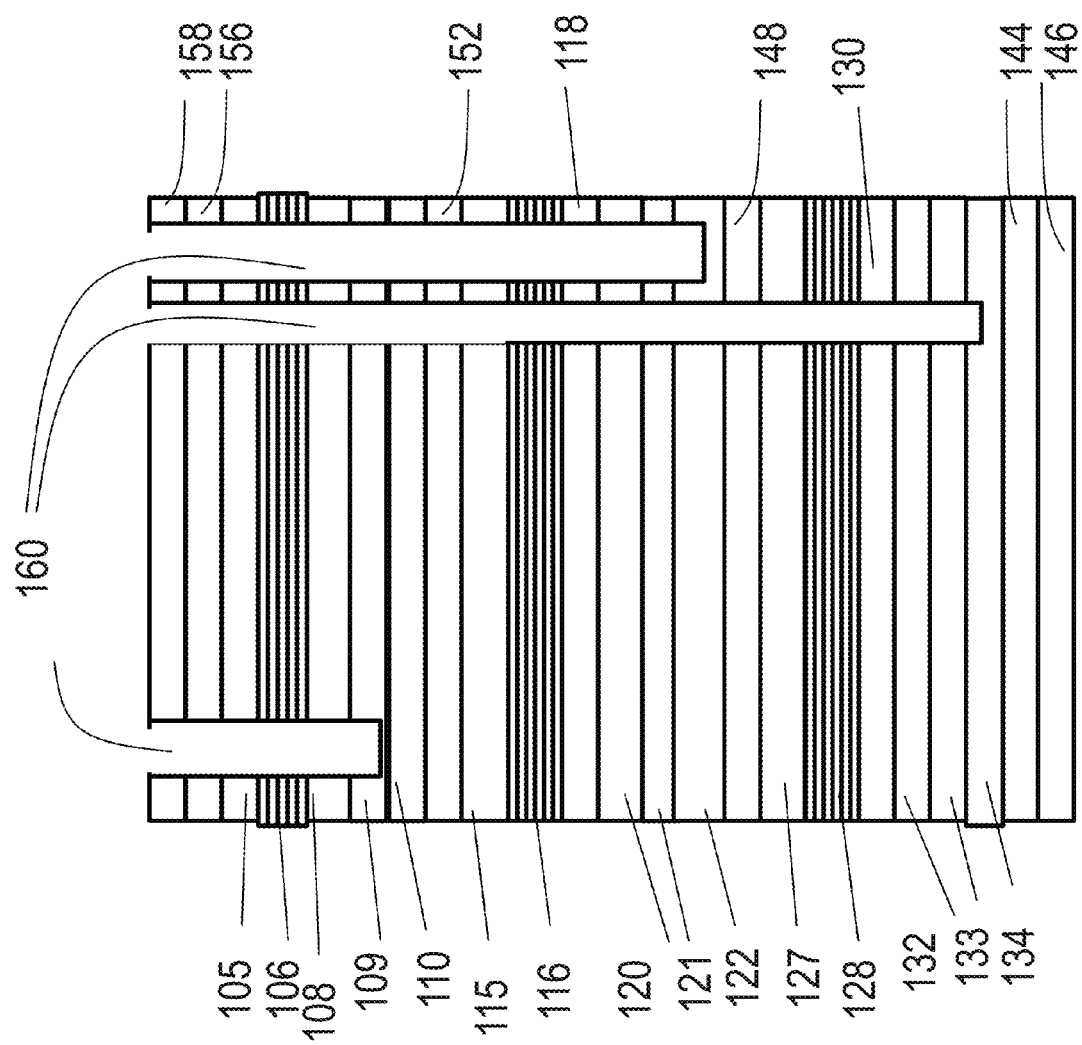
Figure 1Q:
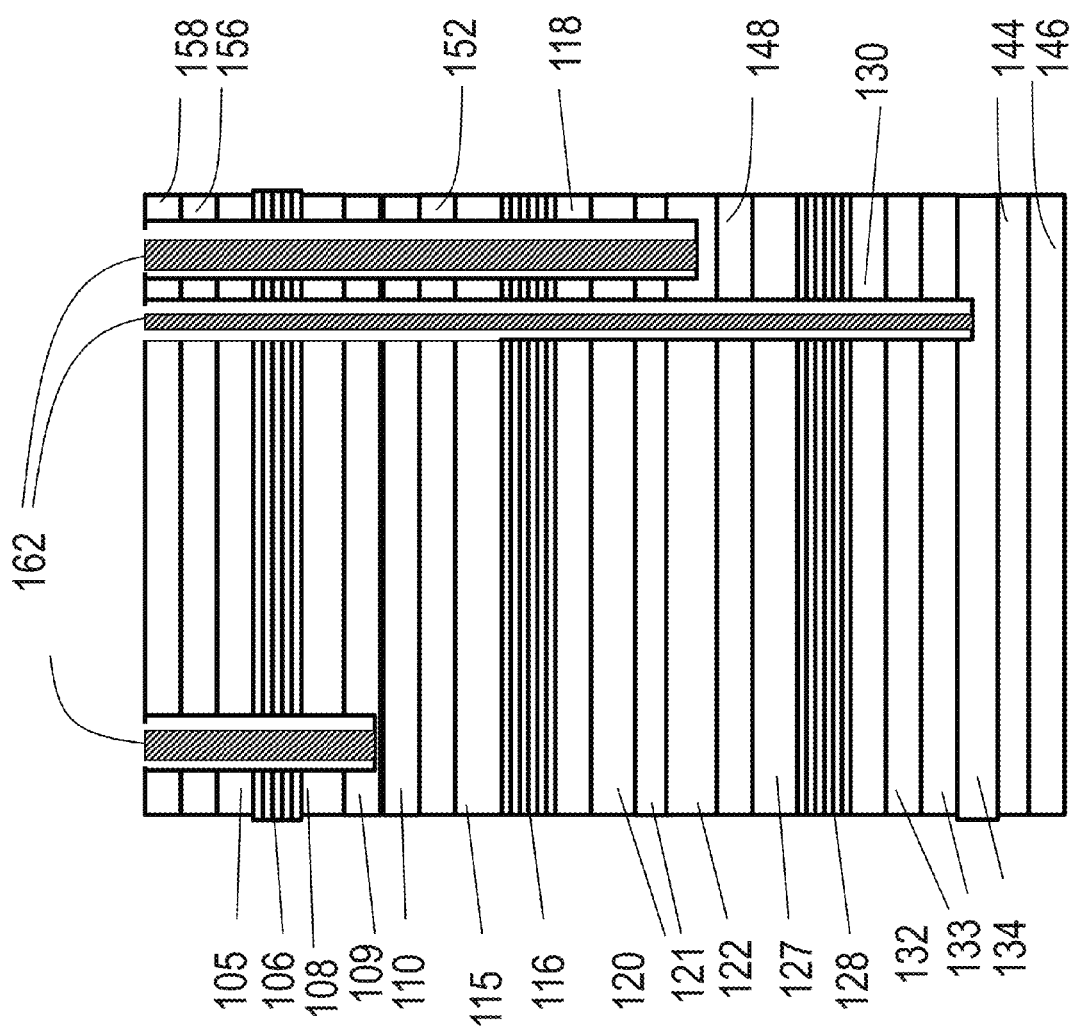
Figure 1R:
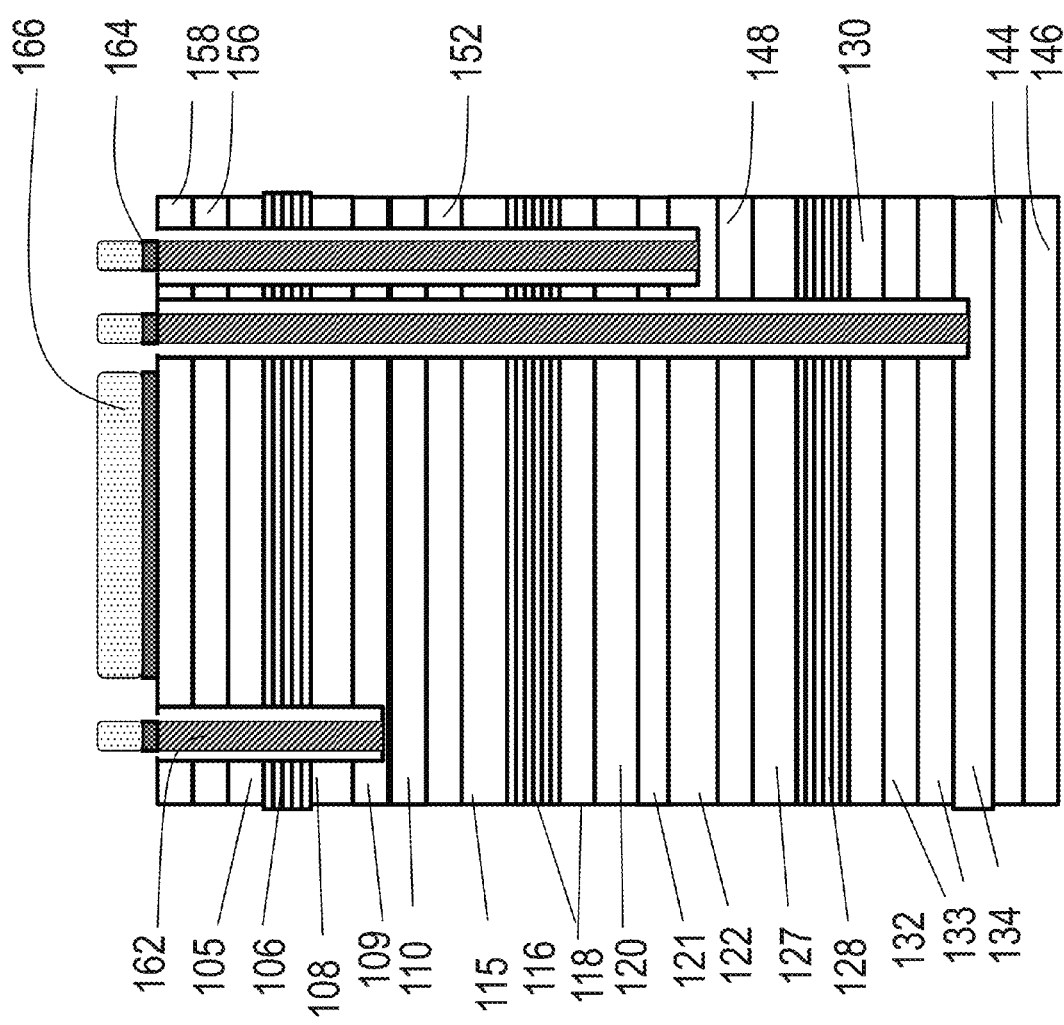
Figure 1S:
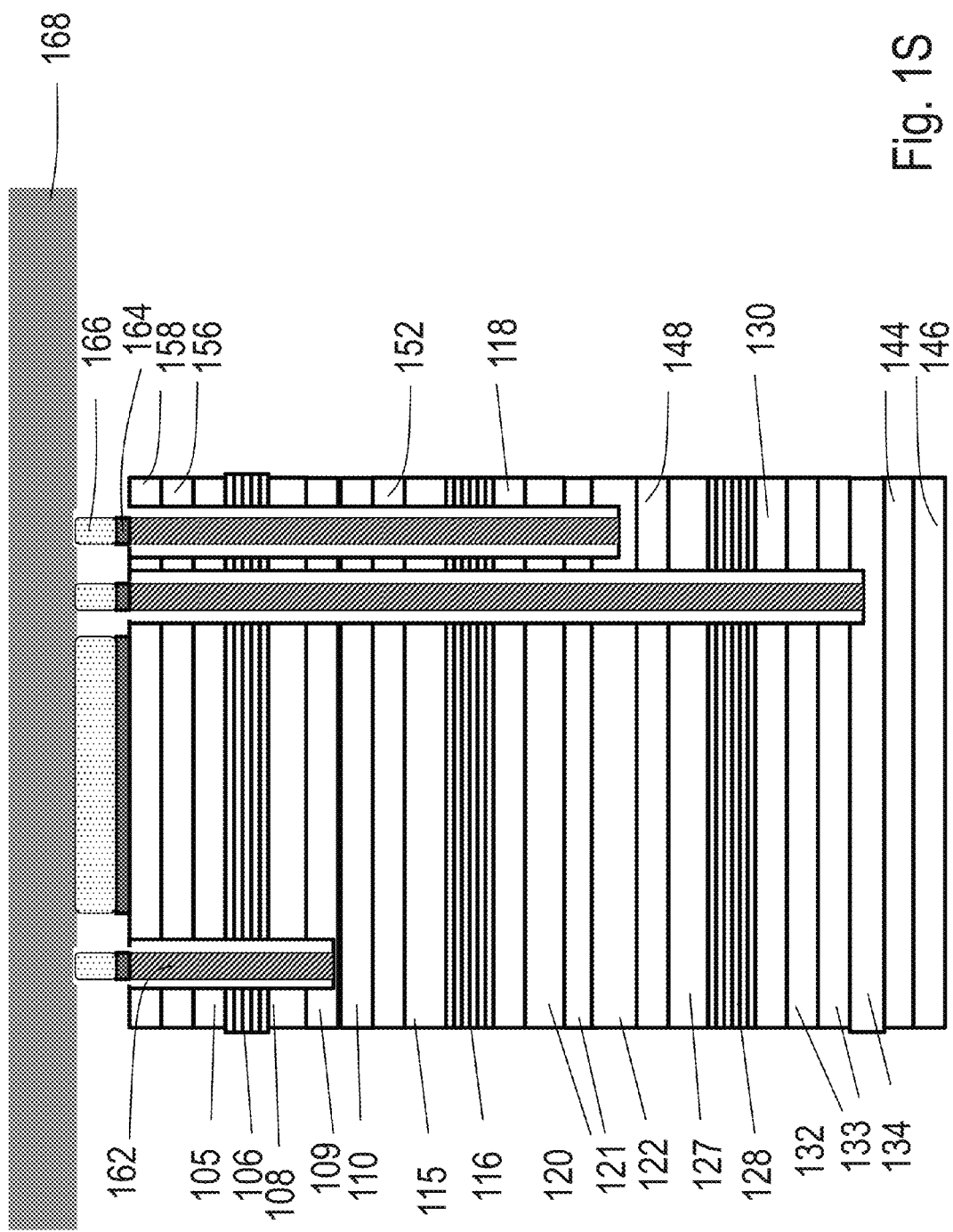

NuLED Technology:

FIG. 1A-S illustrate an embodiment of this invention where Red, Blue, and Green LEDs are stacked on top of each other with smart layer transfer techniques. A smart layer transfer may be defined as one or more of the following processes:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology," JSAP International, Number 4, July 2001 by T. Yonehara and K. Sakaguchi ("Yonehara").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech Digest, p. 363 (2005) by A. W. Topol, D. C. La Tulipe, L. Shi, S. M. Alam, D J Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S Wong ("Cheung").

Rubber stamp layer transfer: This is described in "Solar cells sliced and diced," 19, May 2010, Nature News.

This process of constructing RGB LEDs could include several steps that occur in a sequence from Step (A) to Step (S). Many of them share common characteristics, features, modes of operation, etc. When the same reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 1A. A red LED wafer 136 is constructed on a GaAs substrate 102 and includes a N-type confinement layer 104, a multiple quantum well (MQW) 106, a P-type confinement layer 108, an optional reflector 109 and an ITO current spreader 110. Examples of materials used to construct these layers, include, but are not limited to, doped AlInGaP for the N-type confinement layer 104 and P-type confinement layer 108, the multiple quantum well layer 106 could be of AlInGaP and GaInP and the optional reflector 409 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 138 is constructed on a sapphire or SiC or bulk-GaN substrate 112 and includes a N-type confinement layer 114, a multiple quantum well (MQW) 116, a buffer layer 118, a P-type confinement layer 120, an optional reflector 121 and an ITO current spreader 122. Yet another wafer is constructed with a blue LED. The blue LED wafer 140 is constructed on a sapphire or SiC or bulk-GaN substrate 124 and includes a N-type confinement layer 126, a multiple quantum well (MQW) 128, a buffer layer 130, a P-type confinement layer 132, an optional reflector 133 and an ITO current spreader 134. Examples of materials used to construct these blue and green LED layers, include, but are not limited to, doped GaN for the N-type and P-type confinement layers 114, 120, 126 and 132, AlGaN for the buffer layers 130 and 118 and InGaN/GaN for the multiple quantum wells 116 and 128. The optional reflectors 121 and 133 could be distributed Bragg Reflectors or some other type of reflectors. Various other material types and configurations could be used for constructing blue and green LEDs for this process.

Step (B) is illustrated in FIG. 1B. The blue LED wafer 140 from FIG. 1A is used for this step. Various elements in FIG. 1B such as, for example, 124, 126, 128, 130, 132, 133, and 134 have been previously described. Hydrogen is implanted into the wafer at a certain depth indicated by dotted lines 142. Alternatively, helium could be used for this step.

Step (C) is illustrated in FIG. 1C. A glass substrate 146 is taken and an ITO layer 144 is deposited atop it.

Step (D) is illustrated in FIG. 1D. The wafer shown in FIG. 1B is flipped and bonded atop the wafer shown in FIG. 1C using ITO-ITO bonding. Various elements in FIG. 1D such as 124, 126, 128, 130, 132, 133, 134, 142, 146, and 144 have been previously described. The ITO layer 144 is essentially bonded to the ITO layer 134 using an oxide-to-oxide bonding process.

Step (E) is illustrated in FIG. 1E. Various elements in FIG. 1E such as 124, 126, 128, 130, 132, 133, 134, 142, 146, and 144 have been previously described. An ion-cut process is conducted to cleave the structure shown in FIG. 1D at the hydrogen implant plane 142. This ion-cut process may use a mechanical cleave. An anneal process could be utilized for the cleave as well. After the cleave, a chemical mechanical polish (CMP) process is conducted to planarize the surface. The N-type confinement layer present after this cleave and CMP process is indicated as 127.

Step (F) is illustrated in FIG. 1F. Various elements in FIG. 1F such as 146, 144, 134, 133, 132, 130, 128, and 127 have been previously described. An ITO layer 148 is deposited atop the N-type confinement layer 127.

Step (G) is illustrated in FIG. 1G. The green LED wafer 138 shown in Step (A) is used for this step. Various elements in FIG. 1G such as 112, 114, 116, 118, 120, 121, and 122 have been described previously. Hydrogen is implanted into the wafer at a certain depth indicated by dotted lines 150. Alternatively, helium could be used for this step.

Step (H) is illustrated in FIG. 1H. The structure shown in FIG. 1G is flipped and bonded atop the structure shown in FIG. 1F using ITO-ITO bonding. Various elements in FIG. 1H such as 146, 144, 134, 133, 132, 130, 128, 127, 148, 112, 114, 116, 118, 120, 121, 122, and 150 have been described previously.

Step (I) is illustrated in FIG. 1I. The structure shown in FIG. 1H is cleaved at the hydrogen plane indicated by 150. This cleave process may be preferably done with a mechanical force. Alternatively, an anneal could be used. A CMP process is conducted to planarize the surface. Various elements in FIG. 1I such as 146, 144, 134, 133, 132, 130, 128, 127, 148, 116, 118, 120, 121, and 122 have been described previously. The N-type confinement layer present after this cleave and CMP process is indicated as 115.

Step (J) is illustrated in FIG. 1J. An ITO layer 152 is deposited atop the structure shown in FIG. 1I. Various elements in FIG. 1J such as 146, 144, 134, 133, 132, 130, 128, 127, 148, 116, 118, 120, 121, 115, and 122 have been described previously.

Step (K) is illustrated in FIG. 1K. The red LED wafer 136 shown in Step (A) is used for this step. Various elements in FIG. 1K such as 102, 104, 106, 108, 109, and 110 have been described previously. Hydrogen is implanted into the wafer at a certain depth indicated by dotted lines 154. Alternatively, helium could be used for this step.

Step (L) is illustrated in FIG. 1L. The structure shown in FIG. 1K is flipped and bonded atop the structure shown in FIG. 1J using ITO-ITO bonding. Various elements in FIG. 1L such as 146, 144, 134, 133, 132, 130, 128, 127, 148, 116, 118, 120, 121, 115, 122, 152, 102, 104, 106, 108, 109, 110, and 154 have been described previously.

Step (M) is illustrated in FIG. 1M. The structure shown in FIG. 1L is cleaved at the hydrogen plane 154. A mechanical force could be used for this cleave. Alternatively, an anneal could be used. A CMP process is then conducted to planarize the surface. The N-type confinement layer present after this process is indicated as 105. Various elements in FIG. 1M such as 146, 144, 134, 133, 132, 130, 128, 127, 148, 116, 118, 120, 121, 115, 122, 152, 106, 108, 109, and 110 have been described previously.

Step (N) is illustrated in FIG. 1N. An ITO layer 156 is deposited atop the structure shown in FIG. 1M. Various elements in FIG. 1M such as 146, 144, 134, 133, 132, 130, 128, 127, 148, 116, 118, 120, 121, 115, 122, 152, 106, 108, 109, 110, and 105 have been described previously.

Step (O) is illustrated in FIG. 1O. A reflecting material layer 158, constructed for example with Aluminum or Silver, is deposited atop the structure shown in FIG. 1N. Various elements in FIG. 1O such as 146, 144, 134, 133, 132, 130, 128, 127, 148, 116, 118, 120, 121, 115, 122, 152, 106, 108, 109, 110, 156, and 105 have been described previously.

Step (P) is illustrated in FIG. 1P. The process of making contacts to various layers and packaging begins with this step. A contact and bonding process similar to the one used in "High-power AlGaInN flip-chip light-emitting diodes," *Applied Physics Letters*, vol. 78, no. 22, pp. 3379-3381, May 2001, by Wierer, J. J.; Steigerwald, D. A.; Krames, M. R.; OShea, J. J.; Ludowise, M. J.; Christenson, G.; Shen, Y.-C.; Lowery, C.; Martin, P. S.; Subramanya, S.; Gotz, W.; Gardner, N. F.; Kern, R. S.; Stockman, S. A. is used. Vias 160 are etched to different layers of the LED stack. Various elements in FIG. 1P such as 146, 144, 134, 133, 132, 130, 128, 127, 148, 116, 118, 120, 121, 115, 122, 152, 106, 108, 109, 110, 156, 105, and 158 have been described previously. After the via holes 160 are etched, they may optionally be filled with an oxide layer and polished with CMP. This fill with oxide may be optional, and the preferred process may be to leave the via holes as such without fill. Note that the term contact holes could be used instead of the term via holes. Similarly, the term contacts could be used instead of the term vias.

Step (Q) is illustrated in FIG. 1Q. Aluminum is deposited to fill via holes 160 from FIG. 1P. Following this deposition, a lithography and etch process is utilized to define the aluminum metal to form vias 162. The vias 162 are smaller in diameter than the via holes 160 shown in FIG. 1P. Various elements in FIG. 1Q such as 146, 144, 134, 133, 132, 130, 128, 127, 148, 116, 118, 120, 121, 115, 122, 152, 106, 108, 109, 110, 156, 105, 160, and 158 have been described previously.

Step (R) is illustrated in FIG. 1R. A nickel layer 164 and a solder layer 166 are formed using standard procedures. Various elements in FIG. 1R such as 146, 144, 134, 133, 132, 130, 128, 127, 148, 116, 118, 120, 121, 115, 122, 152, 106, 108, 109, 110, 156, 105, 160, 162, and 158 have been described previously.

Step (S) is illustrated in FIG. 1S. The solder layer 166 is then bonded to pads on a silicon sub-mount 168. Various elements in FIG. 1S such as 146, 144, 134, 133, 132, 130, 128, 127, 148, 116, 118, 120, 121, 115, 122, 152, 106, 108, 109, 110, 156, 105, 160, 162, 158, 164, and 166 have been described previously. The configuration of optional reflectors 133, 121, and 109 determines light output coming from the LED. A preferred embodiment of this invention may not have a reflector 133, and may have the reflector 121 (reflecting only the blue light produced by multiple quantum well 128) and the reflector 109 (reflecting only the green light produced by multiple quantum well 116).

In the process described in FIG. 1A-FIG. 1S, the original substrates in FIG. 1A, namely 102, 112 and 124, can be reused after ion-cut. This reuse may make the process more cost-effective.

NuImager Technology:

Layer transfer technology can also be advantageously utilized for constructing image sensors. Image sensors typically include photodetectors on each pixel to convert light energy to electrical signals. These electrical signals are sensed, amplified and stored as digital signals using transistor circuits.

Figure 2:
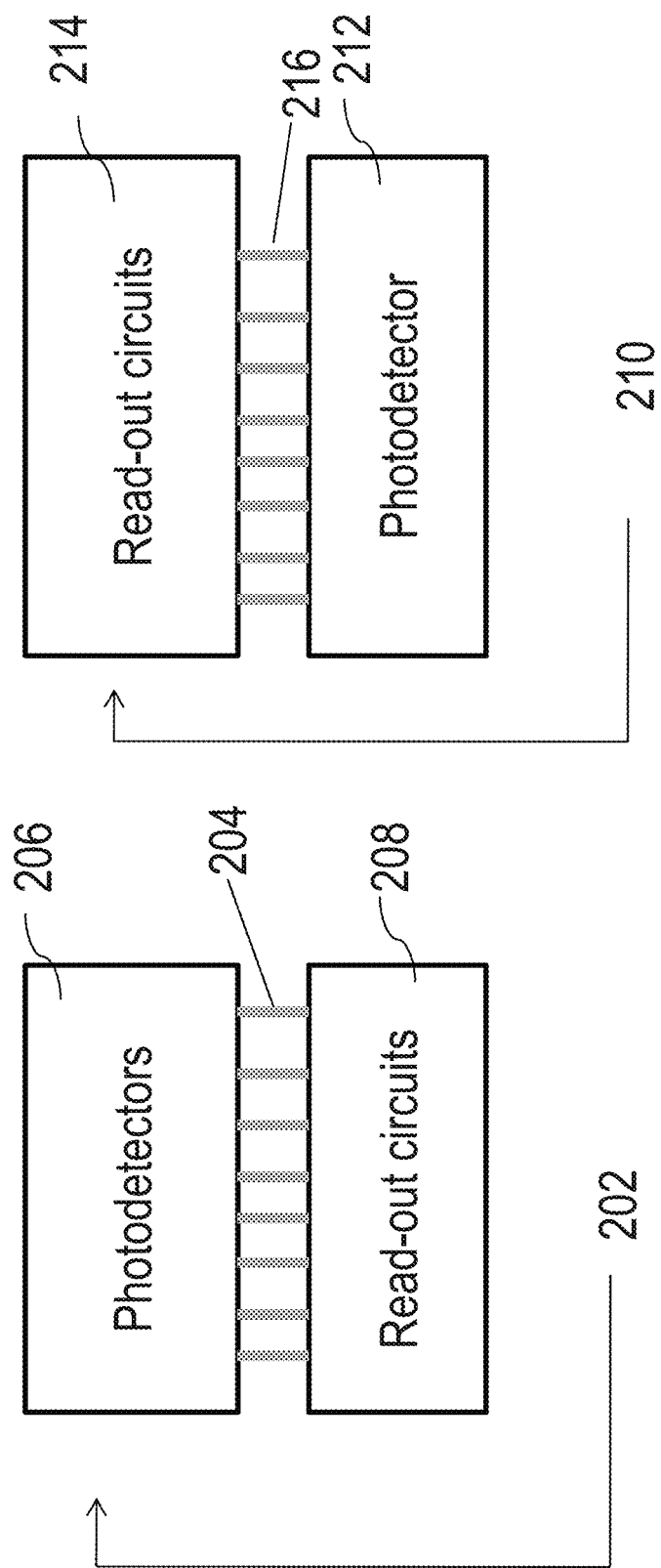
FIG. 2 describes two configurations for stacking photo-detectors and read-out circuits.

FIGS. 2-9 describe some embodiments of this invention, where photodetector and read-out circuits are stacked monolithically with layer transfer. FIG. 2 shows two configurations for stacking photodetectors and read-out circuits. In one configuration, denoted as 202, a photodetector layer 206 is formed above read-out circuit layer 208 with connections 204 between these two layers. In another configuration, denoted as 210, photodetectors 212 may have read-out circuits 214 formed above them, with connecting 216 between these two layers.

FIGS. 3A-H describe an embodiment of this invention, where an image sensor includes a photodetector layer formed atop a read-out circuit layer using layer transfer. In this document, the photodetector layer is denoted as a p-n junction layer. However, any type of photodetector layer, such as a pin layer or some other type of photodetector can be used. The thickness of the photodetector layer is typically less than 5 μm. The process of forming the image sensor could include several steps that occur in a sequence from Step (A) to Step (H). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 3A:
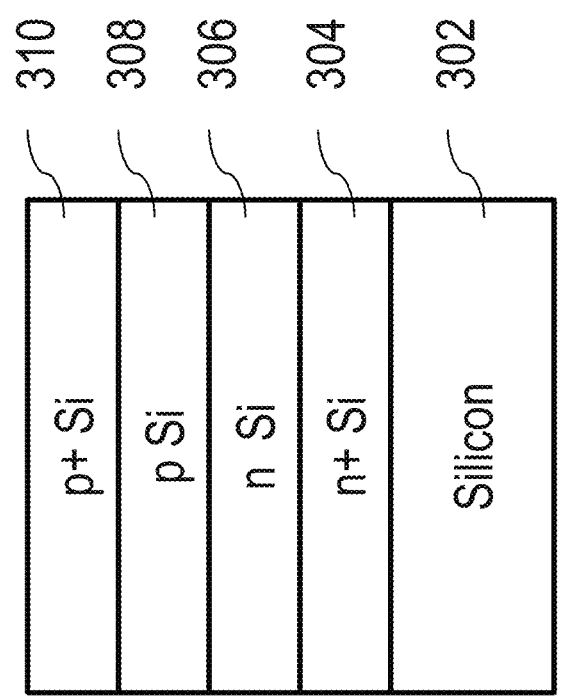
FIGS. 3A-3H illustrate an embodiment of this invention, where a CMOS image sensor is formed by stacking a photodetector monolithically on top of read-out circuits using ion-cut technology.

Step (A) is illustrated in FIG. 3A. A silicon wafer 302 is taken and a n+ Silicon layer 304 is ion implanted. Following this, n layer 306, p layer 308 and p+ layer 310 are formed epitaxially. It will be appreciated by one skilled in the art based on the present disclosure that there are various other procedures to form the structure shown in FIG. 3A. An anneal is then performed to activate dopants in various layers.

Figure 3B:
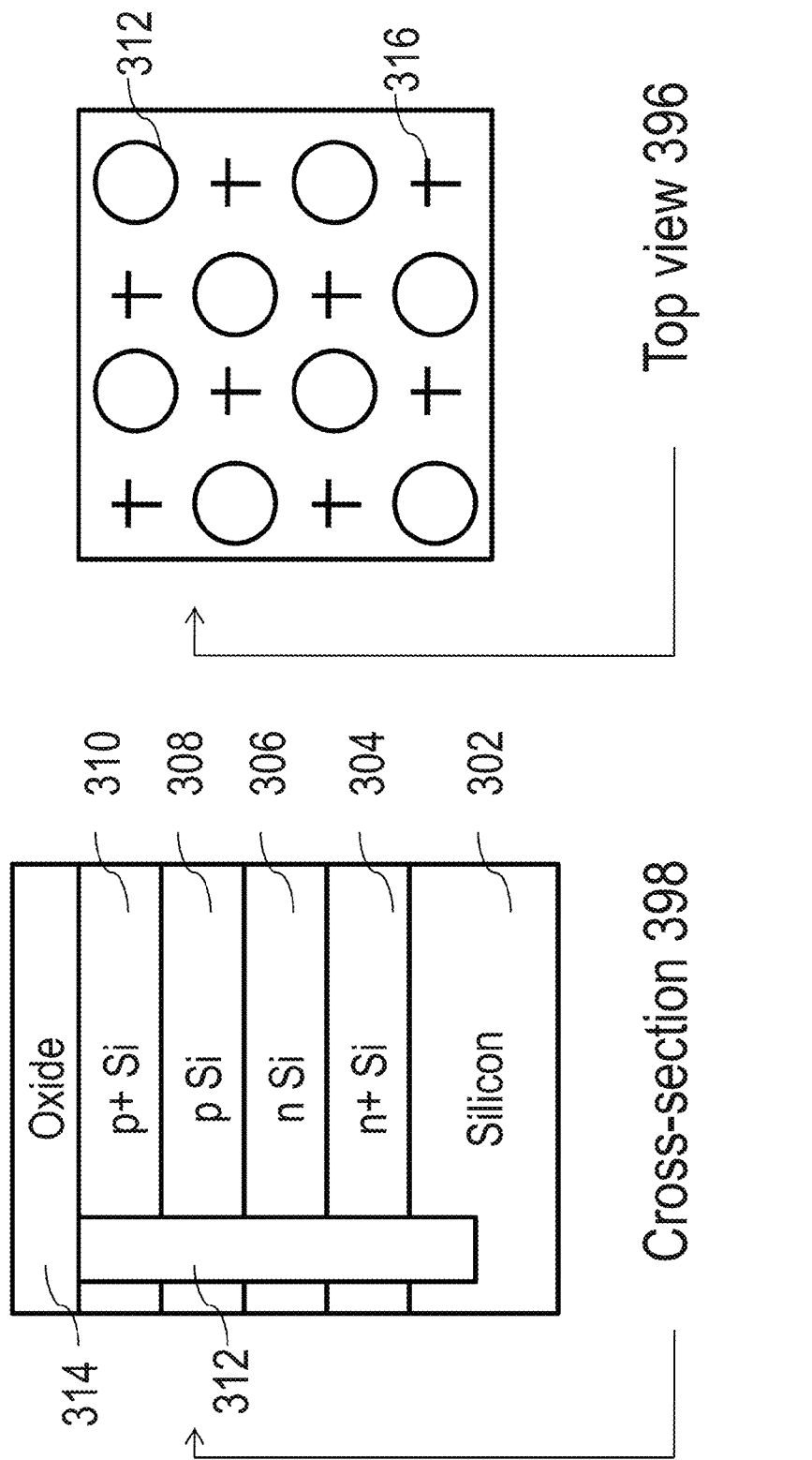

Step (B) is illustrated in FIG. 3B. Various elements in FIG. 3B such as 302, 304, 306, 308 and 310 have been described previously. Using lithography and etch, a via is etched into the structure shown in FIG. 3A, filled with oxide and polished with CMP. The regions formed after this process are the oxide filled via 312 and the oxide layer 314. The oxide filled via 312 may also be referred to as an oxide via or an oxide window region or oxide aperture. A cross-section of the structure is indicated by 398 and a top view is indicated by 396. 316 indicates alignment marks and the oxide filled via 312 is formed in place of some of the alignment marks printed on the wafer.

Figure 3C:
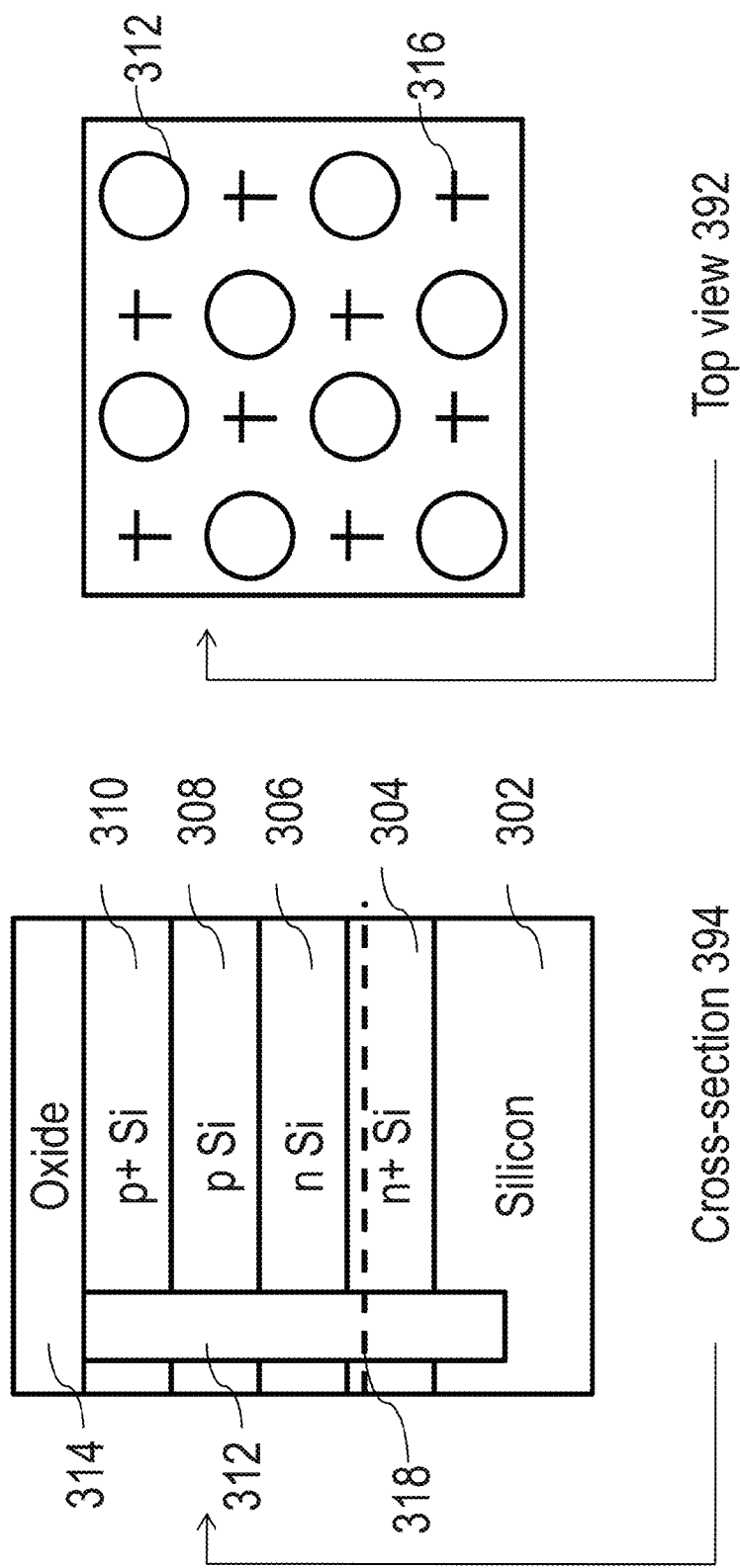

Step (C) is illustrated in FIG. 3C. Various elements in FIG. 3C such as 302, 304, 306, 308, 310, 312, 314, and 316 have been described previously. Hydrogen is implanted into the structure indicated in FIG. 3B at a certain depth indicated by dotted lines 318 of FIG. 3C. Alternatively, Helium can be used as the implanted species. A cross-sectional view 394 and a top view 392 are shown.

Figure 3D:
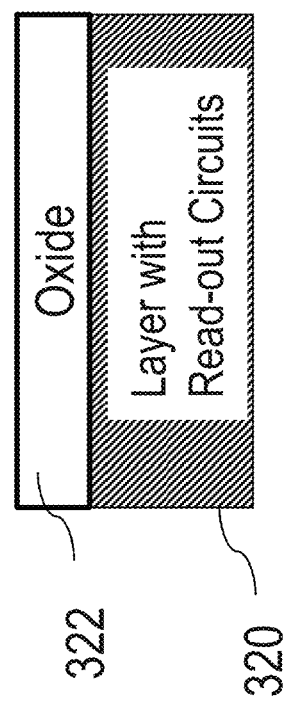

Step (D) is illustrated in FIG. 3D. A silicon wafer 320 with read-out circuits (which includes wiring) processed on it is taken, and an oxide layer 322 is deposited above it.

Figure 3E:
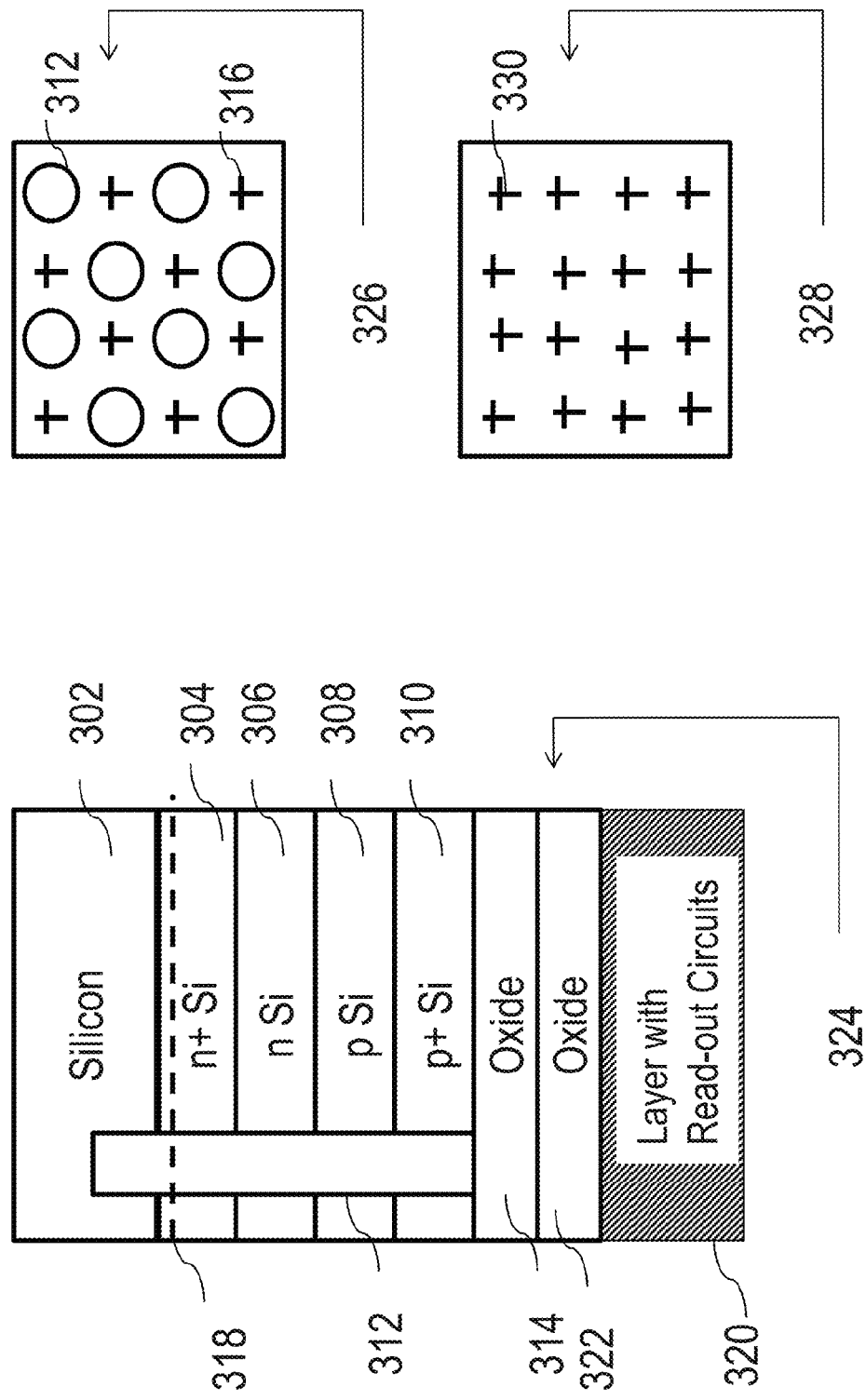

Step (E) is illustrated in FIG. 3E. The structure shown in FIG. 3C is flipped and bonded to the structure shown in FIG. 3D using oxide-to-oxide bonding of oxide layers 314 and 322. During this bonding procedure, alignment is done such that oxide vias 312 (shown in the top view 326 of the photodetector wafer) are above alignment marks (such as 330) on the top view 328 of the read-out circuit wafer. A cross-sectional view of the structure is shown with 324. Various elements in FIG. 3E such as 302, 304, 306, 308, 310, 312, 314, 316, 318, 320, and 322 have been described previously.

Figure 3F:
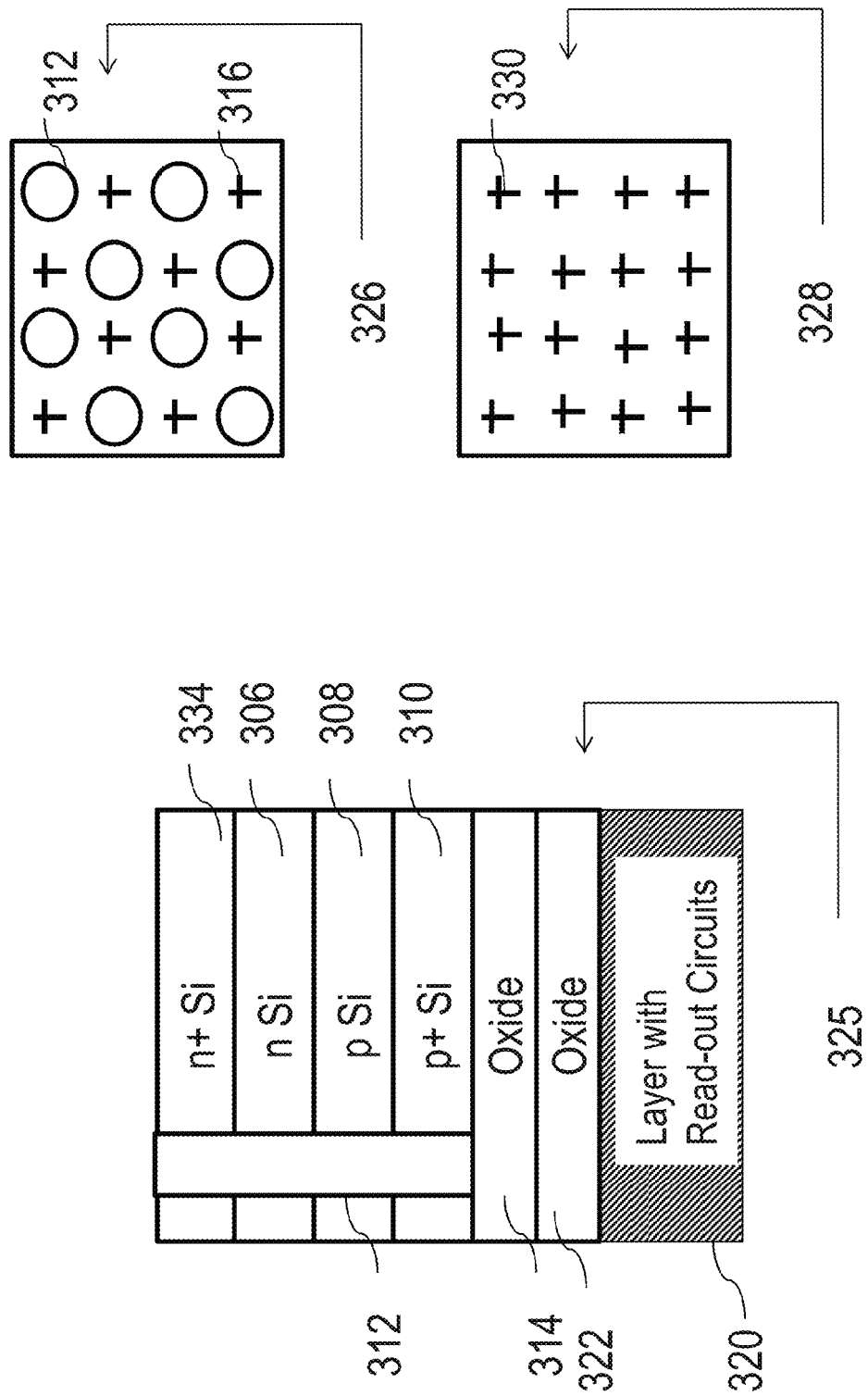

Step (F) is illustrated in FIG. 3F. The structure shown in FIG. 3E may be cleaved at its hydrogen plane 318 preferably using a mechanical process. Alternatively, an anneal could be used for this purpose. A CMP process may be then done to planarize the surface resulting in a final n+ silicon layer indicated as 334. 325 depicts a cross-sectional view of the structure after the cleave and CMP process. Various elements in FIG. 3F such as 306, 308, 310, 312, 314, 316, 318, 320, 326, 324, 330, 328, 334 and 322 have been described previously.

Figure 3G:
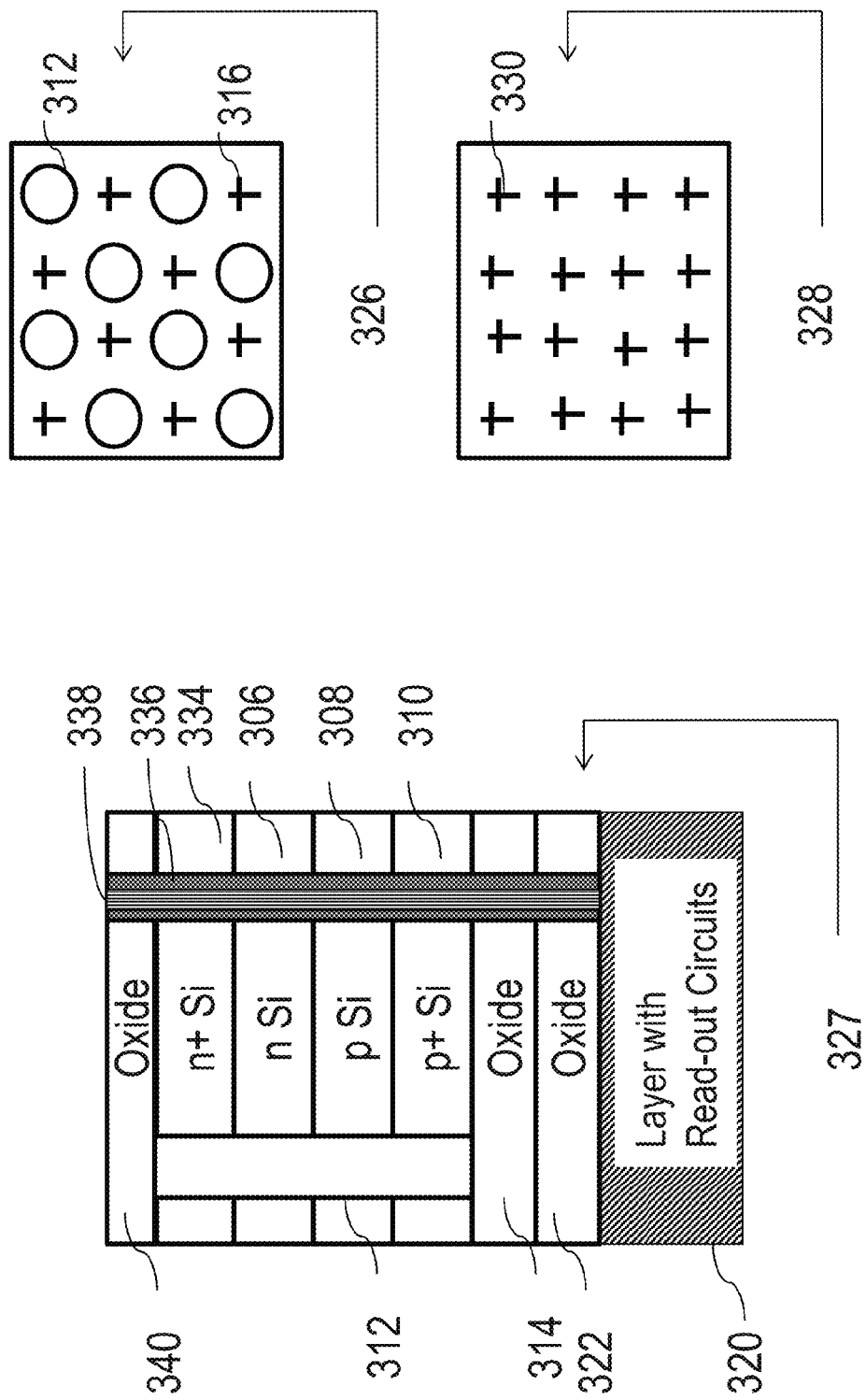

Step (G) is illustrated using FIG. 3G. Various elements in FIG. 3G such as 306, 308, 310, 312, 314, 316, 318, 320, 326, 324, 330, 328, 334 and 322 have been described previously. An oxide layer 340 is deposited. Connections between the photodetector and read-out circuit wafers are formed with metal 338 and an insulator covering 336. These connections are formed well aligned to the read-out circuit layer 320 by aligning to alignment marks 330 on the read-out circuit layer 320 through oxide vias 312. 327 depicts a cross-sectional view of the structure.

Figure 3H:
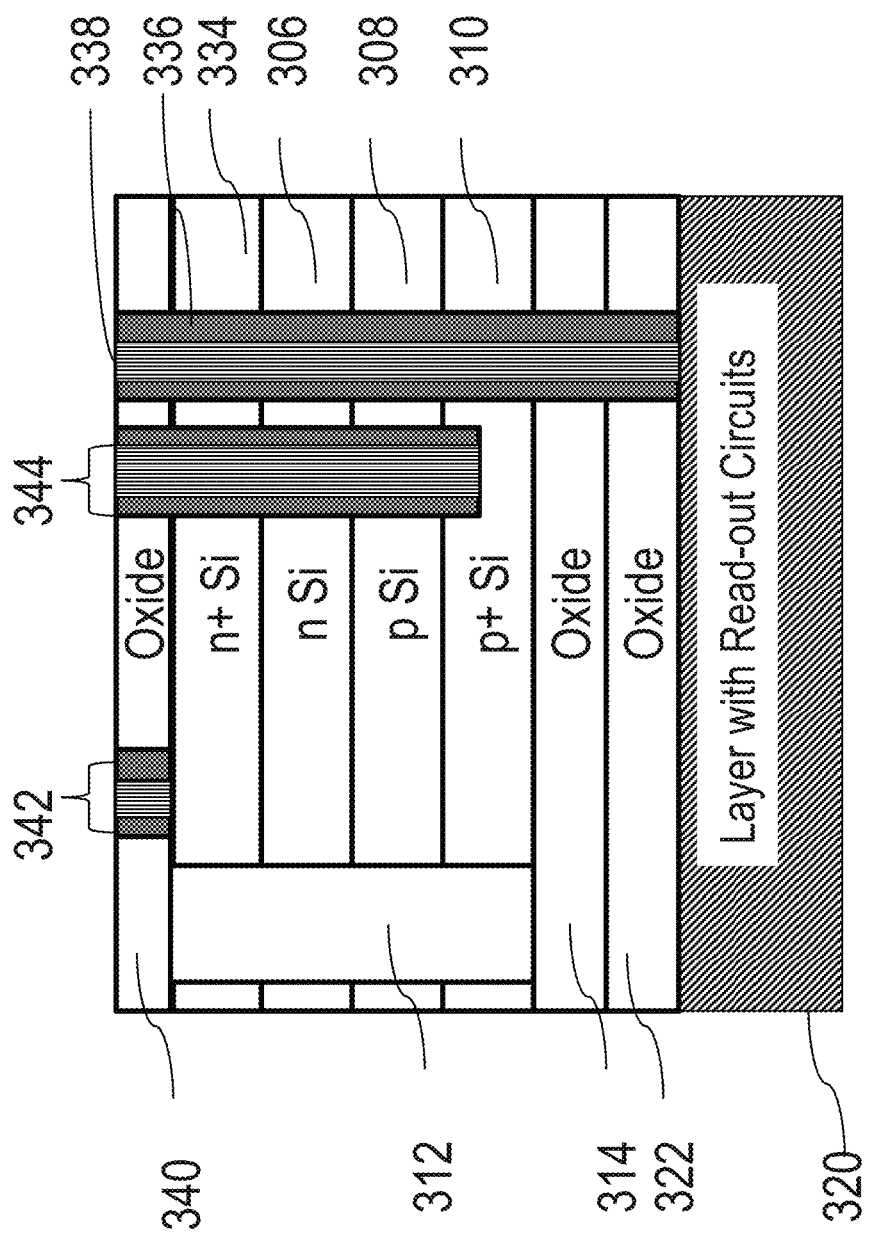
Figure 4:
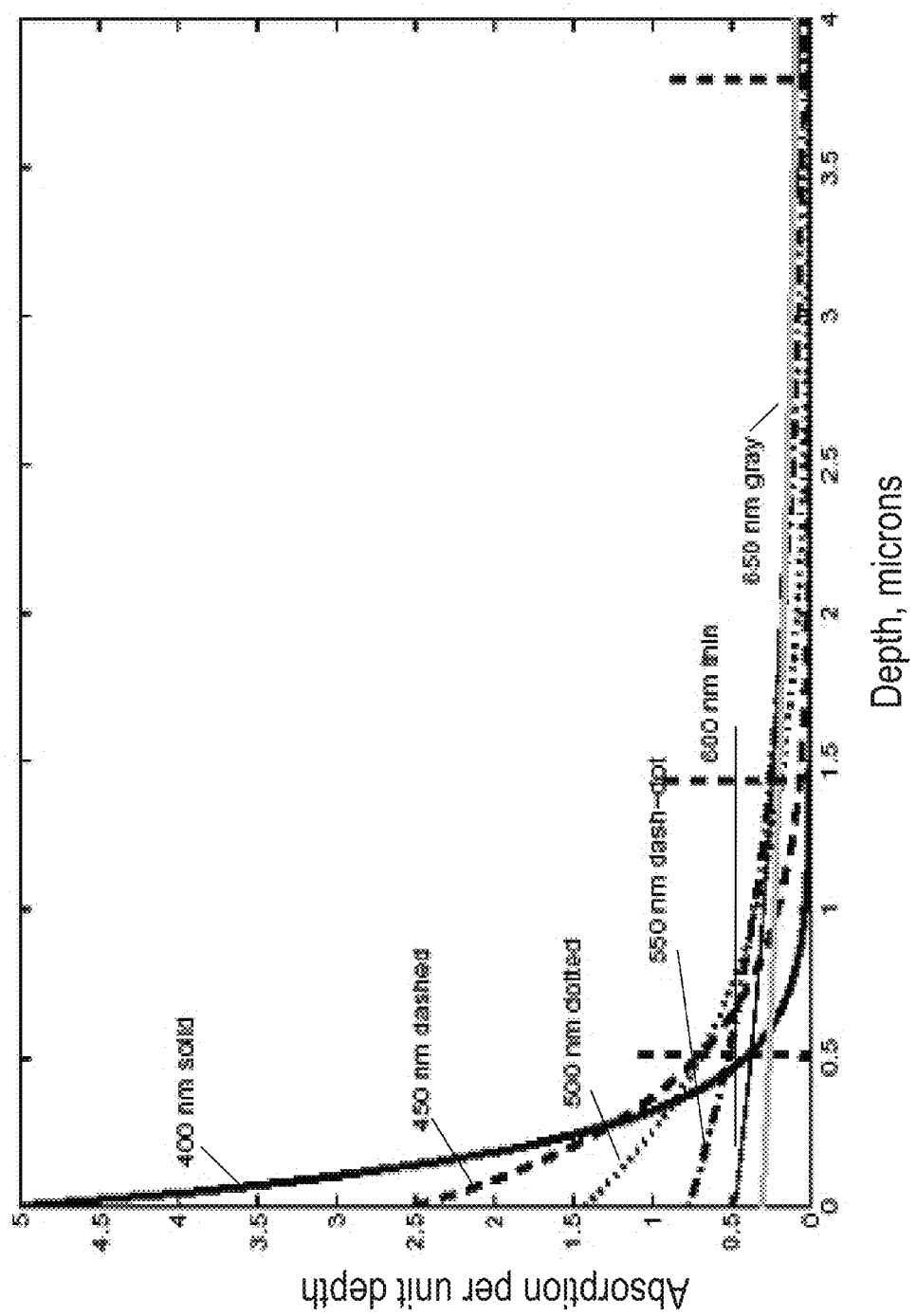
FIG. 4 illustrates the absorption process of different wavelengths of light at different depths in silicon image sensors.

Step (H) is illustrated in FIG. 3H. Connections are made to the terminals of the photodetector and are indicated as 342 and 344. Various elements of FIG. 3H such as 320, 322, 312, 314, 310, 308, 306, 334, 336, 338, 340, 342, and 344 have been described previously. Contacts and interconnects for connecting terminals of the photodetector to read-out circuits are then done, following which a packaging process is conducted.

FIGS. 3A-G show a process where oxide vias may be used to look through photodetector layers to observe alignment marks on the read-out circuit wafer below it. However, if the thickness of the silicon on the photodetector layer is <100-400 nm, the silicon wafer is thin enough that one can look through it without requiring oxide vias. A process similar to FIG. 3A-G where the silicon thickness for the photodetector is <100-400 nm represents another embodiment of this invention. In that embodiment, oxide vias may not be constructed and one could look right through the photodetector layer to observe alignment marks of the read-out circuit layer. This may include making well-aligned through-silicon connections between various layers.

As mentioned previously, FIGS. 3A-G illustrate a process where oxide vias constructed before layer transfer are used to look through photodetector layers to observe alignment marks on the read-out circuit wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme are formed. This order of sequences may enable observation of alignment marks on the bottom read-out circuit wafer by looking through the photodetector wafer.

There may be a few alternative methods to construct the top transistors precisely aligned to the underlying pre-fabricated layers such as pre-processed wafer or layer 808, of U.S. Pat. No. 8,273,610, utilizing "SmartCut" layer transfer and not exceeding the temperature limit, typically about 400° C., of the underlying pre-fabricated structure, which may include low melting temperature metals or other construction materials such as, for example, aluminum or copper. As the layer transfer may be less than about 200 nm thick, then the transistors defined on it could be aligned precisely to the top metal layer of the pre-processed wafer or layer 808 as may be needed and those transistors may have state of the art layer to layer misalignment capability, for example, less than about 40 nm misalignment or less than about 4 nm misalignment, as well as through layer via, or layer to layer metal connection, diameters of less than about 50 nm, or even less than about 20 nm. The thinner the transferred layer, the smaller the through layer via diameter obtainable, due to the potential limitations of manufacturable via aspect ratios. The transferred layer may be, for example, less than about 2 microns thick, less than about 1 micron thick, less than about 0.4 microns thick, less than about 200 nm thick, or less than about 100 nm thick.

While Silicon has been suggested as the material for the photodetector layer of FIG. 3A-G, Germanium could be used in an alternative embodiment. The advantage of Germanium is that it is sensitive to infra-red wavelengths as well. However, Germanium also suffers from high dark current.

While FIG. 3A-G described a single p-n junction as the photodetector, it will be obvious to one skilled in the art based on the present disclosure that multiple p-n junctions can be formed one on top of each other, as described in "Color Separation in an Active Pixel Cell Imaging Array Using a Triple-Well Structure," U.S. Pat. No. 5,965,875, 1999 by R. Merrill and in "Trends in CMOS Image Sensor Technology and Design," International Electron Devices Meeting Digest of Technical Papers, 2002 by A. El-Gamal. This concept relies on the fact that different wavelengths of light penetrate to different thicknesses of silicon, as described in FIG. 4. It can be observed in FIG. 4 that near the surface 400 nm wavelength light has much higher absorption per unit depth than 450 nm-650 nm wavelength light. On the other hand, at a depth of 0.5 μm, 500 nm light has a higher absorption per unit depth than 400 nm light. An advantage of this approach is that one does not require separate filters (and area) for green, red and blue light; all these different colors/wavelengths of light can be detected with different p-n junctions stacked atop each other. So, the net area required for detecting three different colors of light is reduced, leading to an improvement of resolution.

Figure 5A:
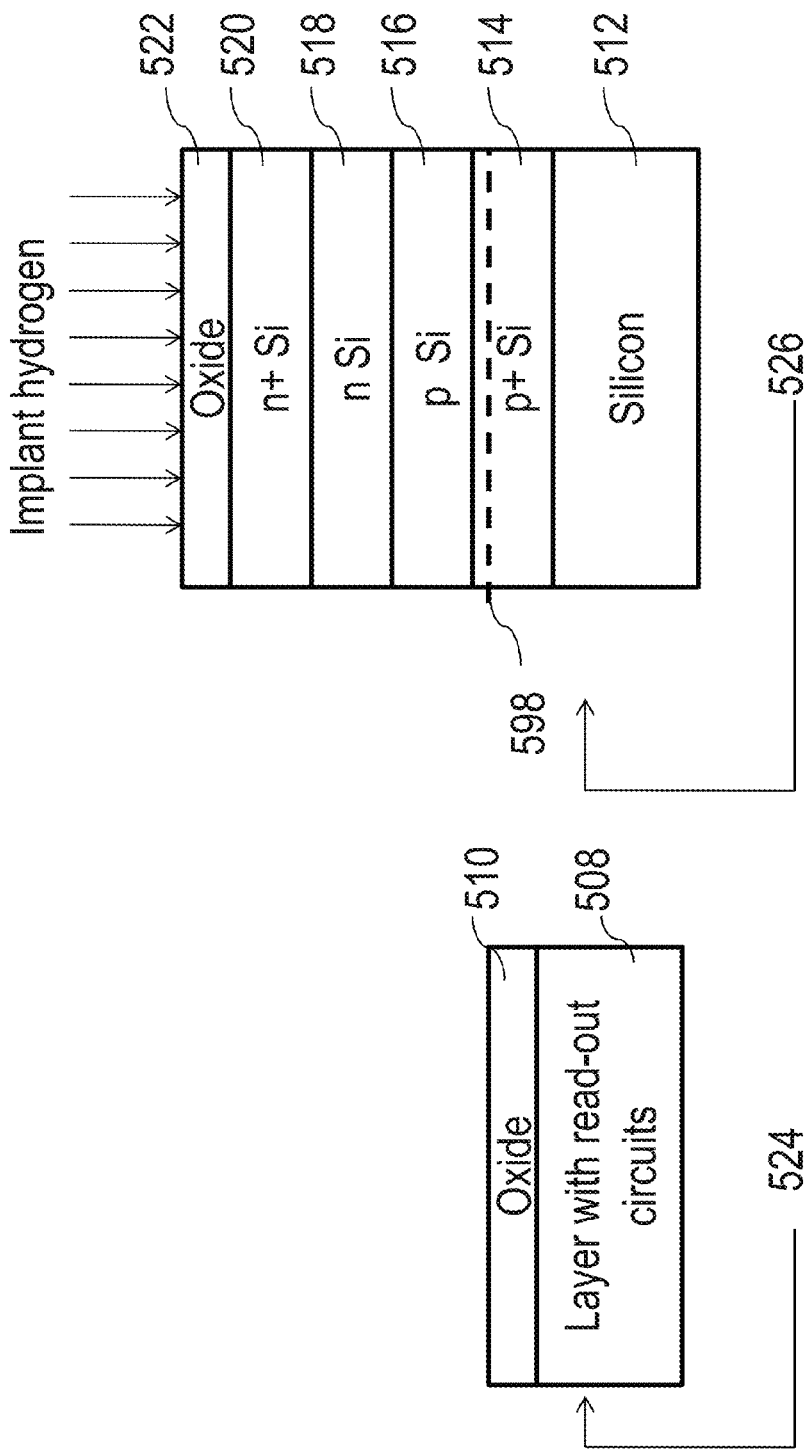
FIGS. 5A-5B illustrate an embodiment of this invention, where red, green and blue photodetectors are stacked monolithically atop read-out circuits using ion-cut technology (for an image sensor)
Figure 5B:
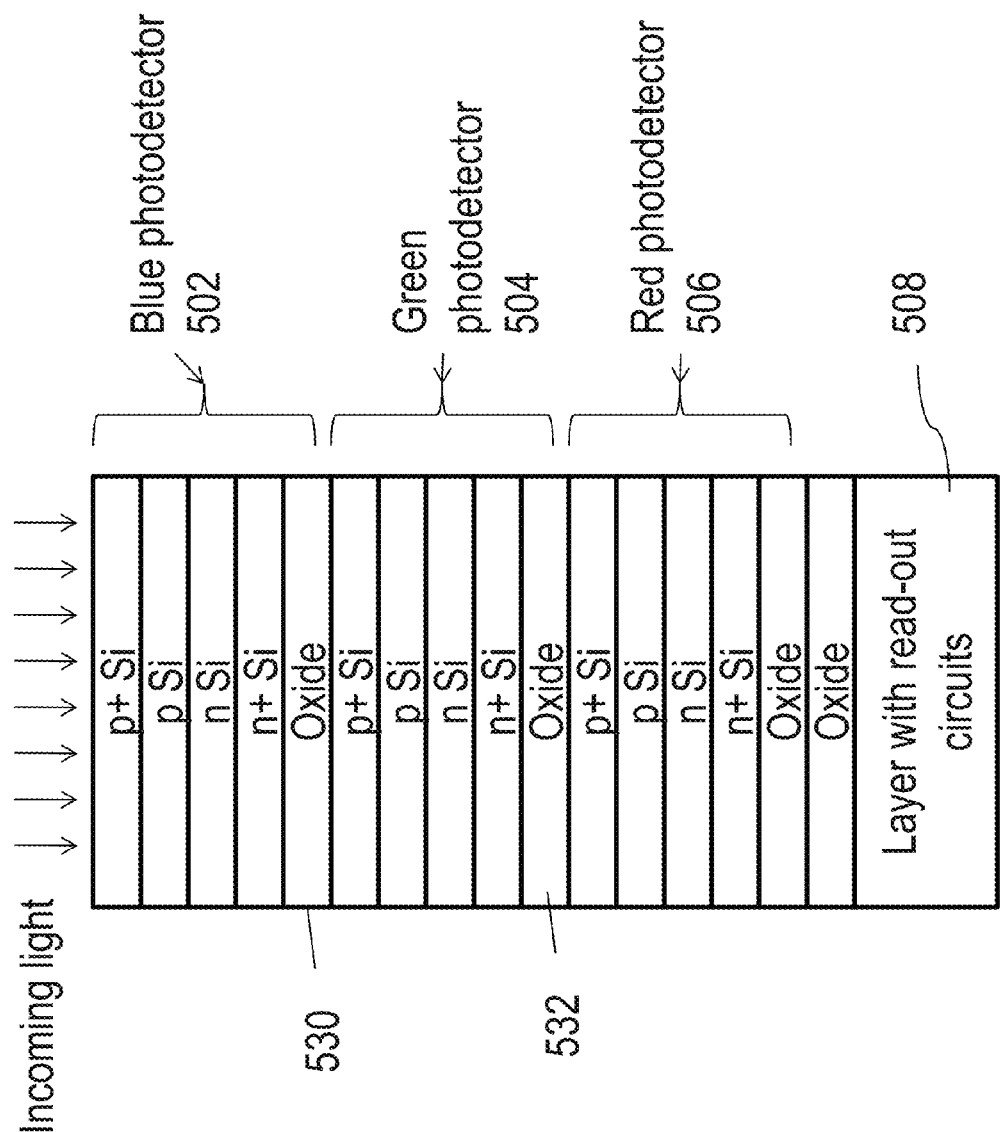

FIGS. 5A-B illustrate an embodiment of this invention, where red, green, and blue photodetectors are stacked monolithically atop read-out circuits using ion-cut technology (for an image sensor). Therefore, a smart layer transfer technique is utilized. FIG. 5A shows the first step for constructing this image sensor. 524 shows a cross-sectional view of 508, a silicon wafer with read-out circuits constructed on it, above which an oxide layer 510 is deposited. 526 shows the cross-sectional view of another wafer 512 which has a p+ Silicon layer 514, a p Silicon layer 516, a n Silicon layer 518, a n+ Silicon layer 520, and an oxide layer 522. These layers are formed using procedures similar to those described in FIG. 3A-G. An anneal is then performed to activate dopants in various layers. Hydrogen is implanted in the wafer at a certain depth depicted by 598. FIG. 5B shows the structure of the image sensor before contact formation. Three layers of p+pnn+ silicon (each corresponding to a color band and similar to the one depicted in 526 in FIG. 5A) are layer transferred sequentially atop the silicon wafer with read-out circuits (depicted by 524 in FIG. 5A). Three different layer transfer steps may be used for this purpose. Procedures for layer transfer and alignment for forming the image sensor in FIG. 5B are similar to procedures used for constructing the image sensor shown in FIGS. 3A-G. Each of the three layers of p+pnn+ silicon senses a different wavelength of light. For example, blue light is detected by blue photodetector 502, green light is detected by green photodetector 504, and red light is detected by red photodetector 506. Contacts, metallization, packaging and other steps are done to the structure shown in FIG. 5B to form an image sensor. The oxides 530 and 532 could be either transparent conducting oxides or silicon dioxide. Use of transparent conducting oxides could allow fewer contacts to be formed.

Figure 6A:
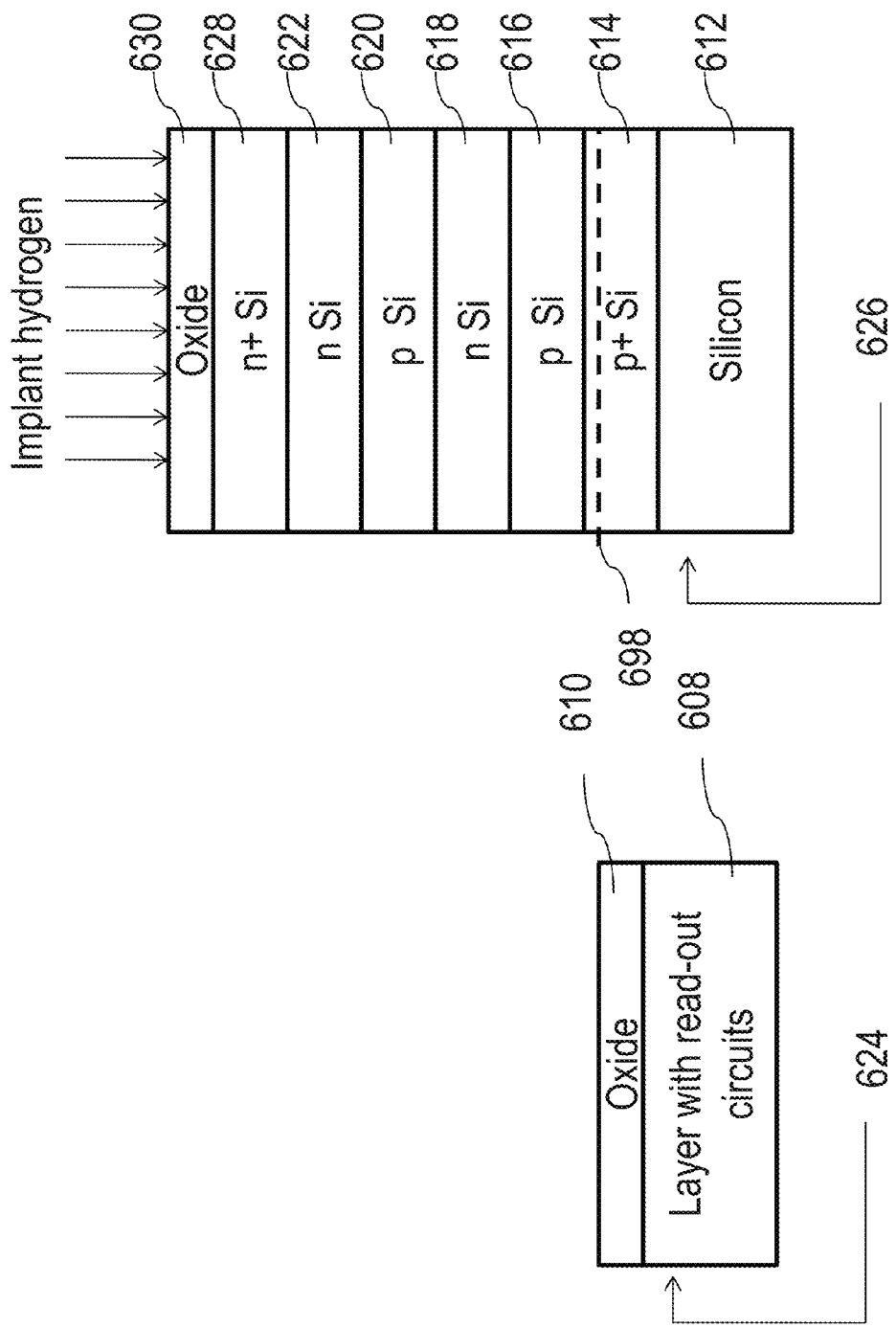

FIG. 6A-B show another embodiment of this invention, where red, green and blue photodetectors are stacked monolithically atop read-out circuits using ion-cut technology (for an image sensor) using a different configuration. Therefore, a smart layer transfer technique is utilized. FIG. 6A shows the first step for constructing this image sensor. 624 shows a cross-section of 608, a silicon wafer with read-out circuits constructed on it, above which an oxide layer 610 is deposited. 626 shows the cross-sectional view of another wafer 612 which has a p+ Silicon layer 614, a p Silicon layer 616, a n Silicon layer 618, a p Silicon layer 620, a n Silicon layer 622, a n+ Silicon layer 628 and an oxide layer 630. These layers may be formed using procedures similar to those described in FIG. 3A-G. An anneal is then performed to activate dopants in various layers. Hydrogen is implanted in the wafer at a certain depth depicted by 698. FIG. 6B shows the structure of the image sensor before contact formation. A layer of p+ pnpnn+ (similar to the one depicted in 626 in FIG. 6A) is layer transferred sequentially atop the silicon wafer with read-out circuits (depicted by 624 in FIG. 6A). Procedures for layer transfer and alignment for forming the image sensor in FIG. 6B are similar to procedures used for constructing the image sensor shown in FIG. 3A-G. Contacts, metallization, packaging and other steps are done to the structure shown in FIG. 6B to form an image sensor. Three different pn junctions, denoted by 602, 604 and 606 may be formed in the image sensor to detect different wavelengths of light.

Figure 7A:
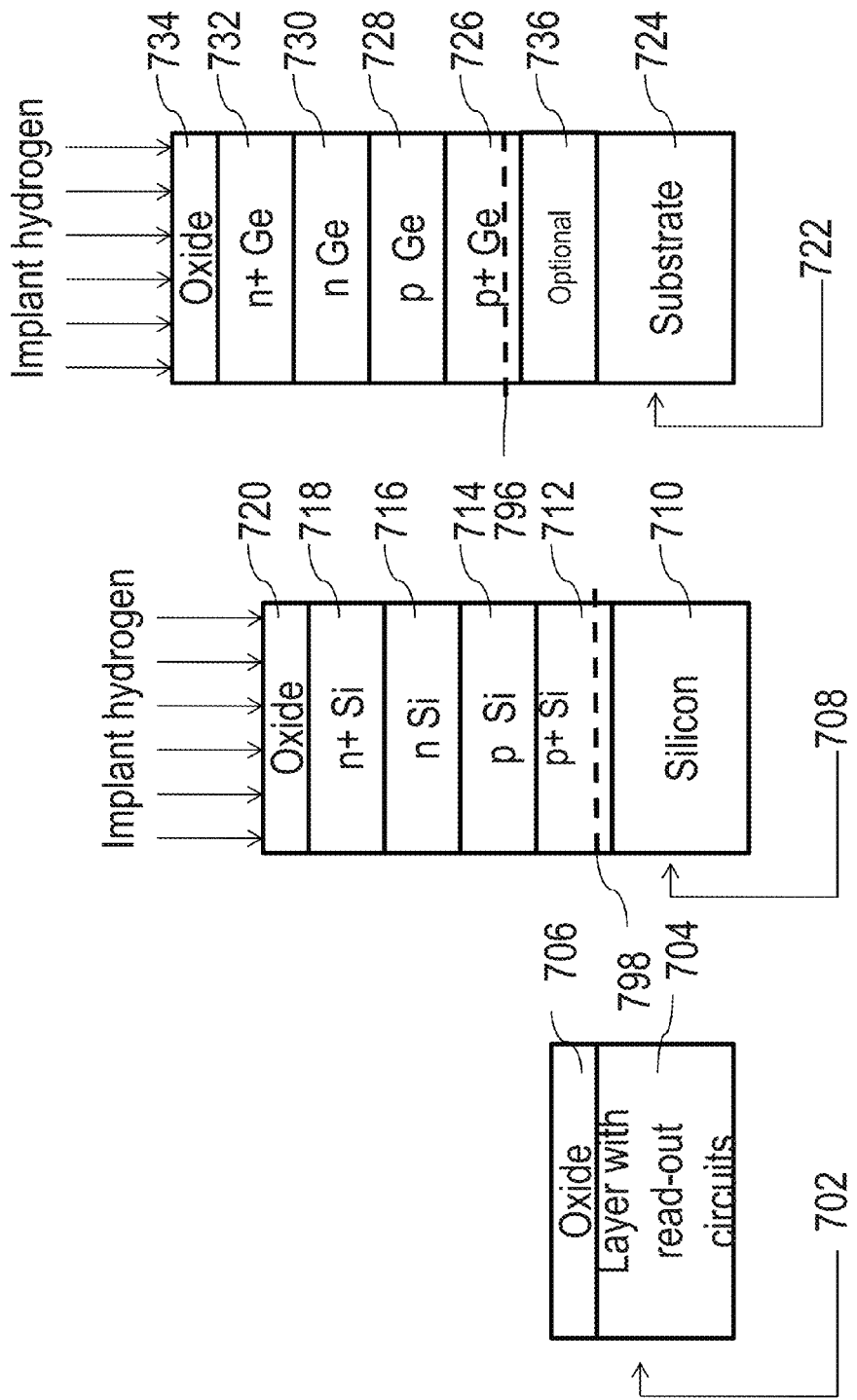
FIGS. 7A-7B illustrate an embodiment of this invention, where an image sensor that can detect both visible and infra-red light without any loss of resolution is constructed.
Figure 7B:
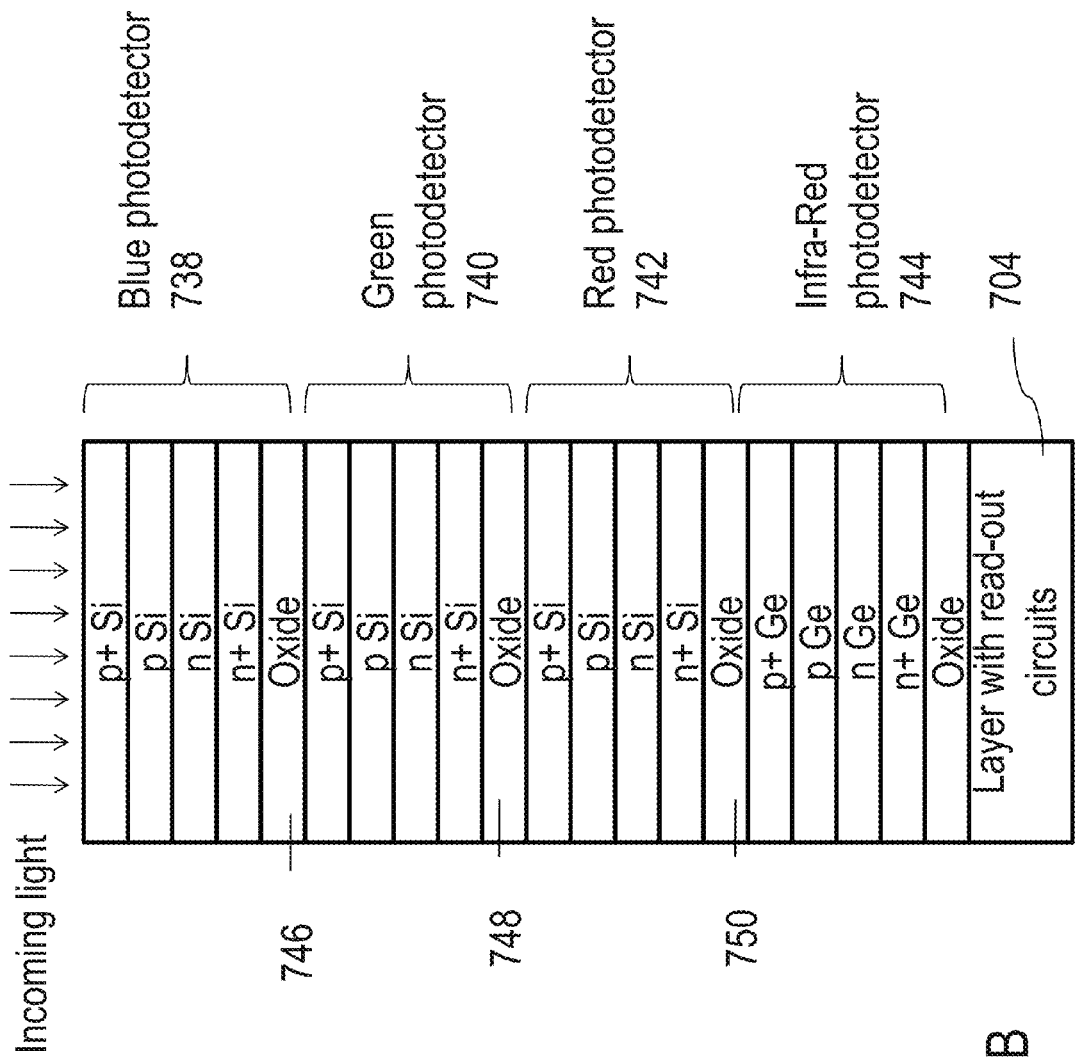

FIGS. 7A-B show another embodiment of this invention, where an image sensor that can detect both visible and infra-red light is depicted. Such image sensors could be useful for taking photographs in both day and night settings (without necessarily requiring a flash). This embodiment makes use of the fact that while silicon is not sensitive to infra-red light, other materials such as Germanium and Indium Gallium Arsenide are. A smart layer transfer technique is utilized for this embodiment. FIG. 7A shows the first step for constructing this image sensor. 702 shows a cross-sectional view of 704, a silicon wafer with read-out circuits constructed on it, above which an oxide layer 706 is deposited. 708 shows the cross-sectional view of another wafer 710 which has a p+ Silicon layer 712, a p Silicon layer 714, a n Silicon layer 716, a n+ Silicon layer 718 and an oxide layer 1720. These layers may be formed using procedures similar to those described in FIGS. 3A-G. An anneal is then performed to activate dopants in various layers. Hydrogen is implanted in the wafer at a certain depth depicted by 798. 722 shows the cross-sectional view of another wafer which has a substrate 724, an optional buffer layer 736, a p+ Germanium layer 726, a p Germanium layer 728, a n Germanium layer 732, a n+ Germanium layer 732 and an oxide layer 734. These layers are formed using procedures similar to those described in FIGS. 3A-G. An anneal is then performed to activate dopants in various layers. Hydrogen is implanted in the wafer at a certain depth depicted by 796. Examples of materials used for the structure 722 include a Germanium substrate for 724, no buffer layer and multiple Germanium layers. Alternatively, a Indium Phosphide substrate could be used for 724 when the layers 726, 724, 722 and 720 are constructed of InGaAs instead of Germanium. FIG. 7B shows the structure of this embodiment of the invention before contacts and metallization are constructed. The p+pnn+ Germanium layers of structure 722 of FIG. 7A are layer transferred atop the read-out circuit layer of structure 702. This is done using smart layer transfer procedures similar to those described in respect to FIG. 3A-G. Following this, multiple p+pnn+ layers similar to those used in structure 708 are layer transferred atop the read-out circuit layer and Germanium photodetector layer (using three different layer transfer steps). This, again, is done using procedures similar to those described in FIGS. 3A-G. The structure shown in FIG. 7B therefore has a layer of read-out circuits 704, above which an infra-red photodetector 744, a red photodetector 742, a green photodetector 740 and a blue photodetector 738 are present. Procedures for layer transfer and alignment for forming the image sensor in FIG. 7B are similar to procedures used for constructing the image sensor shown in FIG.

3A-G. Each of the p+pnn+ layers senses a different wavelength of light. Contacts, metallization, packaging and other steps are done to the structure shown in FIG. 7B to form an image sensor. The oxides 746, 748, and 750 could be either transparent conducting oxides or silicon dioxide. Use of transparent conducting oxides could allow fewer contacts to be formed.

Figure 8A:
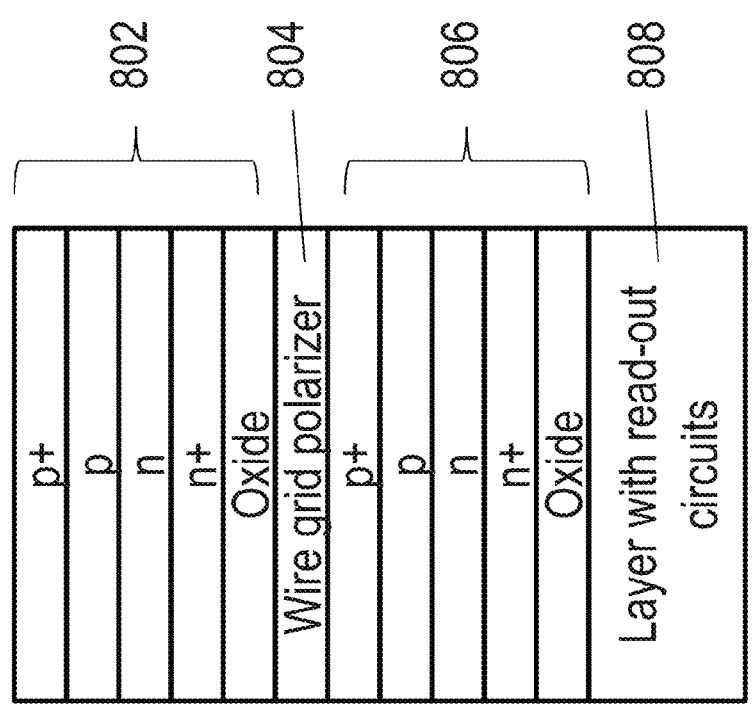
FIG. 8A illustrates an embodiment of this invention, where polarization of incoming light is detected.

FIG. 8A describes another embodiment of this invention, where polarization of incoming light can be detected. The p-n junction photodetector 806 detects light that has passed through a wire grid polarizer 804. Details of wire grid polarizers are described in "Fabrication of a 50 nm half-pitch wire grid polarizer using nanoimprint lithography." Nanotechnology 16 (9): 1874-1877, 805 by Ahn, S. W.; K. D. Lee, J. S. Kim, S. H. Kim, J. D. Park, S. H. Lee, P. W. Yoon. The wire grid polarizer 804 absorbs one plane of polarization of the incident light, and may enable detection of other planes of polarization by the p-n junction photodetector 806. The p-n junction photodetector 802 detects all planes of polarization for the incident light, while 806 detects the planes of polarization that are not absorbed by the wire grid polarizer 804. One can thereby determine polarization information from incoming light by combining results from photodetectors 802 and 806. The device described in FIG. 8A can be fabricated by first constructing a silicon wafer with transistor circuits 808, following which the p-n junction photodetector 806 can be constructed with the low-temperature layer transfer techniques described in FIG. 3A-G. Following this construction of p-n junction photodetector 806, the wire grid polarizer 804 may be constructed using standard integrated circuit metallization methods. The photodetector 802 can then be constructed by another low-temperature layer transfer process as described in FIG. 3A-G. One skilled in the art, based on the present disclosure, can appreciate that low-temperature layer transfer techniques are critical to build this device, since semiconductor layers in 802 are built atop metallization layers required for the wire grid polarizer 804. Thickness of the photodetector layers 802 and 806 may be preferably less than 5 μm. An example with polarization detection where the photodetector has other pre-processed optical interaction layers (such as a wire grid polarizer) has been described herein. However, other devices for determining parameters of incoming light (such as phase) may be constructed with layer transfer techniques.

Figure 8B:
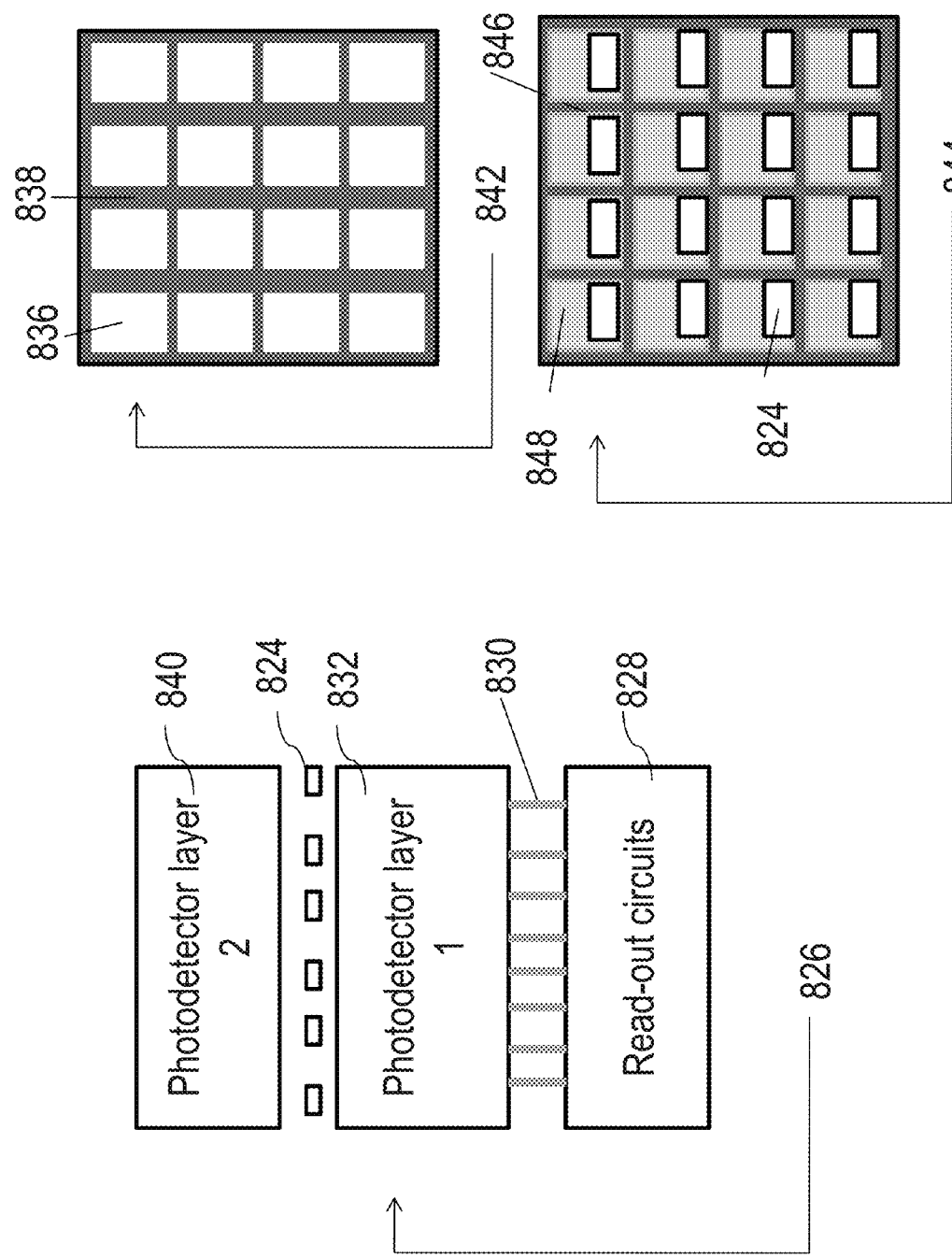
FIG. 8B illustrates another embodiment of this invention, where an image sensor with high dynamic range is constructed.

One of the common issues with taking photographs with image sensors is that in scenes with both bright and dark areas, while the exposure duration or shutter time could be set high enough to get enough photons in the dark areas to reduce noise, picture quality in bright areas degrades due to saturation of the photodetectors' characteristics. This issue is with the dynamic range of the image sensor, i.e. there is a tradeoff between picture quality in dark and bright areas. FIG. 8B shows an embodiment of this invention, where higher dynamic range can be reached. According to the embodiment of FIG. 8B, two layers of photodetectors 832 and 840, could be stacked atop a read-out circuit layer 828. 826 is a schematic of the architecture. Connections 830 run between the photodetector layers 832 and 840 and the read-out circuit layer 828. 824 are reflective metal lines that block light from reaching part of the bottom photodetector layer 832. 842 is a top view of the photodetector layer 840. Photodetectors 836 could be present, with isolation regions 838 between them. 844 is a top view of the photodetector layer 832 and the metal lines 824. Photodetectors 848 are present, with isolation regions 846 between them. A portion of the photodetectors 848 can be seen to be blocked by metal lines 824. Brighter portions of an image can be captured with photodetectors 848, while darker portions of an image can be captured with photodetectors 836. The metal lines 824 positioned in the stack may substantially reduce the number of photons (from brighter portions of the image) reaching the bottom photodetectors 848. This reduction in number of photons reaching the bottom photodetectors 848 helps keep the dynamic range high. Read-out signals coming from both dark and bright portions of the photodetectors could be used to get the final picture from the image sensor.

FIG. 9 illustrates another embodiment of this invention where a read-out circuit layer 904 is monolithically stacked above the photodetector layer 902 at a temperature approximately less than 400° C. Connections 906 are formed between these two layers. Procedures for stacking high-quality monocrystalline transistor circuits and wires at temperatures approximately less than 400° C. using layer transfer are described in pending U.S. patent application Ser. No. 12/901,890 by the inventors of this patent application, the content of which is incorporated by reference. The stacked layers could use junction-less transistors, recessed channel transistors, repeating layouts or other devices/techniques described in U.S. patent application Ser. No. 12/901,890 the content of which is incorporated by reference. The embodiments of this invention described in FIG. 2-FIG. 9 may share a few common features. They can have multiple stacked (or overlying) layers, use one or more photodetector layers (terms photodetector layers and image sensor layers are often used interchangeably), thickness of at least one of the stacked layers is less than 5 microns and construction can be done with smart layer transfer techniques and are stacking is done at temperatures approximately less than 450° C.

An aspect of various embodiments of this invention is the ability to cleave wafers and bond wafers at lower temperatures (e.g., less than 400° C. or even less than 250° C.). In co-pending U.S. patent application Ser. No. 12/901,890, now U.S. Pat. No. 8,026,521, and Ser. No. 13/016,313, now U.S. Pat. No. 8,362,482, the contents of which are incorporated by reference, several techniques to reduce temperatures for cleave and bond processes are described. These techniques are herein incorporated in this document by reference.

Optical Interconnects:

Optical interconnects in inter-chip communication have become a feasible replacement for electrical interconnects as the line capacitance of the latter has imposed increasingly difficult limitations due to scaling. As electrical component density increases, optical lines can carry more information between electrical components.

An optical interconnect system may consist of several components. The first is a transmission component that generates and modulates the light that is used to send the information. The second is a network of waveguides that guides the light to the receiving destination on the chip. Finally, there is the receiver network, which converts the light back to electrical signals so that the information can be processed by the electronic devices on the chip.

The transmission component is typically built out of lasers and modulators. Lasers are built typically using III-V semiconductors like GaAs, InP, and InGaAs which have superior optical mechanisms compared to Group IV semiconductors such as silicon or germanium. The drawback with these III-V materials is that their processing is not compatible with the Group IV materials used for the electronic components of the chip. In this case, it may be advantageous that the laser is placed off-chip, which additionally offers the advantage of insulating the laser operation from the temperature variations and power limits of the chip itself. Another option is to use a layer of LEDs in a monolithic 3D configuration as the light sources for the data transmission. The advantage of this option is that LEDs are cheaper than lasers and are easier to modulate directly. However, LEDs present some limitations as to the data transmission efficiency through the waveguides since, unlike the generated light from lasers, the generated light from LEDs are not coherent or collimated, and, hence, waveguide loss is significant.

Waveguides are passive optical components designed to confine light in one direction. Typically they are made out of Silicon, Silicon Dioxide, and Silicon Nitride, which are materials already being used for the electronic components in conventional chips, and thus are materially compatible and can be grown or deposited on top of these layers. So in Silicon-based chips, such dielectric waveguides are usually used, in which a material with high permittivity corresponding to a high index of refraction, is surrounded by a material with lower permittivity corresponding to a lower index of refraction. The structure then guides optical waves by total internal reflection. For example, Silicon may be used for the high permittivity material and Silicon dioxide for the low permittivity material. Another type of waveguides use photonic crystal structures, which again can be constructed using Silicon and Silicon dioxide. In most cases, masks and etching are used to construct the structures. One of the potential disadvantages of dielectric waveguides is they are not able to contain light where sharp turns are required because of the limits imposed on light refraction between two materials by the critical angle, and light leakage may result. So they may be suitable for chip-to-chip optical communications where most waveguides only need to be mostly straight and here the significant distance between the two chips may allow for gradual turns if needed.

Yet another type of waveguides is called hollow metal waveguides (HMWG), made of trenches in the material with walls coated with reflective metals which may include, for example, silver. In combination with beam-splitters, HMWG's allow light to be reflected around sharp corners, which may be a potential advantage as described in Mathai, S., et al., US Patent Application Publication 2009/0244716A1. In intra-chip optical communications, where waveguide layer thickness may be limited, HMWG's may be used to enable the sharp turns required for the light signals.

The receiving component may include an array of photodetectors, typically made from Ge or SiGe. These photo-detectors may have a p-n or p-i-n structure and may be biased to capture photons and subsequently convert them into electronic carriers.

Layer transfer technology may be utilized for constructing the layers for an optical interconnect system.

LED-Driven Chip-to-Chip Optical Interconnect:

The transmission component may consist of a layer of light-emitting diodes (LEDs) physically coupled with a layer of control circuits to manage the triggering of the LEDs so as to control the light being transmitted to enable data communication. The light may then be sent through a layer of waveguides which may distribute the light to their respective destinations on the chip, which may then be received by a layer of photo-detectors and converted to electrical signals by the readout circuits that can be handled by the electronic components of the chip.

FIGS. 10A-10H illustrate an embodiment of the invention, where the transmitter block: LED control circuit layer 1042, LED layer 1048; communication channel: waveguide layer 1036; and receiver block: photo-detector layer 1010, and readout circuit layer 1000 may be stacked monolithically with layer transfer.

The process of forming the optical communication system may include several steps that occur in a sequence from Step A to Step H. Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A): FIG. 10A illustrates the first step for constructing the photo-detector layer 1010 and readout circuit layer 1000, where the photo-detector layer 1010 may be formed atop the readout circuit layer 1000 using layer transfer. FIG. 10A illustrates a cross-sectional view of silicon wafer substrate with pre-processed read-out circuits 1002, above which an oxide layer 1004 may be deposited. Thus readout circuit layer 1000 is formed. FIG. 10A further illustrates the cross-sectional view of another Silicon wafer 1012 which may have a p+ Silicon layer 1014, a p Silicon layer 1016, a n Silicon layer 1018, a n+ Silicon layer 1020, and an oxide layer 1022. These layers may be formed using procedures similar to those described in FIG. 3A-G. An anneal may then be performed to activate dopants in various layers. Hydrogen may be implanted in the wafer at a certain depth depicted by dashed line 1090.

Figures 10B, 10C:
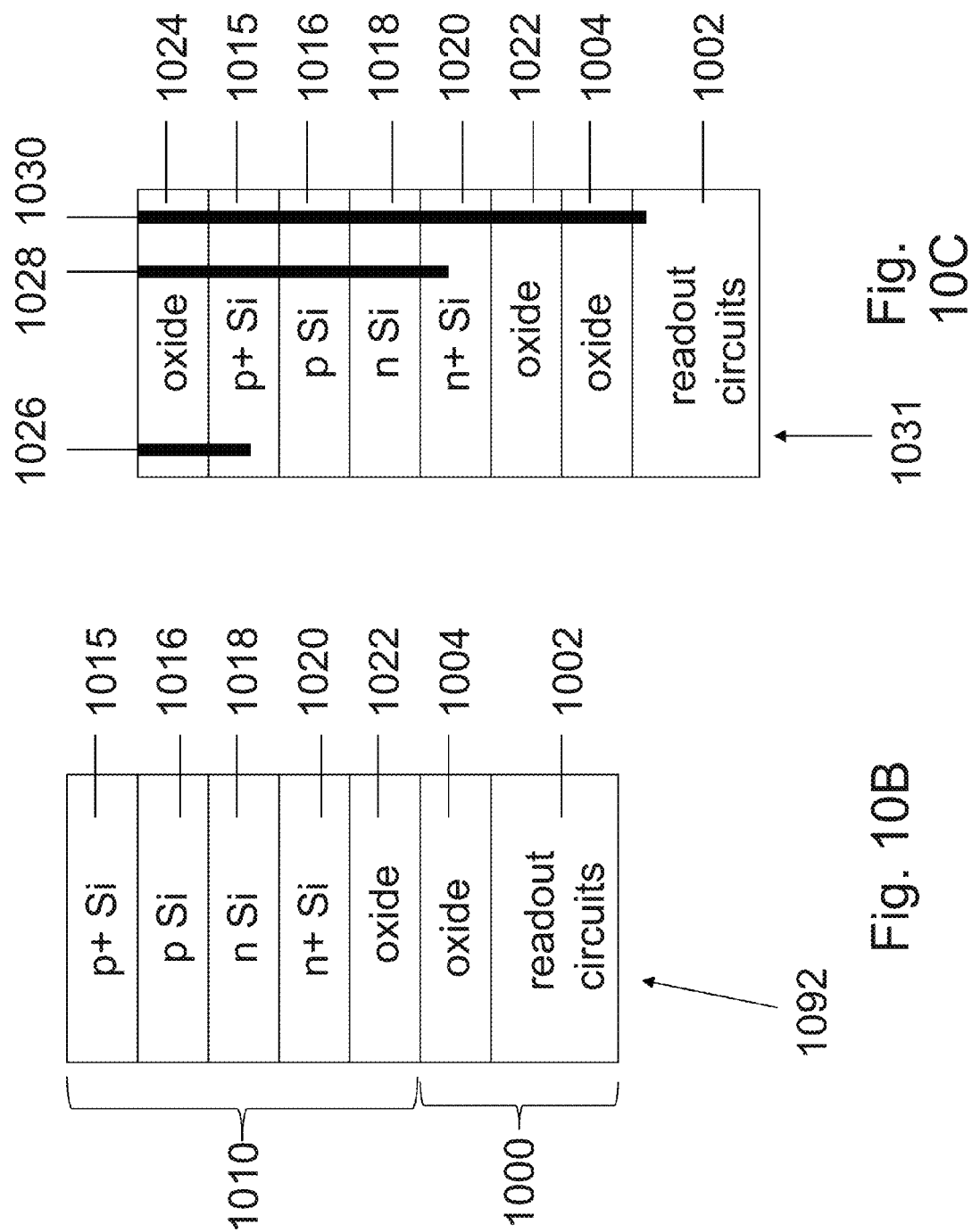

Step (B): FIG. 10B illustrates the photo-detector and readout circuit structure 1092 formed by an ion-cut layer transfer process. The photo-detector layer 1010 of p+pnn+ silicon consisting of the photo-detector diodes may be layer transferred atop the silicon wafer with readout circuit layer 1000 wherein oxide layer 1004 may be bonded to oxide layer 1022, and p+ silicon layer 1015 may be a result of the cleave and polish operations. Procedures for layer transfer and alignment for forming the structure in FIG. 10B are similar to procedures used for constructing the image sensor shown in FIGS. 3A-G.

Step (C) is illustrated in FIG. 10C. An oxide layer 1024 may be deposited on top of p+ silicon layer 1015. Connections may be made to the terminals of the photo-detector by lithographic, etch, and fill operations similar to those described in FIGS. 3A-G and are indicated as p+ contact 1026 and n+ contact 1028. Various elements of FIG. 10C such as 1002, 1004, 1015, 1016, 1018, 1020, and 1022 have been described previously. Contacts 1030 and interconnects (not shown) for connecting terminals of the photo-detector, such as p+ contact 1024 and p+ contact 1028, to read-out circuits in silicon wafer substrate with pre-processed read-out circuits 1002 may be done. Thus silicon wafer containing the photo-detectors and read-out circuits 1031 may be formed. The functionality of the photo-detectors may be tested at this point.

As described previously, FIGS. 3A-G illustrate a process whereby oxide vias constructed before layer transfer may be used to look through photo-detector layers to observe alignment marks on the read-out circuit wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme may be formed. This order of sequences may enable observation of alignment marks on the bottom read-out circuit wafer by looking through the photo-detector wafer.

Waveguides are structures designed to confine light in one direction. In Silicon-based chips, dielectric waveguides are usually used, in which a material with high permittivity corresponding to a high index of refraction, is surrounded by a material with lower permittivity corresponding to a lower index of refraction. The structure then guides optical waves by total internal reflection. For Silicon-based chips, convenient materials are Silicon for the high permittivity material and Silicon dioxide for the low permittivity material. Another type of waveguides use photonic crystal structures, which again can be constructed using Silicon and Silicon dioxide. In most cases, masks and etching are used to construct the structures. Yet another type of waveguides may be called hollow metal waveguides (HMWG), made of trenches in the material with walls coated with reflective metals which may include silver. In combination with beam-splitters, HMWG's allow light to be reflected around sharp corners, which may be a potential advantage.

Step (D) is illustrated in FIG. 10D. Silicon waveguides 1036 may be formed on the SOI wafer 1032 and BOX 1034 by electron beam lithography followed by electron cyclotron resonance plasma etching. The wafer may then be coated with Silicon Dioxide 1038 to form the over-cladding. It will be obvious to one skilled in the art that many configurations and material combinations are being currently used and/or possible in the formation of the waveguides. This invention is not limited to one particular configuration or set of materials. Hydrogen may be implanted in the wafer at a certain depth depicted by 1040. Thus, Silicon/Silicon Dioxide waveguide layer 1039 may be formed.

Step (E) is illustrated in FIG. 10E. The Silicon/Silicon Dioxide waveguide layer 1039 may then be ion-cut layer transferred atop the silicon wafer containing the photo-detectors and read-out circuits 1031. Procedures for layer transfer and alignment for forming the structure 1041 in FIG. 10E are similar to procedures used previously: Silicon/Silicon Dioxide waveguide layer 1039 may be flipped and bonded atop silicon wafer containing the photo-detectors and read-out circuits 1031 using oxide-oxide bonding and the Silicon substrate 1032 may then be cleaved and polished until the oxide layer 1034, now labeled 1035 after the cleave and polish process, is reached.

Step (F) is shown in FIG. 10F which is used for constructing the LED and control circuit layers, where the Red LED layer from Red LED wafer 1048 may be formed atop the electronic control circuit layer 1042 using ion-cut layer transfer. Silicon wafer with control circuits 1044 may be conventionally constructed, above which an oxide layer 1046 may be deposited. Red LED wafer 1048 may include GaAs wafer 1050, n-type confinement layer 1052, multiple quantum well (MQW) layer 1054, P-type confinement layer 1056, and an ITO current spreader layer 1058. Examples of materials used to construct these layers may include, but are not limited to; doped AlInGaP for the n-type confinement layer 1052 and p-type confinement layer 1056, multiple quantum well layer 1054 could be composed of AlInGaP and GaInP. These layers may be formed by processes such as molecular beam epitaxy, MOCVD, etc. The red LED wafer described in FIG. 10F may have hydrogen implanted into it at a certain depth as shown by dotted line 1060. Alternatively, helium can be implanted.

Step (G) is shown in FIG. 10G. The layer of GaAs structures consisting of the red LEDs 1048 may be layer transferred atop the silicon wafer with the control circuits 1042 forming the LED stack 1070. Procedures for layer transfer and alignment for forming the structure in FIG. 10G may be similar to procedures used for constructing the LED lighting shown in FIGS. 12A-F of incorporated parent U.S. application Ser. No. 13/274,161. n-GaAs layer 1052 is renamed 1053 after the cleaving and polishing process. An ITO layer 1062 is deposited atop n-GaAs layer 1053, thus forming the LED stack 1070. The functionality of the LEDs may be tested at this point.

Step (H) is illustrated by FIG. 10H. The structure shown in FIG. 10G, LED stack 1070, may be flipped and bonded atop the structure shown in FIG. 10E, structure 1041, using oxide-to-oxide bonding of ITO layer 1062 and oxide layer 1035. Various elements in FIG. 10H such as 1002, 1004, 1015, 1016, 1018, 1020, 1022, 1024, 1035, 1036, 1038, 1044, 1046, 1053, 1054, 1056, 1058 and 1062 have been described previously. Thus, LED-driven chip-to-chip optical interconnect 1099 may be formed.

Laser-Driven Chip-to-Chip Optical Interconnect:

FIGS. 11A-11D illustrate an embodiment of this invention, where the transmitter block: modulator control circuit layer 1142, modulator layer 1148; communication channel: waveguide layer 1136; and receiver block: photodetector layer 1110, and readout circuit layer 1100 are stacked monolithically with layer transfer.

Step (A): FIG. 11A illustrates the first step for constructing the waveguide layer 1136, photodetector layer 1110, readout circuit layer 1100, where the waveguide layer 1136 with oxide layer 1134, oxide layer 1128, oxide layer 1121 oxide layer 1122 and oxide layer 1104 may be formed atop the photodetector layer 1110, which in turn may be formed atop the readout circuit layer 1100 using layer transfer procedures described in FIG. 10A-E.

Figure 11B:
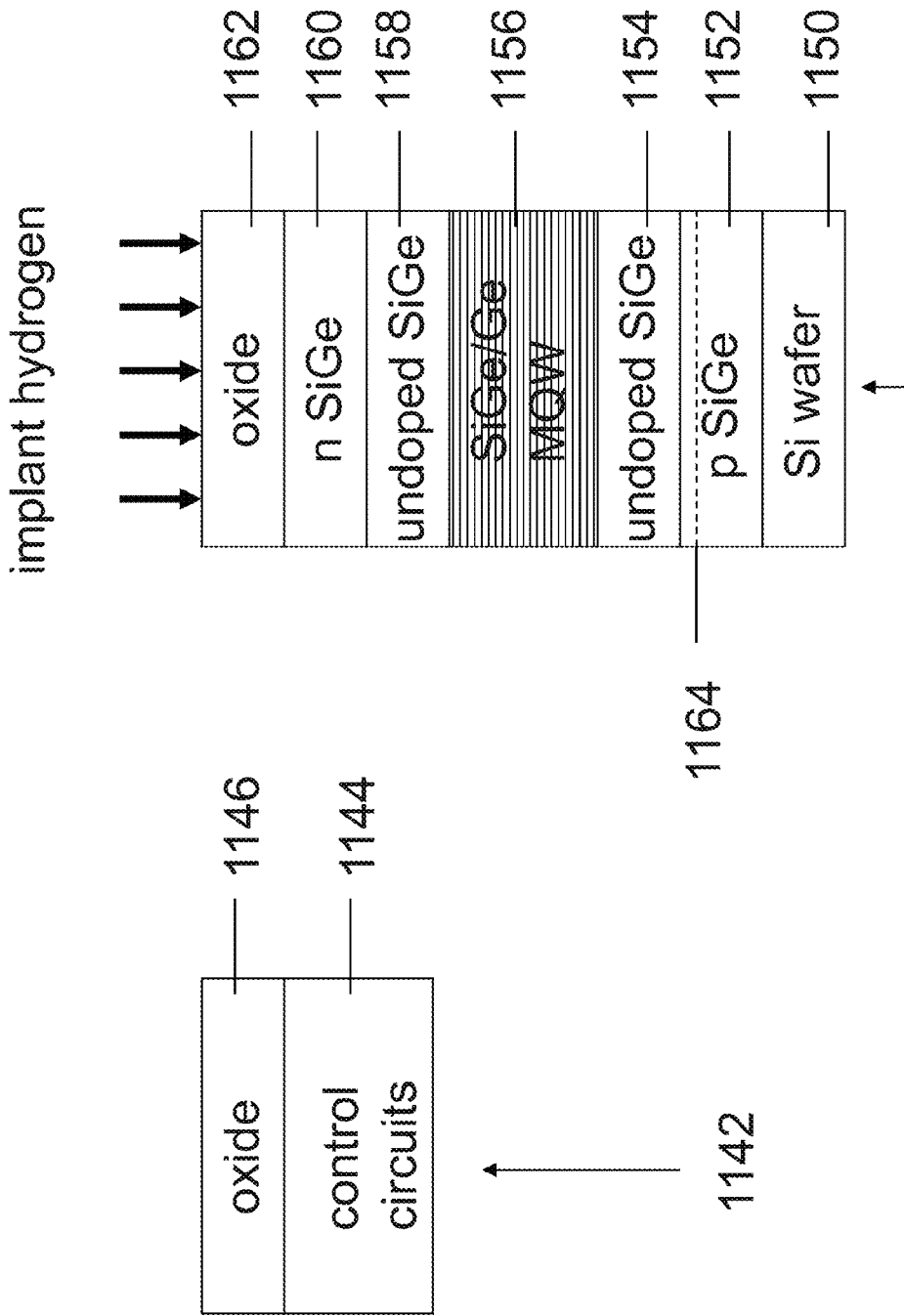

Step (B) is shown in FIG. 11B which is used for constructing the modulator and control circuit layers, where the modulator layer is formed atop the electronic control circuit layer using layer transfer. 1142 shows a cross-sectional view of 1144, a silicon wafer with control circuits constructed on it, above which an oxide layer 1146 is deposited. 1148 shows the cross-sectional view of a Silicon wafer 1150 containing Silicon-Germanium modulators and may include a P-type Silicon-Germanium buffer layer 1152, an undoped Silicon-Germanium spacer 1154, a Germanium/Silicon-Germanium multiple quantum well (MQW) 1156, another undoped Silicon-Germanium spacer 1158, an N-type Silicon-Germanium layer 1160, and a deposited oxide layer 1162. Examples of materials used to construct these layers, include, but are not limited to, doped GaAs for the N-type cap layer 1160 and P-type buffer layer 1152, the multiple quantum well layer 1156 could be of GaAs and AlGaAs. A double heterostructure configuration or single quantum well configuration could be used instead of a multiple quantum well configuration. Various other material types and configurations could be used for constructing the modulators for this process. The modulator wafer described in FIG. 11B has hydrogen implanted into it at a certain depth. The dotted line 1164 depicts the hydrogen implant. Alternatively, helium can be implanted.

Step (C) is shown in FIG. 11C. The layer of SiGe structures consisting of the modulators 1148 is layer transferred atop the silicon wafer with the control circuits 1142. Procedures for layer transfer and alignment for forming the structure in FIG. 11C are similar to procedures used for constructing the photo-detectors shown in FIGS. 3A-G. The functionality of the modulators can be tested at this point.

Figure 11D:
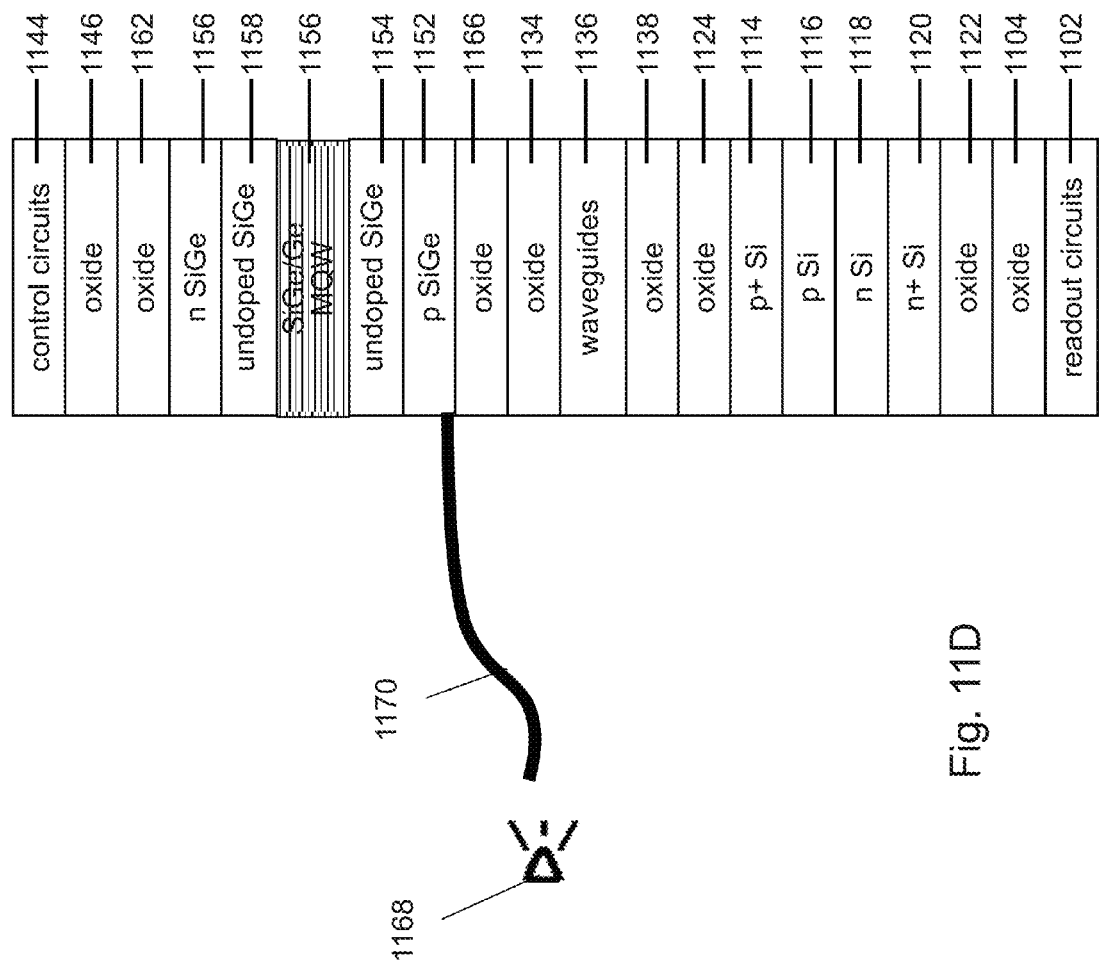

Step (D) is illustrated by FIG. 11D. The structure shown in FIG. 11C is flipped and bonded atop the structure shown in FIG. 11A using oxide-to-oxide bonding of layers 1166 and 1134. Various elements in FIG. 11D such as 1102, 1104, 1114, 1116, 1118, 1120, 1122, 1134, 1136, 1138, 1144, 1146, 1152, 1154, 1156, 1158, 1160, 1162 and 1166 have been described previously. An external laser 1168 (typically made of InP) is then coupled to the structure via an optical fiber 1170 by known techniques.

On-Chip LED-Driven Optical Interconnects

Figure 12A:
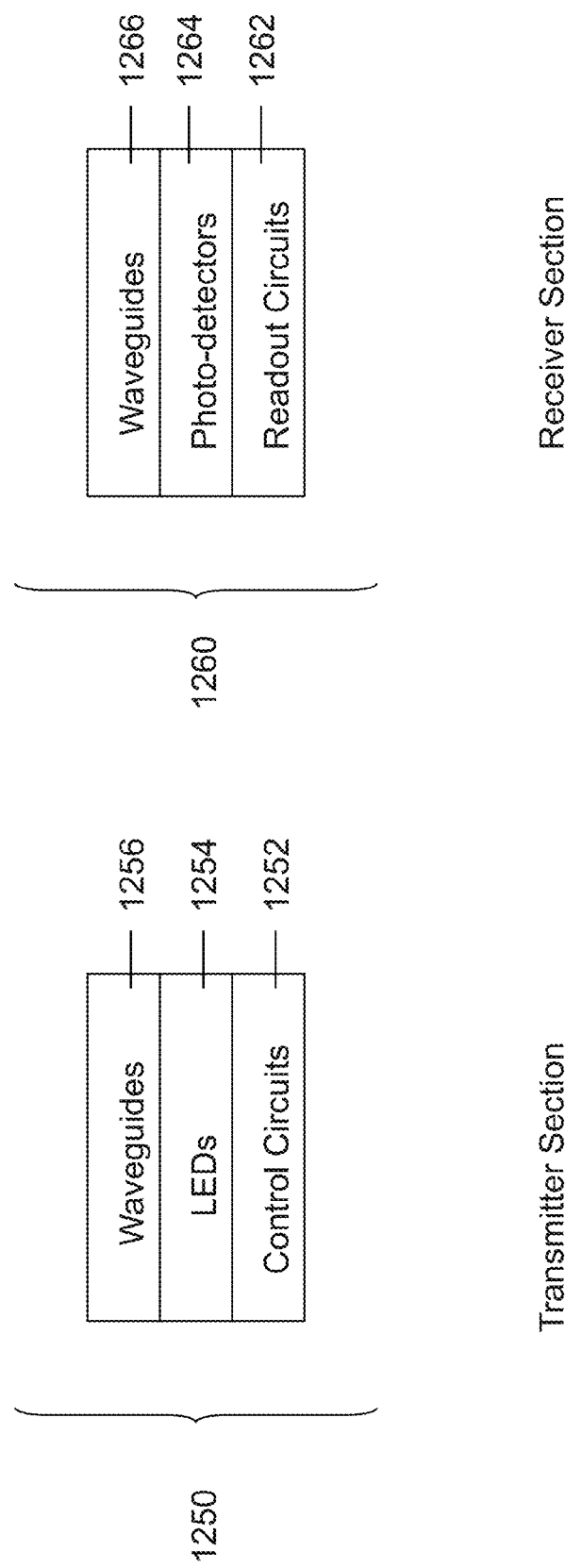
FIGS. 12A-12C illustrate an embodiment of this invention, where a LED-driven on-chip optical interconnect is constructed by monolithically stacking using layer transfer techniques.
Figure 12B:
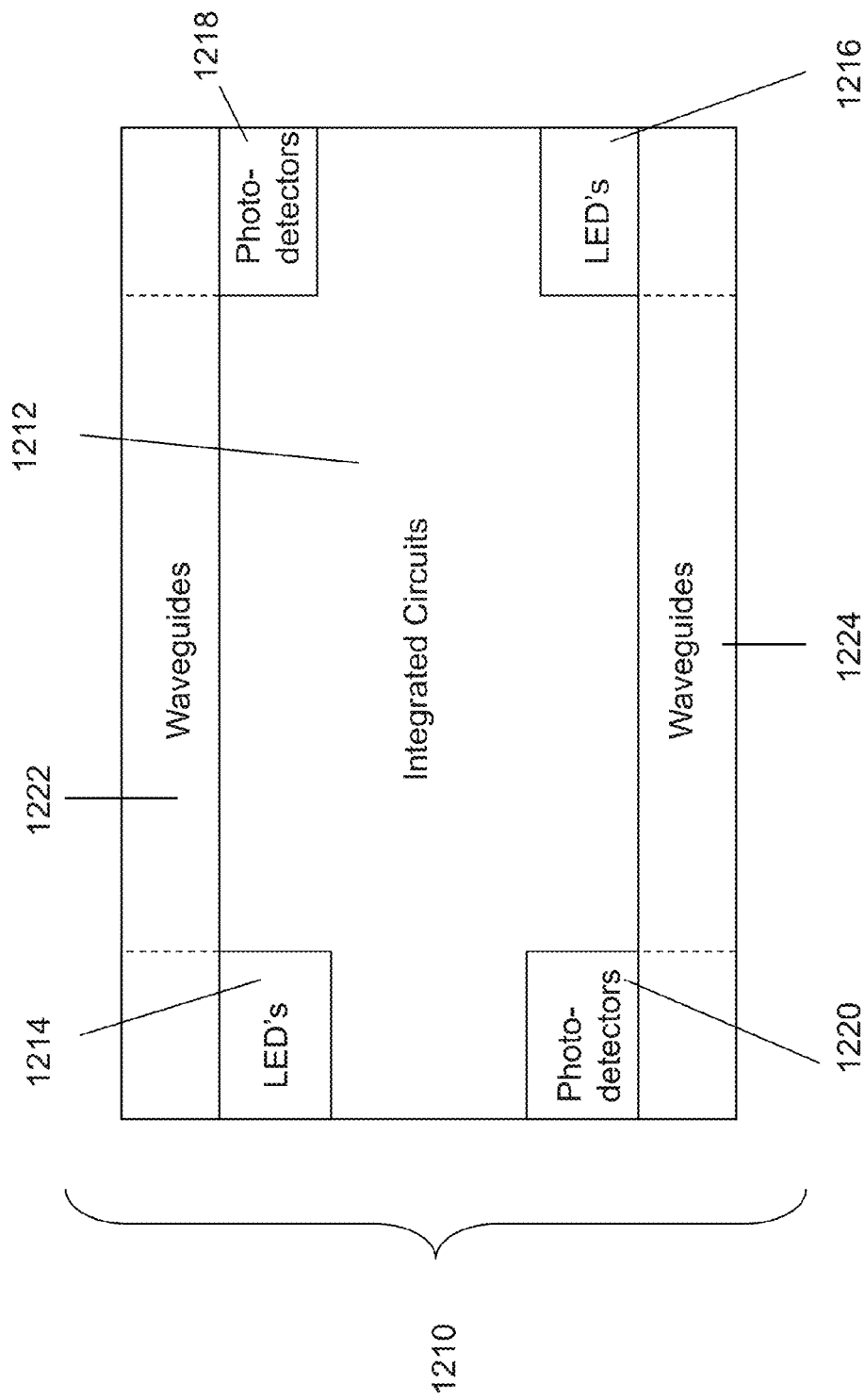
Figure 12C:
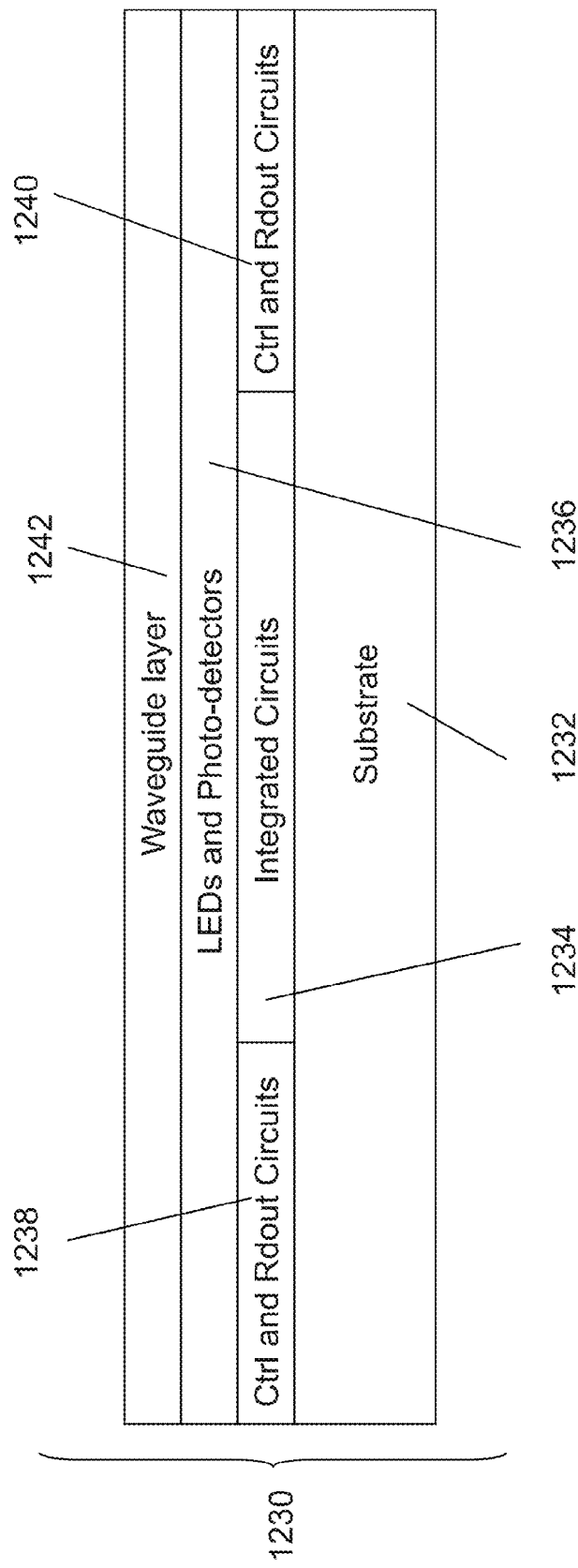

FIGS. 12A-12C illustrate an embodiment of this invention, where the LED-driven optical communication is among sections on a single chip.

FIG. 12A illustrates a cross-sectional view of a transmitter section 1250 and a receiver section 1260. The transmitter section 1250 may include LED control circuit layer 1252, LED layer 1254 and waveguide layer 1256 stacked monolithically with layer transfer. The receiver section 1260 may contain readout circuit layer 1262, photo-detector layer 1264 and waveguide layer 3166 stacked monolithically with layer transfer. Layer transfer procedures are similar to those described in FIG. 10A-H.

FIG. 12B illustrates an exemplary top view of integrated circuit chip 1210 which may include integrated circuits 1212, optical transmitters using LEDs 1214 and 1216, optical receivers using photo-detectors 1218 and 1220, and waveguide sections 1222 and 1224 enabling optical communication from one end of the chip to the other.

FIG. 12C illustrates a cross-sectional view (not to scale) of an integrated circuit chip 1230 with a substrate 1232, control and readout circuit sections 1238 and 1240, integrated circuit section 1234, LED and photo-detector layer 1236, and waveguide layer 1242. Persons of ordinary skill in the art will appreciate that each layer may use the same material throughout the layer for ease of processing, but may differ among different layers. As an example, the waveguide layer 1242 may use Silicon, the LED and photo-detector layer 1236 may use III-V semiconductor material, the layer with control and readout circuit sections 1238 and 1240 and integrated circuits section 1234 may use Silicon, and the substrate 1232 may use silicon.

FIG. 13 illustrates cross-sectional view of a waveguide structure 1370 with Hollow-metal waveguide (HMWG) 1372, beam-splitters 1374 and 1376 and light signal 1378. HMWG with reflective metal coating and beam-splitters are capable of guiding light through sharp turns by allowing sharp-angled reflections which may be a potential advantage compared to dielectric waveguides when waveguide layer thickness is in consideration.

On-Chip Laser-Driven Optical Interconnects

Figure 14B:
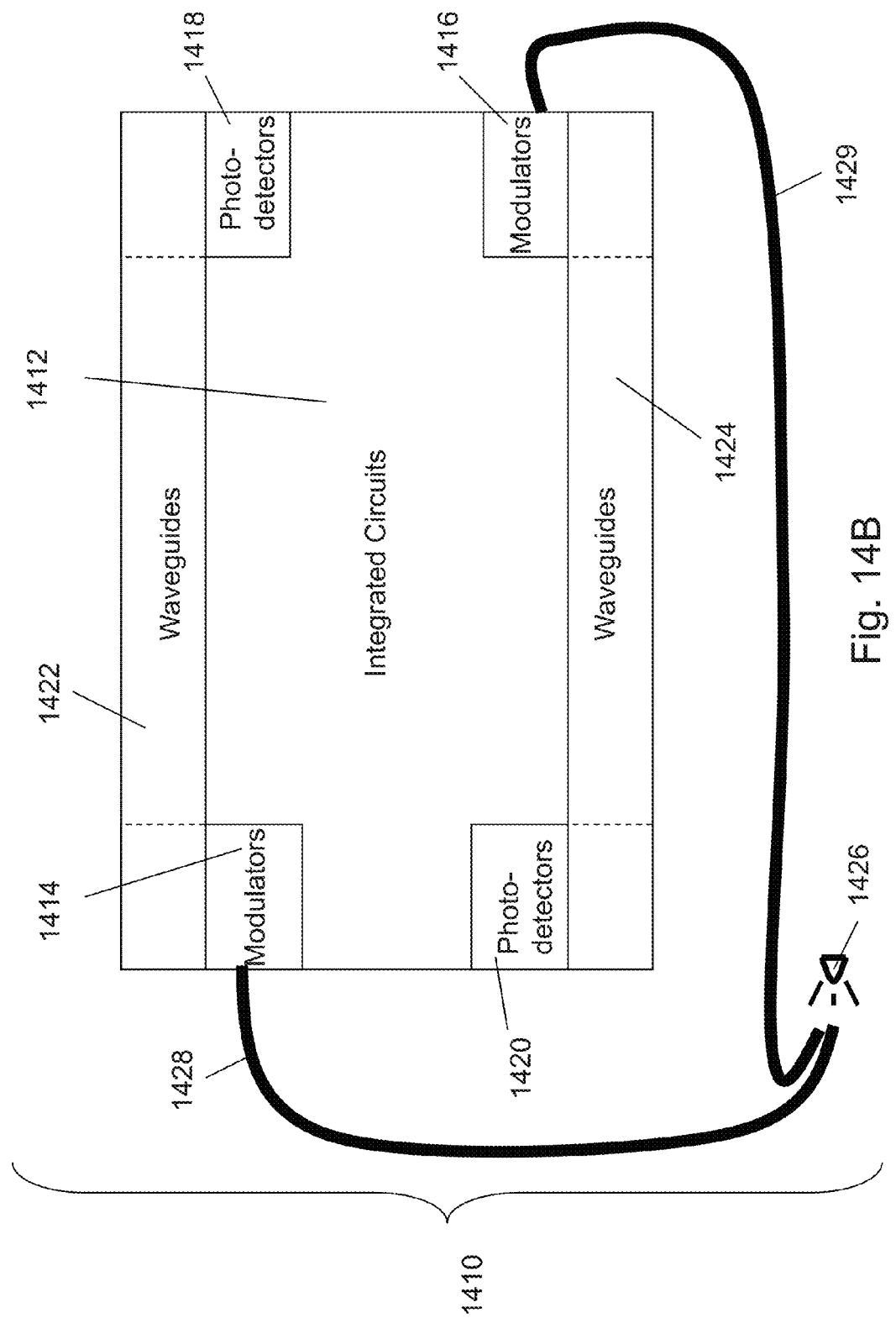
Figure 14C:
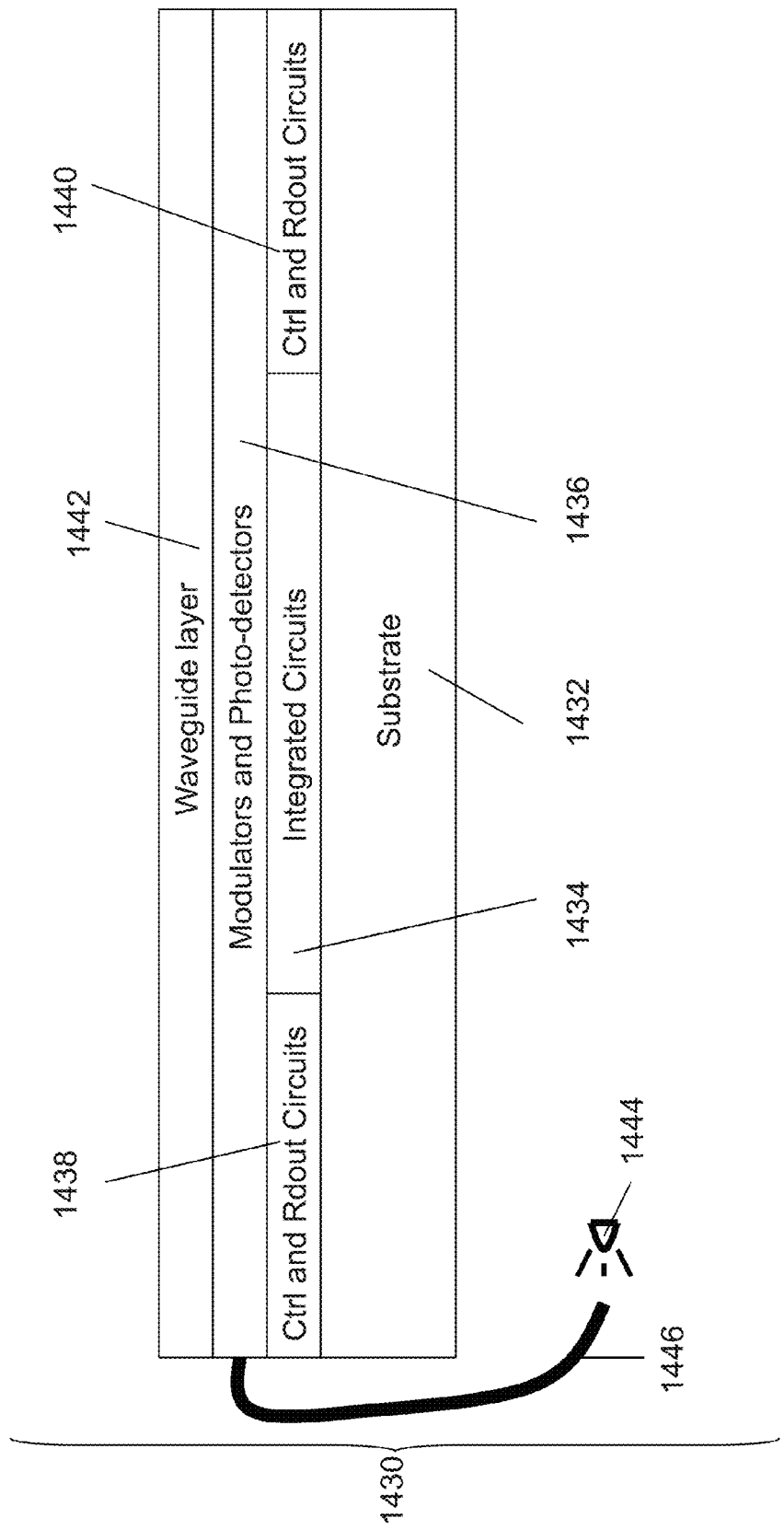

FIGS. 14A-14C illustrate an embodiment of this invention, where the laser-driven optical communication is among sections on a single chip.

FIG. 14A illustrates a cross-sectional view of a transmitter section 1450 and a receiver section 1460. The transmitter section 1450 may include modulator control circuit layer 1452, modulator layer 1454 and waveguide layer 1456 stacked monolithically with layer transfer, external laser 1458, fiber-optic coupling 1459 (connecting external laser 1459 to modulator layer 1454). The receiver section 1460 may contain a readout circuit layer 1462, photo-detector layer 1464 and waveguide layer 1466 stacked monolithically with layer transfer. Layer transfer procedures are similar to those described in FIG. 11A-D.

FIG. 14B illustrates an exemplary top view of integrated circuit chip 1410 which may include integrated circuits 1412, optical transmitters using external laser 1426, fiber-optic couplings 1428 and 1429, modulators 1414 and 1416, optical receivers using photo-detectors 1418 and 1420, and waveguide sections 1422 and 1424 enabling optical communication from one end of the chip to the other.

FIG. 14C illustrates a cross-sectional view (not to scale) of an integrated circuit chip 1430 with substrate 1432, control and readout circuit sections 1438 and 1440, integrated circuit section 1434, modulator and photo-detector layer 1436, waveguide layer 1442, external laser 1444 and fiber-optic coupling 1446. Persons of ordinary skill in the art will appreciate that each layer may use the same material throughout the layer for ease of processing, but may differ among different layers. As an example, the waveguide layer 1442 may use Silicon, the modulator and photo-detector layer 1436 may use III-V semiconductor material, the layer with control and readout circuit sections 1438 and 1440 and integrated circuits section 1434 may use Silicon, and the substrate 1432 may use silicon.

As described in FIG. 13, the waveguide layer may use HMWGs with reflective metal coating and beam-splitters capable of guiding light through sharp turns by allowing sharp-angled reflections which may be a potential advantage compared to dielectric waveguides when waveguide layer thickness is in consideration.

Persons of ordinary skill in the art will appreciate that while Silicon has been suggested as the material for the photo-detector layer of FIG. 10A, Germanium or Silicon-Germanium could be utilized. The advantage of Germanium is that it is sensitive to infra-red wavelengths as well. However, Germanium also suffers from high dark current. Moreover, the photo-detector layer 1010 is denoted as a p-n junction layer; however, any type of photo-detector layer, such as a p-i-n layer or some other type of photo-detector can be used. Furthermore, the thickness of the photo-detector layer may be typically less than approximately 5 µm, but may also be greater. Moreover, a double heterostructure configuration or single quantum well configuration could be used instead of a multiple quantum well configuration such as the shown multiple quantum well layer 1054. Further, various other material types and configurations, such as GaAs, AlInGaP, and GaInP, could be used for constructing the red LEDs for this process. Thus the invention is to be limited only by the appended claims.

Confocal 3D Microscopy with Screen Made of Stacked Arrays of Modulators:

Confocal Microscopy is a method by which 3D image information from a specimen is preserved. Typically, confocal microscopy is used in conjunction with the technique of inducing florescence from the specimen by shining laser light upon it. The laser light is absorbed by the specimen which then re-emits the light at a lower energy level (longer wavelength). This secondary light or florescence is then imaged by the confocal microscopy system.

Figure 15A:
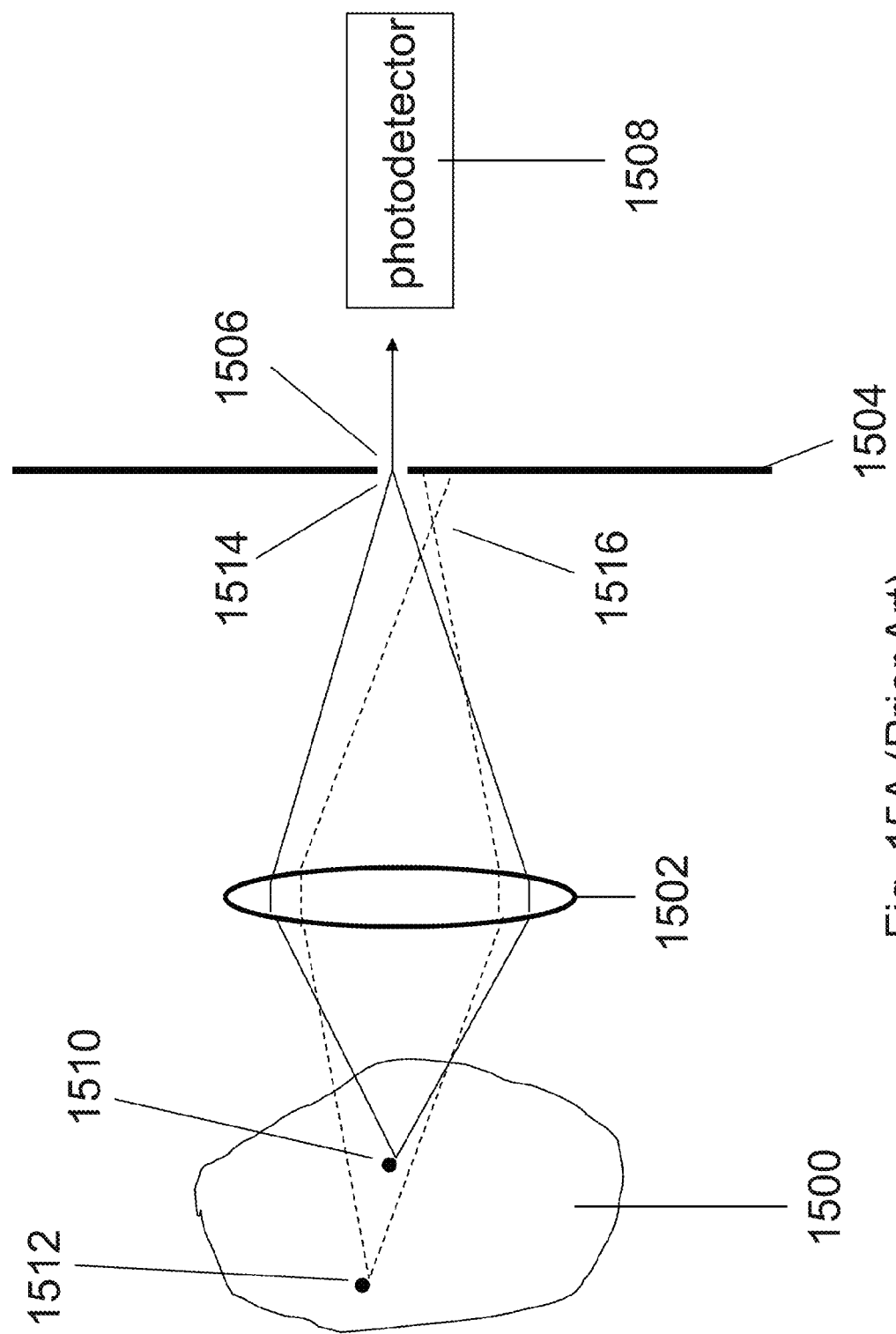

FIG. 15A illustrates a side cross-sectional view of a typical microscopy system; wherein the specimen 1500 has been stimulated by laser light (not shown). A lens or lens system 1502 is placed between the specimen and a screen 1504 that has an aperture 1506. Behind the screen, a photo-detector 1508 detects light that has come through the aperture 1506. A point on the specimen 1510 will produce a reciprocal image at the point 1514, which converges at the aperture 1506. The light originally from 1510 then passes through the aperture 1506 and subsequently detected by the photo-detector 1508. Another point on the specimen 1512 will produce a reciprocal image at the point 1516, which converges away from the aperture 1506. Thus, the screen 1504 blocks the light originally from 1512 and so is not sensed by the photo-detector.

By moving the screen and its aperture up, down, left, right, forward, and backward, light from specific points of the specimen are detected and so a 3D image of the specimen can then be reconstructed. Conversely, one may also move the specimen in the same manner instead of the screen to achieve the same objective of scanning the specimen. The issue with such a scanning scheme is that mechanical scanning is slow and requires more space to allow for the movements. An alternative is to replace the screen with a 3D array of optical modulators that control the passage of light, thus allowing much faster scanning through electronic control.

FIG. 15B illustrates confocal microscopy system implemented with a fixed 3D array of optical modulators 1520, where 1500, 1502, 1508, 1510, 1512, 1514, and 1516 are as previously described. The modulators are designed to block and pass the light at a particular wavelength range expected from the florescence of the specimen. By turning on certain arrays of modulators along a plane perpendicular to the lens, for example modulator 1524, which block the light, an effective screen is formed. By leaving the others off, for example modulator 1522, which let the light through, the position of the electronic screen with respect to the lens can be electronically controlled back and forth. The aperture 1526 is formed by leaving a single modulator on the modulator screen stack turned off to allow light through. The aperture 1526 can then be electronically controlled by the control circuits 1528 to scan through the area of the electronic screen by simple selective turning-off of a single modulator on the plane of the electronic screen. In such manner, a 3D image can be scanned and reconstructed from the images detected by the electronic scanning of the aperture. Layer transfer technology may be utilized for constructing the layers for a 3D optical modulator array system. A 3D optical modulator system may contain control circuits, and a stack of optical modulators.

FIGS. 15C-15G illustrate an embodiment of this invention, where the control circuit layer 1530, and optical modulator layers 1540 and 1560 are stacked monolithically with layer transfer processes. For purposes of illustration, two optical modulator layers are demonstrated here, but the invention is not limited to such, and may contain as many optical modulator layers as needed.

The process of forming the 3D optical modulator array may include several steps that occur in a sequence from Step A to Step E. Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A): FIG. 15C illustrates the step for making contacts and interconnects (not shown) for connecting terminals of the optical modulators, such as p contacts 1535 and 1537 and n contacts 1531 and 1533, to control circuits 1532 in the silicon wafer substrate. Thus control circuit layer 1530 is formed.

Figure 15D:
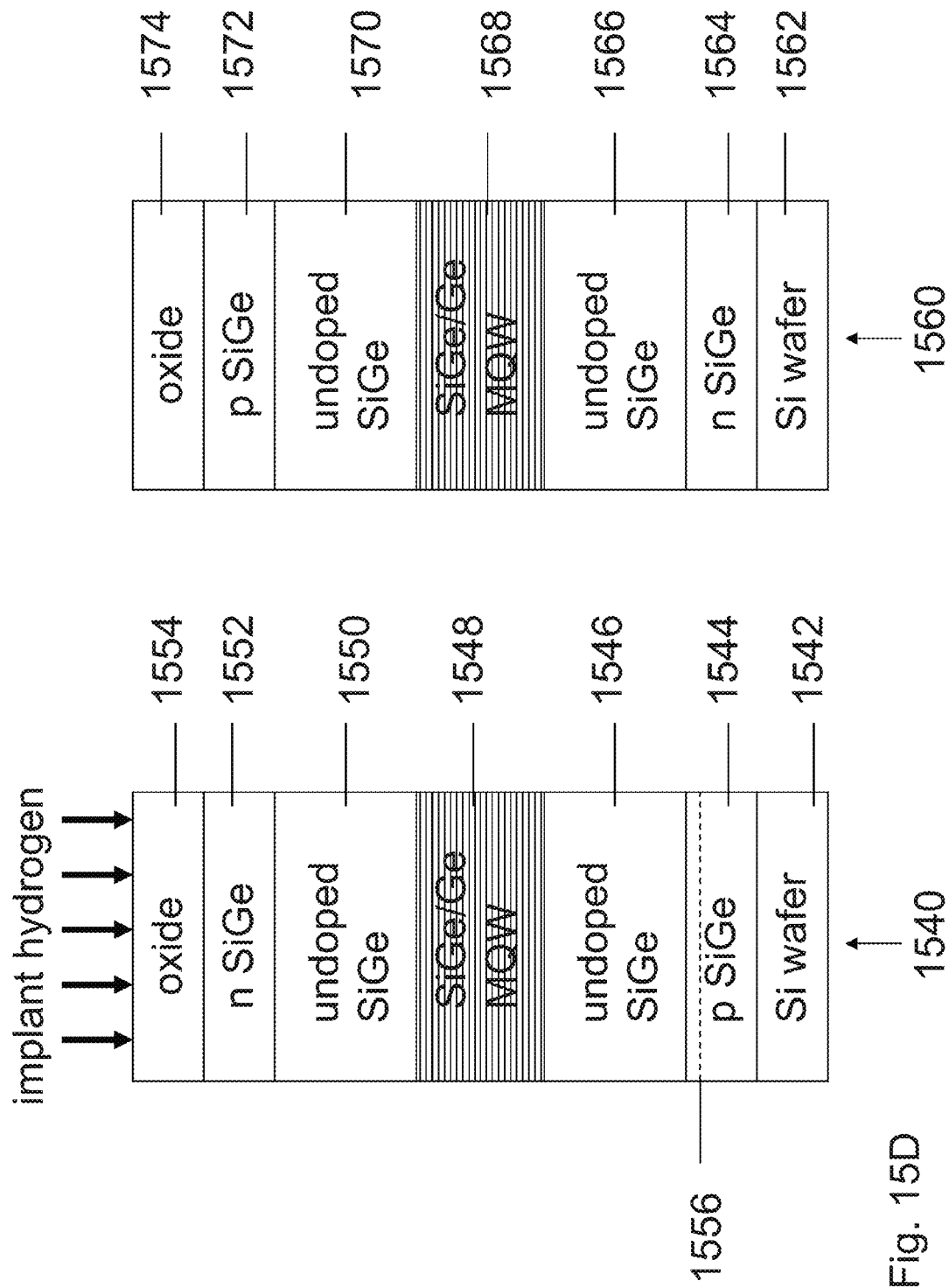

Step (B): FIG. 15D illustrates the cross-sectional views of silicon wafer 1542 and silicon wafer 1562 containing optical modulator 1540 and optical modulator 1560 respectively. The optical modulator 1540 may include silicon wafer 1542, a p-doped Silicon-Germanium (SiGe) layer 1544, an undoped SiGe layer 1546, a SiGe Multiple Quantum Well layer 1548, an undoped SiGe layer 1550, a n-doped SiGe layer 1552, and an oxide layer 1554. These layers may be formed using procedures similar to those described in FIG. 11C. An anneal may then be performed to activate dopants in various layers. Hydrogen may be implanted in the wafer at a certain depth depicted by dashed line 1556. The optical modulator 1560 may include silicon wafer 1562, a n-doped Silicon-Germanium (SiGe) layer 1564, an undoped SiGe layer 1566, a SiGe Multiple Quantum Well layer 1568, an undoped SiGe layer 1570, a p-doped SiGe layer 1572, and an oxide layer 1574. These layers may be formed using procedures similar to those described in FIG. 11C. An anneal may then be performed to activate dopants in various layers.

Figure 15E:
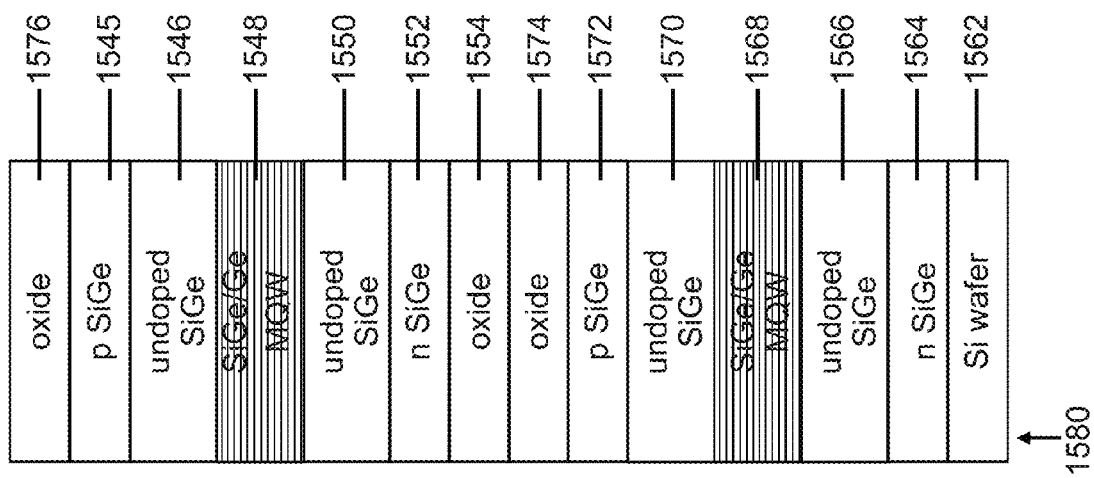

Step (C): FIG. 15E illustrates the two optical modulator layers formed by layer transfer. The optical modulator layer 1540 may be layer transferred atop the silicon wafer 1562 with optical modulator layer 1560 wherein oxide layer 1554 may be bonded to oxide layer 1574, and the p-SiGe layer 1545 may be a result of the cleave and polish operations. Procedures for layer transfer and alignment for forming the structure in FIG. 15E are similar to procedures used for constructing the optical modulator layer shown in FIG. 11C. An oxide layer 1576 may be deposited on top of the p-SiGe layer 1545.

Figure 15F:
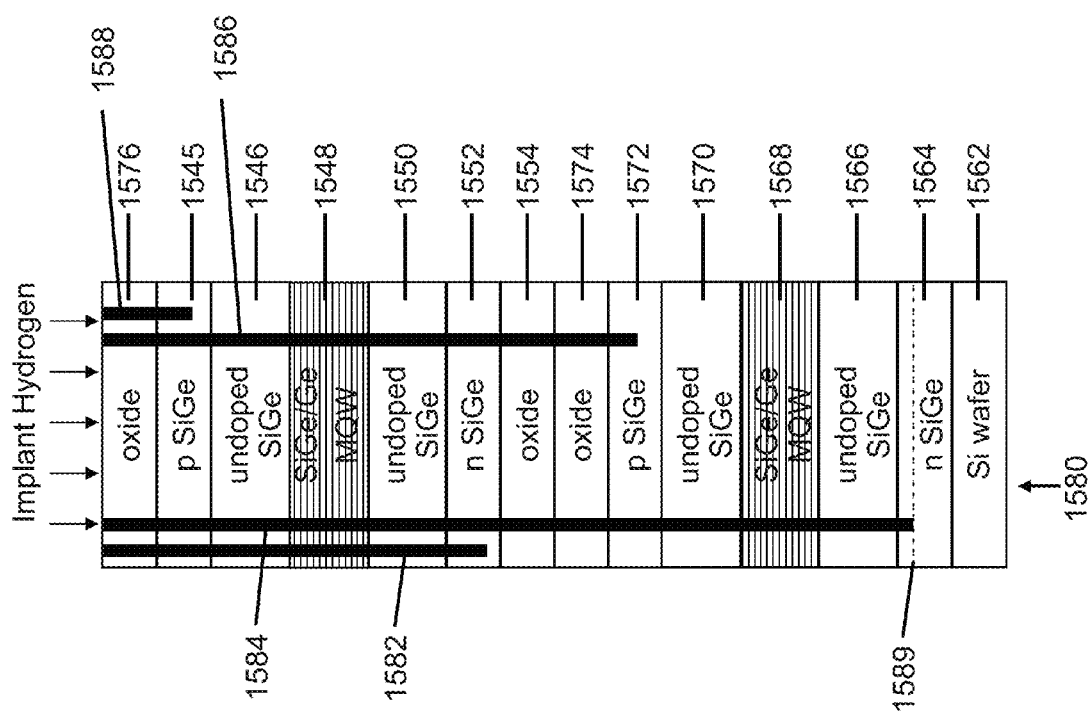

Step (D) is illustrated in FIG. 15F. Connections are made to the terminals of the optical modulators by lithographic, etch, and fill operations similar to those described in FIGS. 15A-G and are indicated as p contacts 1582 and 1584, and n contacts 1586 and 1588. Various elements of FIG. 15F such as 1545, 1546, 1548, 1550, 1552, 1554, 1562, 1564, 1566, 1568, 1570, 1572, 1574, and 1576 have been described previously.

As described previously, FIGS. 15A-G illustrate a process where oxide vias constructed before layer transfer may be used to look through one optical modulator layers to observe alignment marks on the other optical modulator wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme may be formed. This order of sequences may enable observation of alignment marks on the bottom control circuit wafer by looking through the optical modulator wafer.

Hydrogen may be implanted in the wafer at a certain depth depicted by dashed line 1589.

Figure 15G:
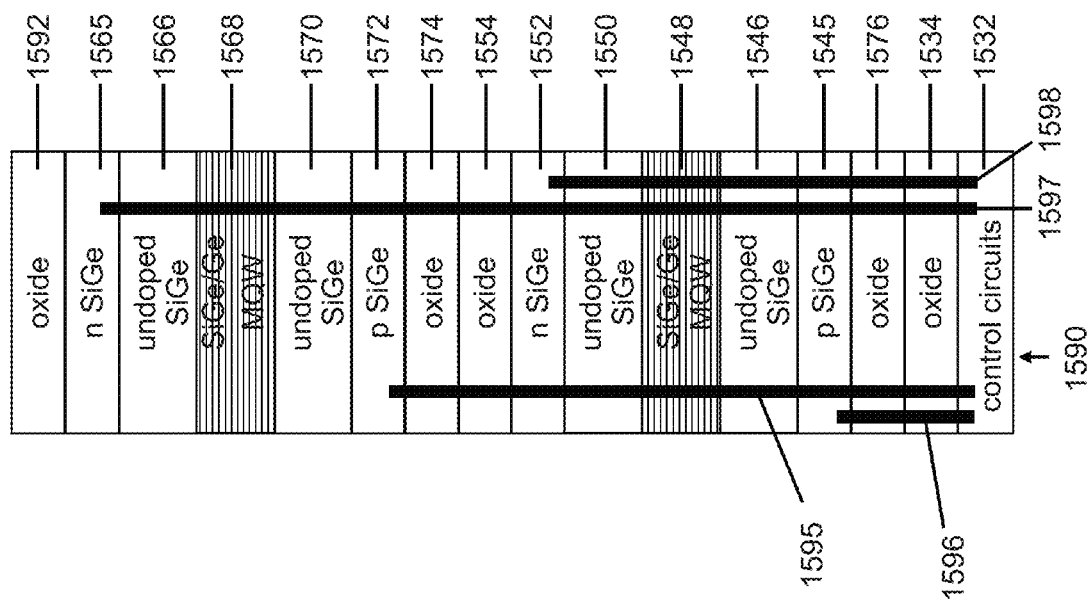

Steps (B)-(D) may be repeated as often as needed to stack as many optical modulator layers as necessary. Step (E) is illustrated in FIG. 15G. The two-layer optical modulator stack 1580 may be layer transferred atop the silicon wafer with control circuit layer 1530 to form the structure 1590, wherein oxide layer 1534 may be bonded to oxide layer 1576, and the n-SiGe layer 1565 may be a result of the cleave and polish operations. Procedures for layer transfer and alignment for forming the structure in FIG. 15G are similar to procedures used for constructing the optical modulator layer shown in FIG. 11C. An oxide layer 1592 may be deposited on top of the n-SiGe layer 1565. As previously in Step (C), alignments are made to the terminals of the optical modulators and control circuits to form the connections to the p contacts 1595 and 1596, and to the n contacts 1597 and 1598. The functionality of the optical modulators may be tested at this point.

Various elements of FIG. 15G such as 1532, 1534, 1545, 1546, 1548, 1550, 1552, 1554, 1565, 1566, 1568, 1570, 1572, 1574, and 1576 have been described previously.

Persons of ordinary skill in the art will appreciate that while Silicon and Germanium have been suggested as the material for the optical modulator layers of FIG. 15D, any other appropriate III-V semiconductor material like GaAs, InGaAsP could be utilized. Moreover, the optical modulator layer 1550 is denoted as a p-i-MQW-i-n layer; however, a single quantum well configuration could be used instead of a multiple quantum well configuration such as the shown multiple quantum well layers 1548 and 1568. Furthermore, the thickness of the optical modulator layer may be typically less than approximately 100 nm, but may also be greater. Thus the invention is to be limited only by the appended claims.

CCD Sensor with Parallel Readout Circuits

The main issue with CCD technology is the sequential shifting of image information from cell to cell is slow and limits the speed and cell density of CCD image sensors. A potential solution is to put the readout circuits directly under each CCD cell, so that the information is read in parallel rather than in time sequence, thus removing the shifting delay entirely.

Figure 16A:
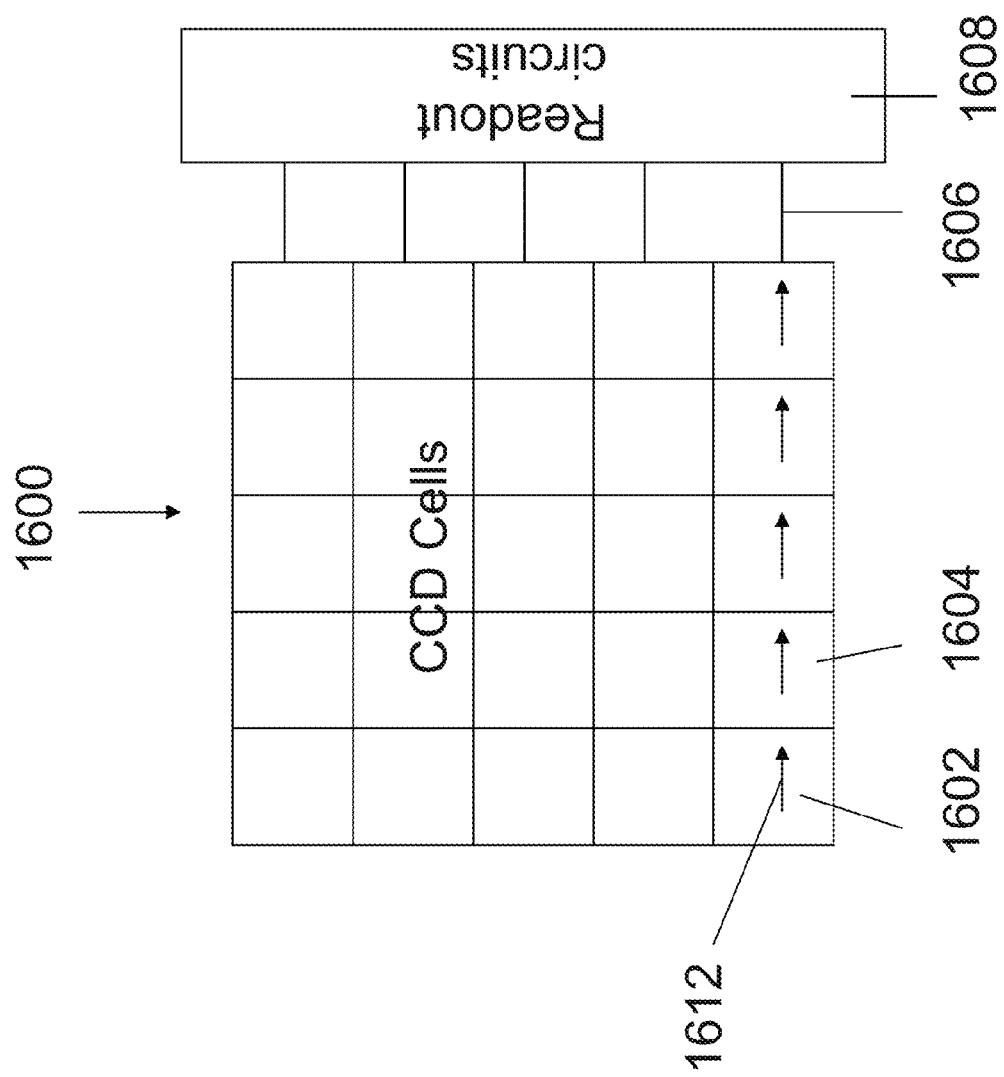
FIGS. 16A-16B illustrate the operational processes behind using an array of CCDs as an image sensor (prior art)

FIG. 16A illustrates a typical CCD system, where there is a CCD array 1600 exposed to light, readout circuits 1608, and connections to the readout circuits 1606. The movement 1612 of the charges from CCD cell 1602 to CCD cell 1604 and so on is shown for instance.

Figure 16B:
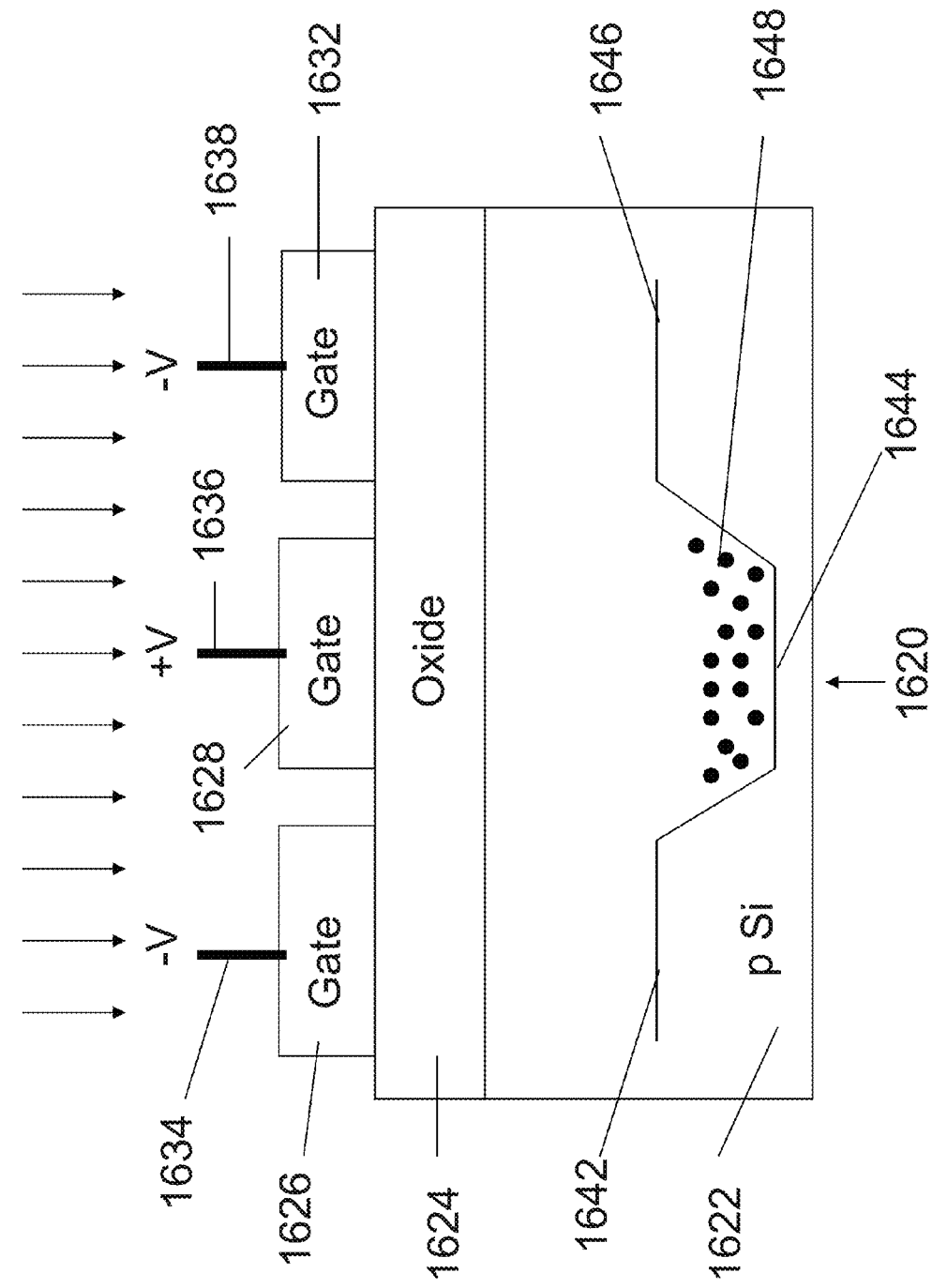

FIG. 16B illustrates a typical CCD structure 1620 shown here as a set of three adjacent MOS capacitor devices with corresponding gates 1626, 1628, and 1632. For this demonstration, electrons are chosen as the charges of operation, and so a p-type Si substrate 1622 is used. An incident light generates electron-hole pairs in the p-type Si substrate 1622. On top of the substrate is an oxide layer 1624, and above this are three separate gates 1626, 1628, 1632, with respective contacts 1634, 1636, 1638. In this demonstration, by applying negative voltage biases to contacts 1634 and 1638, electron potential barriers 1642 and 1646 are formed in the p-type Si substrate 1622 underneath gates 1626 and 1632. By applying positive voltage bias to contact 1636, an electron potential well 1644 is formed in the p-type Si substrate 1622 underneath gate 1628. Electrons 1648 can then be collected underneath gate 1628 under these bias conditions. By a time sequence of positive and negative voltage biases on gates 1626, 1628, and 1638, the existence or non-existence of charges under specific gates can be transmitted to adjacent gates by the method known as charge shifting.

Instead of shifting charges one-by-one, the data can be read in parallel by a readout circuit constructed underneath the CCD sensor. Layer transfer technology may be utilized for constructing the layers for a stacked CCD with underlying readout circuits.

FIGS. 16C-16F illustrate an embodiment of this invention, where the readout circuit layer 1650, and CCD layer 1660 are stacked monolithically with layer transfer.

The process of forming the CCD-control circuit stack may include several steps that occur in a sequence from Step A to Step D. Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 16D:
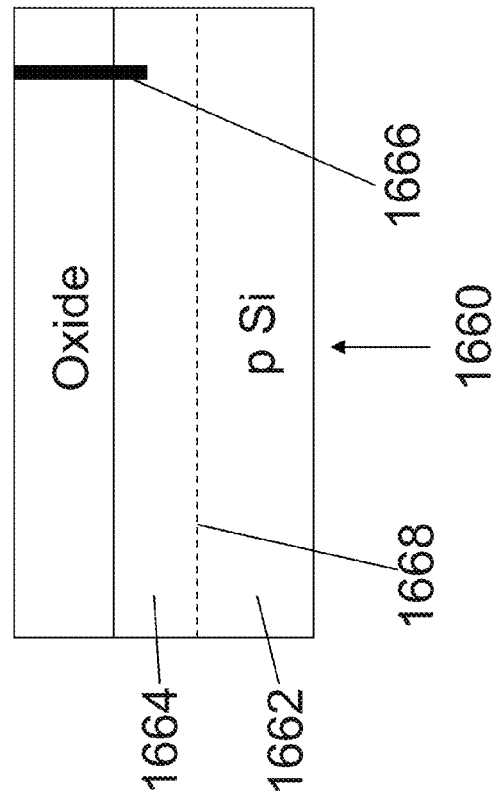
Figure 16C:
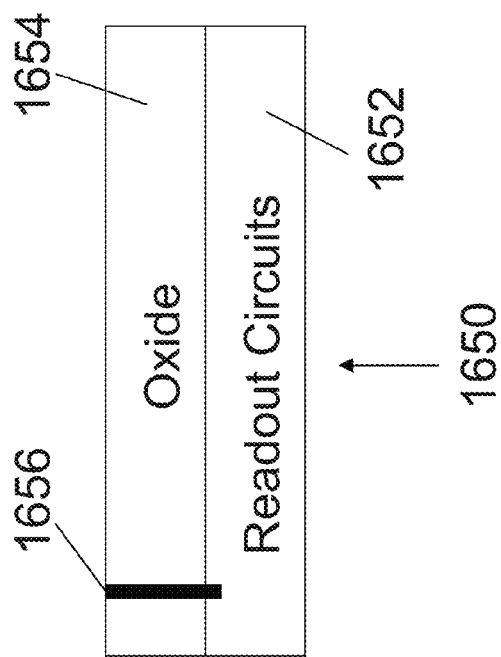

Step (A): FIG. 16C illustrates the step for making contacts, such as contact 1656, and interconnects (not shown) for connecting the p-type substrate 1662 of the CCD cell to the readout circuits 1652 in the silicon wafer substrate. Thus readout circuit layer 1650 is formed.

Step (B): FIG. 16D illustrates the cross-sectional view of a Silicon wafer with p-type substrate 1662 and oxide layer 1664. An implant and anneal process for CCD cell optimization may then be performed to deposit and activate dopants at various sites of the p-type Si substrate 1662. Hydrogen may be implanted in the wafer at a certain depth depicted by dashed line 1668.

A connections is made to the p-type Si substrate 1662 by lithographic, etch, and fill operations similar to those described in FIGS. 3A-G and is indicated here as 1666.

Step (C) is illustrated in FIG. 16E. The Si wafer 1660 may be layer transferred atop the silicon wafer with readout circuit layer 1650 to form the structure 1670, wherein oxide layer 1654 may be bonded to oxide layer 1664, and the p-Si layer 1663 may be a result of the cleave and polish operations. Alignments are made to the terminals of the p-Si layer 1663 and readout circuit layer 1652 to form the connection 1672 between the two layers.

As described previously, FIGS. 3A-G illustrate a process where oxide vias constructed before layer transfer may be used to look through one optical modulator layers to observe alignment marks on the other optical modulator wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme may be formed. This order of sequences may enable observation of alignment marks on the bottom control circuit wafer by looking through the optical modulator wafer.

Various elements of FIG. 16E such as 1652, 1654, and 1664 have been described previously.

Step (D) is illustrated in FIG. 16F, where an oxide layer 1682 is grown on top of the previous stack 1670 to act as a gate dielectric, and gate metal layer 1684 is deposited by using a lithographic mask on the oxide layer 1682 to form the MOS gates of the CCD cells. Thus stacked CCD with underlying readout circuits 1680 may be formed. Various elements of FIG. 16F such as 1652, 1654, 1663, 1664, and 1672 have been described previously.

Persons of ordinary skill in the art will appreciate that while Silicon has been suggested as the material for the CCD substrate layers of FIG. 16D, any other appropriate semiconductor material like Ge, InGaAsP could be utilized. The doping of such material may also vary from p-type to n-type depending on whether the charges to be collected are electrons or holes respectively. Moreover, additional implants and structural modifications may be performed to optimize the charge collection within the substrate. Thus the invention is to be limited only by the appended claims.

Stacked High Dynamic Range (HDR) Sensor:

In digital cameras, the typical approach is to capture images using exposure bracketing, and then combining them into a single HDR image. The issue with this is that multiple exposures are performed over some period of time, and if there is movement of the camera or target during the time of the exposures, the final HDR image will reflect this by loss of sharpness. Moreover, multiple images may lead to large data in storage devices. Other methods may use software algorithms to extract HDR information from a single exposure, but as they can only process information that is recordable by the sensor, there is a permanent loss of some details.

A solution may be to use image sensors that have HDR capability. A single layer of photo-detectors within the image sensor is hard-pressed to achieve this. In the case where the light-collecting area is small, the photo-detector is capable of detecting minute amounts of photocurrent but may saturate quicker, whereas when the light-collecting area is large, the photo-detector is capable of handling large amounts of light, but may not be able to detect small photocurrents. Combining them by stacking allows a photo-detector cell to have the capability to detect both low and high luminosity without saturating.

FIG. 17A illustrates the of stacking smaller photo-detector 1702 which collects less light and is more sensitive than larger photo-detector 1704, on top of the larger photo-detector 1704 which collects more light and is less prone to saturation than the smaller photo-detector 1702.

Figure 17B:
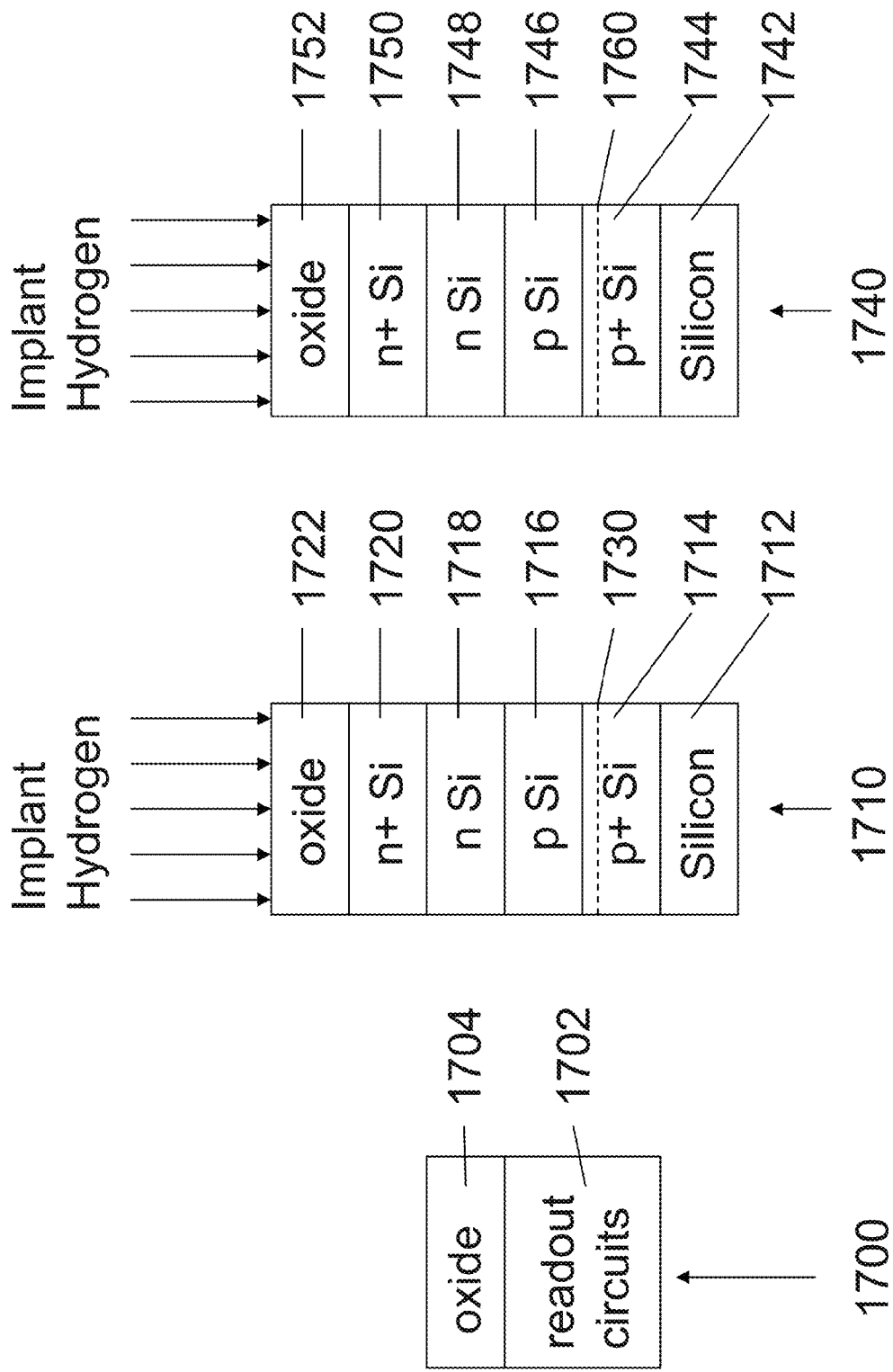
Figure 17D:
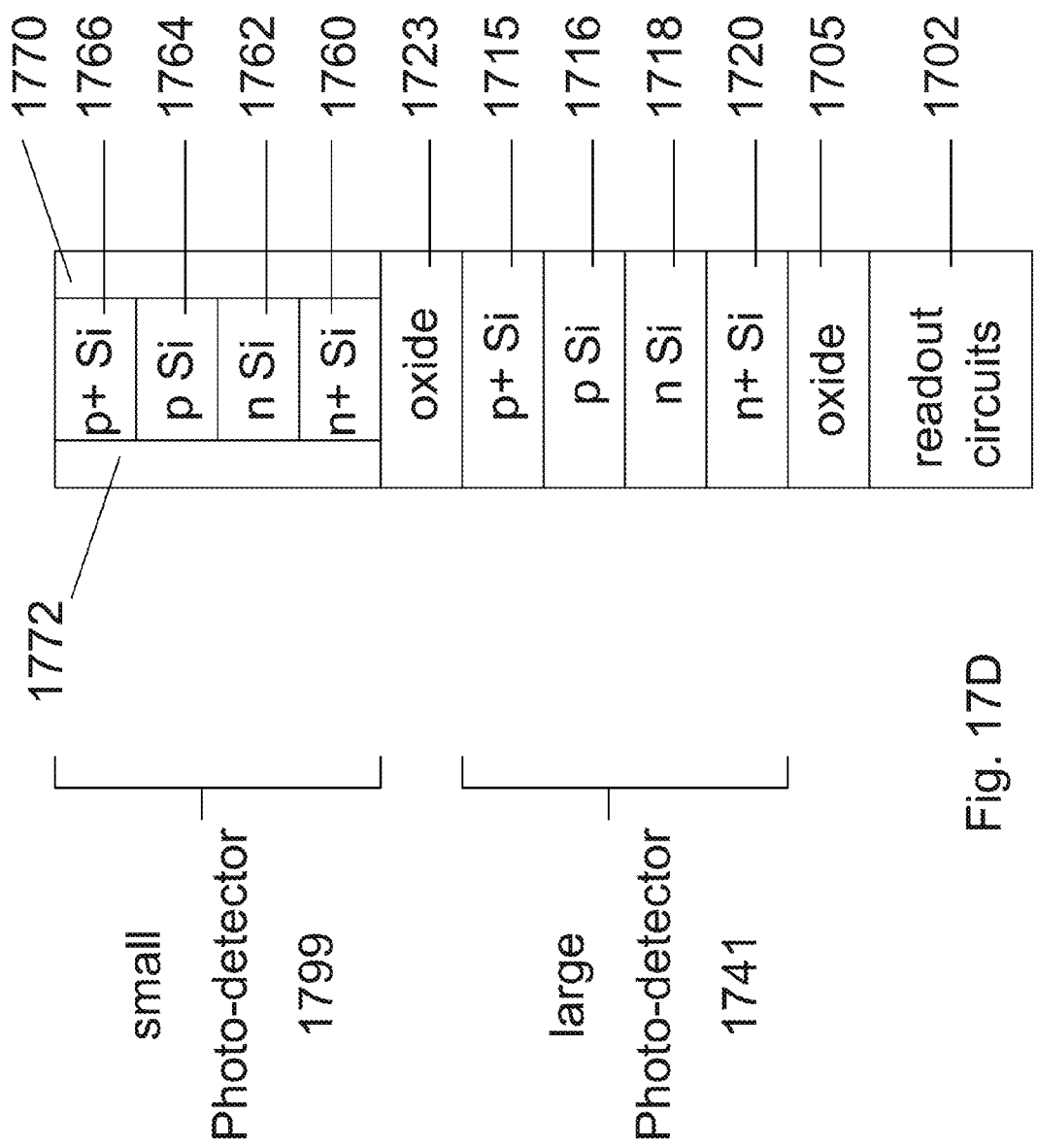

FIGS. 17B-D illustrate an embodiment of the invention, where layer transfer technology may be utilized for constructing the layers for an HDR image sensor with underlying readout circuits. The process of forming the HDR image sensor may include several steps that may occur in a sequence from Step A to Step C.

Step (A): FIG. 17B illustrates the first step for constructing this image sensor. Read out silicon wafer 1700 may include read-out circuits 1702 constructed on it, above which an oxide layer 1704 may be deposited. Silicon wafer structure 1710 may include substrate 1712, p+ Silicon layer 1714, p Silicon layer 1716, n Silicon layer 1718, n+ Silicon layer 1720 and oxide layer 1722. These layers may be formed using procedures similar to those described in FIGS. 3A-G. An anneal may then performed to activate dopants in the layers. Hydrogen may be implanted in the wafer at a certain depth depicted by dashed line 1730. Another Silicon wafer structure 1740 may include substrate 1742, p+ Silicon layer 1744, a p Silicon layer 1746, n Silicon layer 1748, n+ Silicon layer 1750 and oxide layer 1752. These layers may be formed using procedures similar to those described in FIGS. 3A-G. An anneal may then be performed to activate dopants in various layers. Hydrogen may be implanted in the wafer at a certain depth depicted by dashed line 1760.

Step (B): FIG. 17C illustrates the structure of this embodiment of the invention before contacts and metallization are constructed. The p+pnn+ Silicon layers of Silicon wafer structure 1710 of FIG. 17B may be layer transferred atop the read-out circuit layer of read out silicon wafer 1700. This may be done using ion-cut layer transfer procedures similar to those described in respect to FIG. 3A-G. Following this, the p+pnn+ silicon layers of another Silicon wafer structure 1740 may be layer transferred atop the Read out silicon wafer 1700 and he p+pnn+ Silicon layers of Silicon wafer structure 1710. This may be done using procedures similar to those described in FIGS. 3A-G. The structure shown in FIG. 17C therefore has a layer of read-out circuits 1702, above which a top photo-detector 1711, and another photo-detector 1741 are present. Procedures for layer transfer and alignment for forming the image sensor in FIG. 17C are similar to procedures used for constructing the image sensor shown in FIG. 3A-G. Oxide layers 1705 and 1723 may be the results of oxide-to-oxide bonding. p+ Si layers 1715 and 1745 may be results of the cleave and polish operations from the ion-cut layer transfer processes. Various elements of FIG. 17C such as 1702, 1716, 1718, 1720, 1746, 1748, and 1750 have been described previously.

Step (C): FIG. 17D illustrates the process performed on the top photo-detector 1711 to reduce its effective image sensor cell area. The edges of top photo-detector 1711 may be lithographically defined, etched, then filled with oxide, which is transparent to visible light. n+ Si layer 1760, n Si layer 1762, p Si layer 1764, p+ Si layer 1766, and oxide layers 1770 and 1772 may be results of this processing, thus forming small photo-detector 1799. Various elements of FIG. 17D such as 1702, 1705, 1715, 1716, 1718, 1720, and 1723 have been described previously. Contacts, metallization, packaging and other steps (not shown) as described elsewhere herein may done to the structure shown in FIG. 17D to form the HDR image sensor. The three monocrystalline silicon layers, small photo-detector 1799, large photo-detector 1799, and read-out circuits 1702, may be electrically connected by conducting vias that may have a radius less than about 400 nm due to the thin layers being layer transferred. This may be accomplished with processing described herein and in US patent application 2011/0121366.

Persons of ordinary skill in the art will appreciate that while Silicon has been suggested as the material for the HDR photo-detector layers of FIG. 17D, any other appropriate semiconductor material like Ge, could be utilized. Moreover, additional implants and structural modifications may be performed to optimize the charge collection within the photo-detectors. Thus the invention is to be limited only by the appended claims.

3-D Micro-Display

Figure 18A:
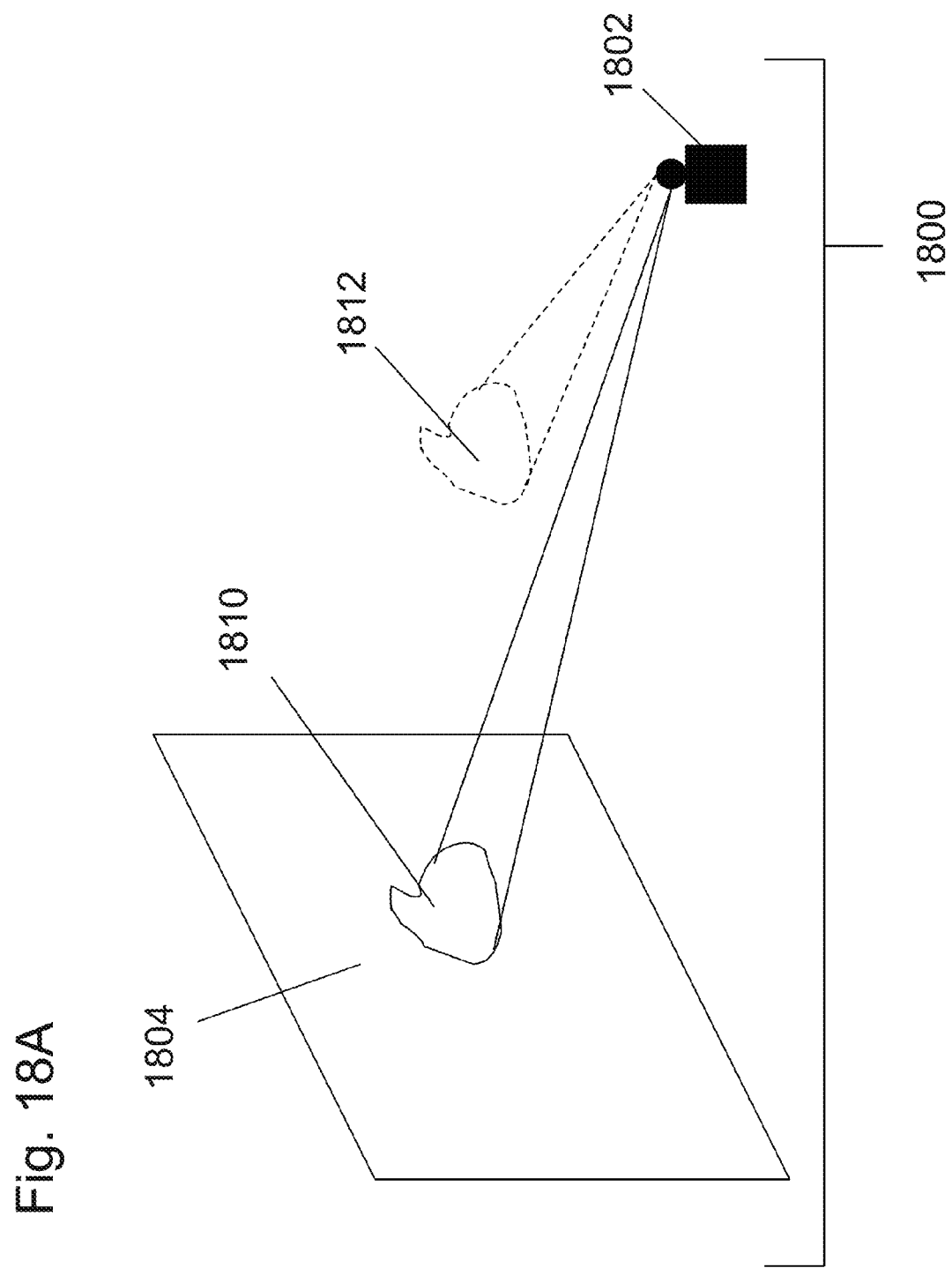

The three-dimensional (3D) display of images has been demonstrated by the use of holography to the use of 3D glasses that use either color or polarization. The main technique in common with these methods is to induce stereoscopic vision by making each eye see a slightly offset image on the screen. Though effective in fooling the human brain into seeing images in 3D, the problem with these techniques is that even though the desired effect can be achieved, the brain eventually is strained, resulting in headaches for several individuals. FIG. 18A illustrates the source of the straining of the brain. A system 1800 may be set up such that the viewer 1802 is observing an object 1810 projected on a display 1804. The source of the strain is from the fact that the actual image of the object 1810 is still a fixed distance on the screen, while the image of the object perceived in the brain 1812 can be within a few inches of the viewer 1802 or several miles away in perceived distance. As such, the eyes are focused on a screen several feet away while the brain perceives an image at a different location, and this separation of reality and image leads to brain and/or eye strain.

In micro-displays, where the actual images are small but through the use of lenses are magnified to possibly life-size as interpreted by the brain, this problem of eye/brain separation may also exist. The distances, however, are compressed by the magnification ratio of the lenses and thus the result is not as severe and is easier to rectify. A possible solution is to move the display physically so as to show images according to their apparent distance from the viewer. If the objects at their respective distances are shown in succession faster than the brain can perceive movement, then the brain will see all objects at various apparent distances all at once, hence creating a total image containing all the object distance information, and will appear as an actual 3D image. As the brain perceives distance in greater detail when close than farther away, the physical steps of the plane of the display may be arranged in nonlinear fashion, with more steps related to distances closer to the viewer and less steps related to distances further away, that is, of increasing intervals as the distance grows larger with for example, a geometric relationship. Assuming enough 3D details of the objects in the image are available, an external joystick may also be used to control the vantage point of the image or object/s to allow for virtual stage rotation.

Figure 18B:
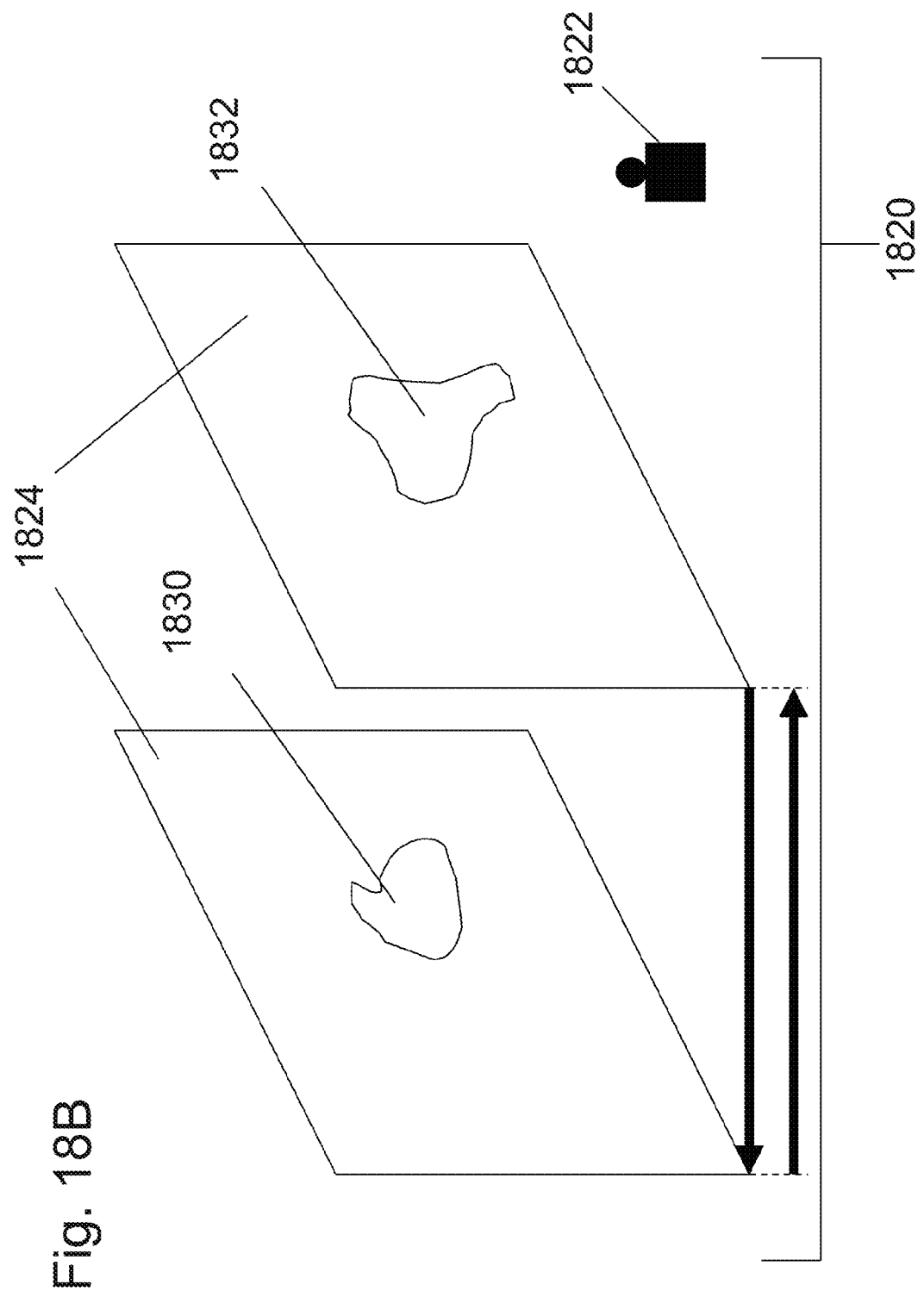

FIG. 18B illustrates an embodiment of the invention, where a display system 1820 may be set-up such that viewer 1822 observes an image which may consist of far object 1830 and near object 1832 projected onto the display 1824. The display 1824 is enabled to physically move back and forth with respect to the viewer 1822 such that it may start from the far end displaying only the far object 1830 and move forward to the near end (nearer to viewer 1822) displaying only the near object 1832. Any objects that may be of intermediate distance from the viewer may then be displayed on the display 1824 during the sweep at their respective distances, but only one-at-a-time if the distances are distinct. In order to make the objects appear as one 3D image perceived by the brain, this forward and backward sweep of the display 1824 may be performed at a rate faster than about 24 cycles per second. If the image is intended to show progression as in a movie, then the forward and backward sweep of the display 1824 may be performed at a rate faster than the frame rate of the movie multiplied by 24 cycles per second. An actuator with a fast motor which may be used to achieve such actuation speed may include, for example, a piezo-electric motor (not shown).

Figure 18C:
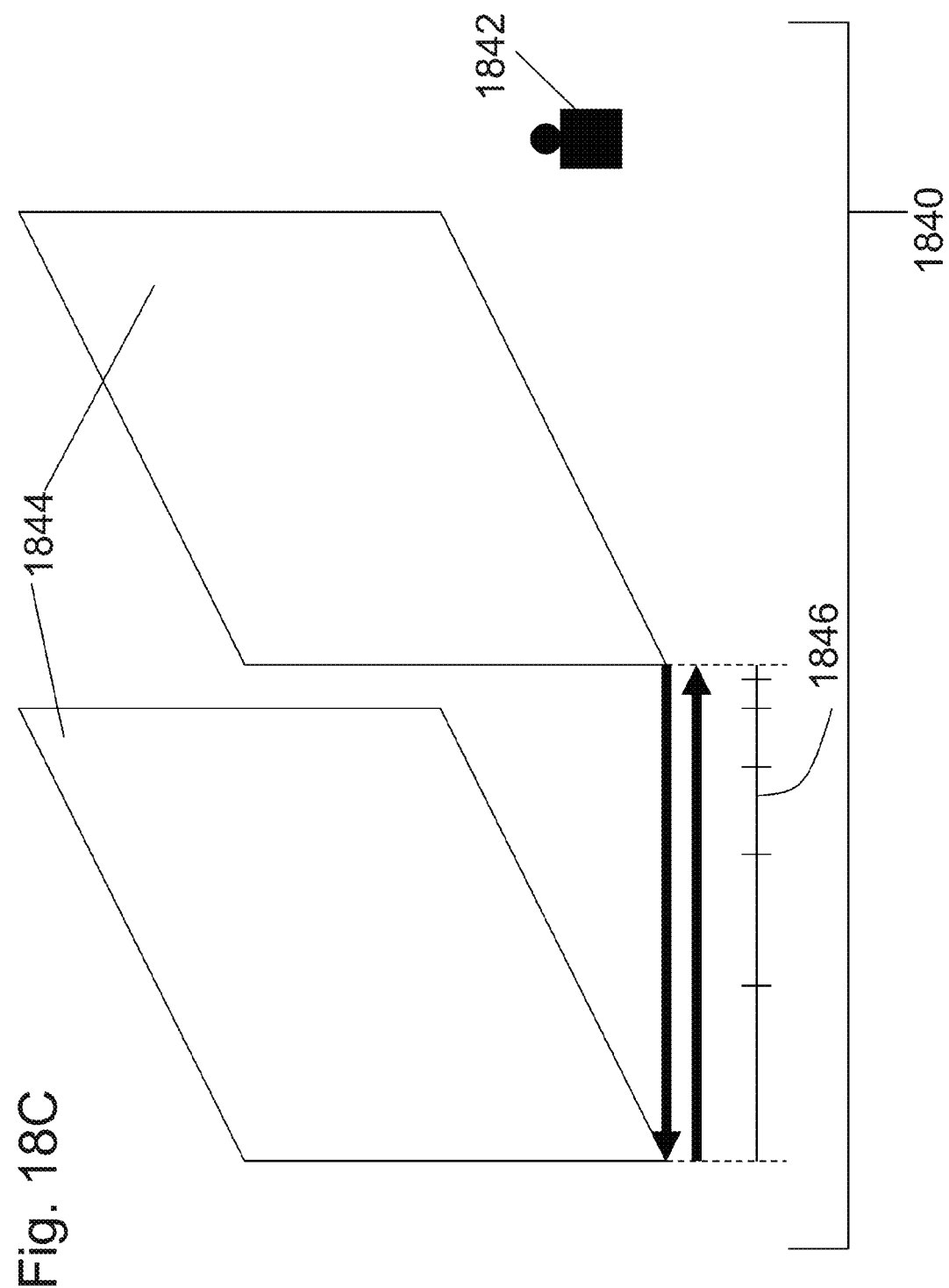

FIG. 18C illustrates another embodiment of the invention, where a display system 1840 may be setup similar to display system 1820 in FIG. 18B with viewer 1842 observing an image projected onto the moving display 1844. The moving display 1844 may sweep forward and backward with respect to viewer 1842 similar to display system 1820 but the sweep steps 1846 may not be of constant value but may be of nonlinear magnitudes of the distance of the image objects. This takes advantage of the fact that the brain, by result of angular perception, recognizes differences in distances in greater detail when objects are closer and lesser detail when objects are further, so thus the display step resolution for closer objects is necessarily dense but may be progressively relaxed at greater object distances, such as shown by exemplary sweep steps 1846.

FIG. 18D illustrates another embodiment of the invention, where a display system 1860 may be setup similar to display system 1820 in FIG. 18B with viewer 1862 observing an image object 1870 projected onto the moving display 1864. Computer 1868 may contain 3D data of image object 1870 available for display and may be connected via link 1872 to the display 1864. Computer 1868 may also be connected via link 1874 to joystick 1866, which allows viewer 1862 to control the orientation of the image object 1870 according to available 3D data stored in computer 1868.

Persons of ordinary skill in the art will appreciate that while image "objects" has been referred to as display targets, these may equivalently be replaced by the term image "pixels". Moreover, the nonlinear steps of the display forward-backward sweep described in FIG. 18C may be of any resolution and may involve any type of nonlinear relationships with viewer distance as desired. Many other modifications within the scope of the illustrated embodiments of the invention will suggest themselves to such skilled persons after reading this specification. Thus the invention is to be limited only by the appended claims.

Figure 19A:
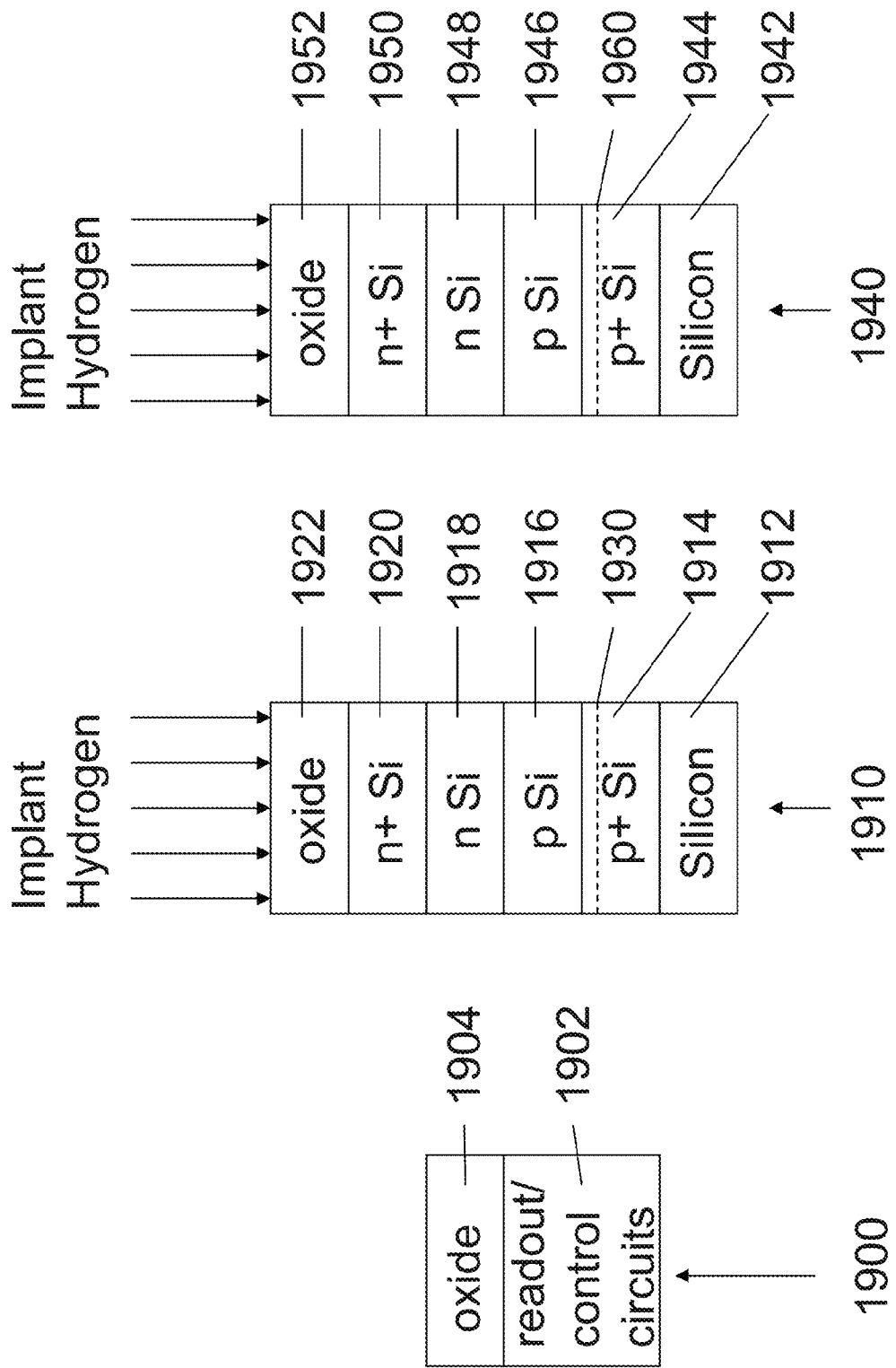
Figure 19B:
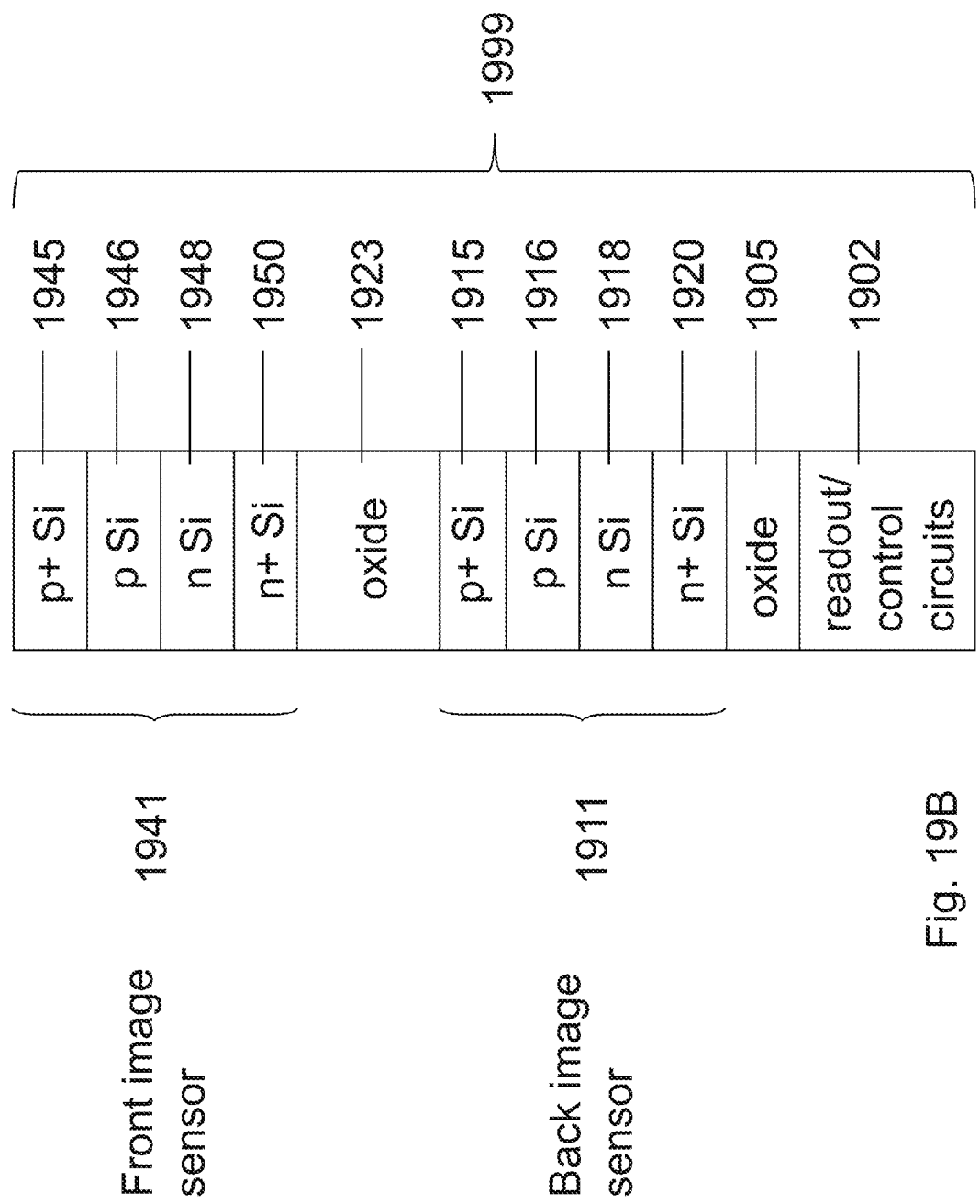

2-Sensor Camera System:

FIGS. 19A-B illustrate an embodiment of the invention, where layer transfer technology may be utilized for constructing the layers for an image sensor chip that may include two image sensor arrays in parallel planes to each other with an isolation layer between each of the two image sensor arrays, and between the two image sensor arrays and the underlying readout/control circuits. The process of forming the two-image sensor chip may include several steps that may occur in a sequence from Step A to Step B.

Step (A): FIG. 19A illustrates the first step for constructing the image sensor chip. Read-out circuit layer structure 1900 may include a mono-crystalline silicon wafer with readout/control circuits 1902 constructed on it, above which an oxide layer 1904 may be deposited. Structure 1910 may include another mono-crystalline silicon wafer with substrate 1912, p+ Silicon layer 1914, p Silicon layer 1916, n Silicon layer 1918, n+ Silicon layer 1920 and oxide layer 1922. These layers may be formed using procedures similar to those described in FIGS. 3A-G. An anneal may be performed to activate dopants. Hydrogen may be implanted into p+ Silicon layer 1914 at a certain depth depicted by dashed line 1930. Layer structure 1940 may include another mono-crystalline silicon wafer with substrate 1942, p+ Silicon layer 1944, a p Silicon layer 1946, n Silicon layer 1948, n+ Silicon layer 1950 and oxide layer 1952. These layers may be formed using procedures similar to those described in FIGS. 3A-G. An anneal may be performed to activate dopants. Hydrogen may be implanted in p+ Silicon layer 1944 at a certain depth depicted by dashed line 1960.

Step (B): FIG. 19B illustrates the structure of the embodiment of the invention before contacts and metallization are constructed. The p+pnn+ Silicon layers of structure 1910 of FIG. 19B may be layer transferred atop the read-out circuit layer structure 1900. This may be done using smart layer transfer procedures similar to those described in respect to FIG. 3A-G. Following this, the p+pnn+ silicon layers of layer structure 1940 may be layer transferred atop the read-out circuit layer structure 1900 layer and the p+pnn+ Silicon layers of structure 1910. This may be done using procedures similar to those described in FIGS. 3A-G. The structure shown in FIG. 19B therefore has a layer of read-out circuits 1902, above which a photo-detector back image sensor 1911, and another photo-detector front image sensor 1941 may be present. Procedures for layer transfer and alignment for forming the image sensor in FIG. 19B are similar to procedures used for constructing the image sensor shown in FIG. 3A-G. Oxide layers 1905 and 1923 may be the results of oxide-to-oxide bonding and the ion-cut processing. In addition, oxide layer 1923 may form the isolation layer separating back image sensor 1911 and front image sensor 1941 and may require careful calibration of its thickness, which may range from about 10 micro-meters to about 190 micro-meters. The material for the isolation layer may be chosen such that it has a large enough bandgap that will let substantially all wavelengths of visible light through to the back image sensor 1911. p+ Si layers 1915 and 1945 may be results of the cleave and polish operations from the layer transfer processes. Various elements of FIG. 19C such as 1902, 1916, 1918, 1920, 1946, 1948, and 1950 have been described previously. Thus image sensor chip 1999 is formed. Back image sensor 1911 and front image sensor 1941 may each have thicknesses of less than about 2 microns, less than about 1 micron, less than about 190 nm and/or less than about 200 nm. Front image sensor 1941 may typically be thinner than back image sensor 1911. Base wafer substrate 1912 and substrate 1942 may be reused to create portions of another or additional image sensor chip.

FIG. 19C illustrates a method by which pixel alignment between the two sensor arrays may be checked. A laser device 1974 projects a laser beam 1976 with a diameter smaller than the size of the pixel elements of front image sensor 1970 and back image sensor 1972. The laser beam 1976 may be of a wavelength that is detectable by that of the front image sensor 1970 and back image sensor 1972, and may be in a direction perpendicular to the two sensors. A particular photo-detector 1978 on front image sensor 1970 detects the laser beam 1976. As only part of the laser beam 1976 may be absorbed, the remainder will continue onto photo-detector 1980 on back image sensor 1972 which detects the attenuated laser beam 1976. If the location of photo-detector 1978 on front image sensor 1970 corresponds to the location of photo-detector 1980 on back image sensor 1972, they are determined to be in alignment. Otherwise, adjustments on one of the image sensors may be performed to achieve alignment. The process may be repeated for a sampling of more photo-detector sites throughout the image sensors 1970 and 1972 where the chosen sites may be near the edges of the front image sensor 1970 and back image sensor 1972, and may form the vertices of a triangle, square or other polygons as to ensure that alignment is guaranteed throughout front image sensor 1970 and back image sensor 1972. The alignment process may also be used to determine an accurate measure of the distance between the two sensors by timing the arrival of the laser light, which may be pulsed, onto each of the sensors.

Persons of ordinary skill in the art will appreciate that while Silicon has been suggested as the material for the photo-detector layers of FIG. 19A-B, any other appropriate semiconductor material such as, for example, Ge, could be utilized. For example, materials with different bandgaps could be used for each of the image sensor arrays so as to have sensitivities to different optical spectra or optical spectrum. Furthermore, the geometric structure of the photo-detectors may also be altered independently so as to allow each one to have different optical intensity saturation levels. Moreover, additional implants and structural modifications may be performed to optimize the charge collection within the photo-detectors. Further, adjustments in the alignment of the photo-detectors may be performed virtually, as part of a software program and memory with offsets. Thus the invention is to be limited only by the appended claims.

Figure 20A:
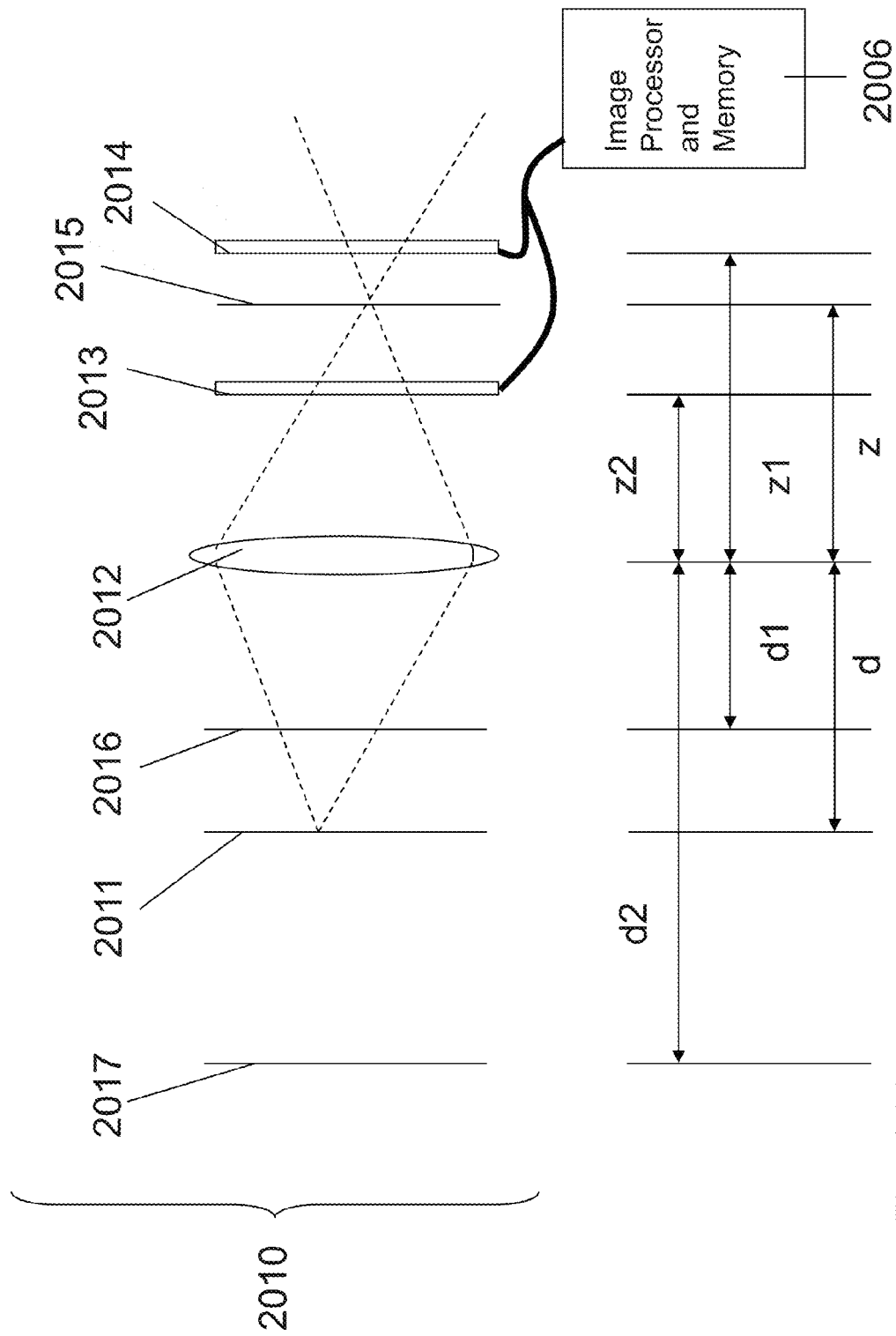
FIGS. 20A-20D illustrate an embodiment of this invention, where algorithms are described to reconstruct an object at a given distance from the lens imaged by a camera system that includes a lens and two image sensor arrays parallel to each other and to the lens, wherein each sensor array is of distinct distance from the lens.

FIG. 20A illustrates an embodiment of the invention, where an imaging system 2010 may include a lens 2012 with focal length f and aperture of size R, a front image sensor 2013 set at distance z2 from the lens 2012 on its image side (the location of which corresponds to the image focal plane of another plane 2017 at distance d2 from the lens 2012 on its real side), a back image sensor 2014 set at a distance z1 from the lens 2012 on its image side (the location of which corresponds to the image focal plane of another plane 2016 at distance d1 from the lens 2012 on its real side). The real workspace on the real side of the lens 2012 may be bounded by the plane 2016 and plane 2017 at distances d1 and d2 respectively from the lens 2012 on the real side. The images collected from front image sensor 2013 and back image sensor 2014 may be processed and stored by an integrated image processor and memory system 2006, which may be connected to the image sensor arrays front image sensor 2013 and back image sensor 2014. For example, a plane or slice 2011 of a scene in the workspace bounded by plane 2017 and plane 2016 may have a corresponding image focal plane 2015 on the image side of lens 2012, which may lie between front image sensor 2013 and back image sensor 2014. Front image sensor 2013 and back image sensor 2014 may be parallel with respect to each other. The term imaging system may also be referred to as a camera system, or an optical imaging system, herein.

For reconstructing images on planes on either side of the lens 2012, image mapping may be performed using algorithms from Fourier optics utilizing the Fourier transform, available through commercial packages such as the MATLAB Image Processing Toolbox. It will be useful to recall here the Lens-maker's equation which states that for an object on a plane at a distance o from a lens of focal length f where f<<o, the focal image plane of the object will lie at a distance i on the opposite side of the lens according to the equation: $1/o + 1/i = 1/f$.

Figure 20B:
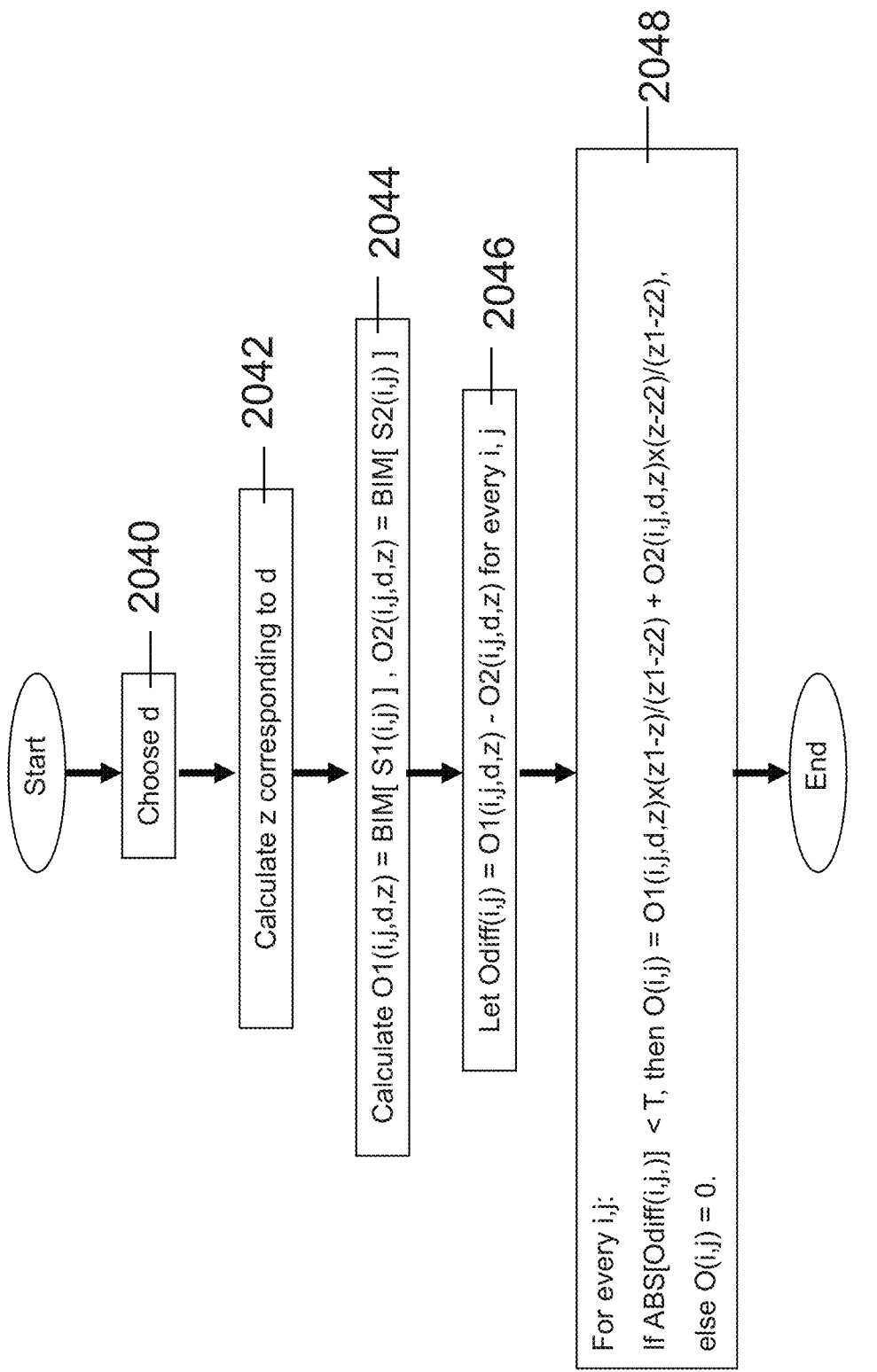

For the image reconstruction algorithms discussed herein, the following notations will be used:

d:=distance from lens on real side
d0:=initial distance from lens on real side
z:=distance from lens on image side
s: =space step interval
f(s):=nonlinear step interval e.g. f(s)=sAn
t:=time
t0:=starting time
ts:=time step interval
S1(i,j):=matrix data of image detected on front image sensor 2013
S2(i,j):=matrix data of image detected on back image sensor 2014
O(i,j):=reconstructed image from S1 and S2
OS(i,j):=stored reconstructed data O(i,j)
S1(i,j,t):=stored matrix data of image detected on front image sensor 2013 at time t
S2(i,j,t):=stored matrix data of image detected on back image sensor 2014 at time t
FIM(O, d, z):=forward image mapping (FIM) operation from an image O on the real side of the lens 2012 at distance d from lens 2012 to the image side of the lens 2012 at a distance z from lens 2012
BIM(O, d, z):=backward image mapping (BIM) operation from an image O on the image side of the lens 2012 at distance z from lens 2012 to the real side of the lens 2012 at a distance d from lens 2012
I1(i,j,d,z1):=FIM operation of object matrix upon S1(i,j) at specified d, and z=z1
I2(i,j,d,z2):=FIM operation of object matrix upon S2(i,j) at specified d, and z=z2
IS1(i,j):=stored I1 data
IS2(i,j):=stored I2 data
O1(i,j,d,z1):=BIM operation on S1(i,j) at specified d, z=z1
O2(i,j,d,z2):=BIM operation on S2(i,j) at specified d, and z=z2
Odiff(i,j):=O1(i,j,d,z)−O2(i,j,d,z) for every i,j
Odiff(i,j,k):=O1(i,j,d,z)−O2(i,j,d,z) for every i, j with k as the iteration variable if values are to be stored
ABS[a]:=absolute value operation on a scalar a
NORM[A]:=A matrix norm operation (for example, a 2-norm)
GET_SHARP[A]:=extract object within image data that exhibits the most contrast compared to its surroundings.
T:=error tolerance between the corresponding elements of 2 matrices
E:=error tolerance of any scalar comparison
FFT(M):=fast fourier transform operation on a matrix M
IFFT(M):=inverse fast fourier transform operation on a matrix M
OF(i,j):=O(i,j) in Fourier space
OF1(i,j):=O1(i,j) in Fourier space
OF2(i,j):=O2(i,j) in Fourier space
OFdiff(i,j):=OF1(i,j,d,z)−OF2(i,j,d,z) for every i, j FIG. 20B illustrates an algorithm by which a plane of distance d from the lens 2012 is chosen by the viewer and the image on that plane may be reconstructed and is outlined here as Algorithm 20A:

Step A (2040): choose d>>f, d1<=d<=d2
Step B (2042): calculate z from d using the lens-maker's formula
Step C (2044): O1 and O2 are calculated by BIM operations on S1 and S2 respectively
Step D (2046): Calculate Odiff:=O1-O2 for every element in the matrices O1 and O2
Step E (2048): Calculate the linear distance weighted estimate of the reconstructed object O(i,j) as expressed by:
For every i,j:

If $ABS[Odiff(i,j)] < T$, then $O(i,j) = O1(i,j,d,z) \times (z1-z)/(z1-z2) + O2(i,j,d,z) \times (z-z2)/(z1-z2)$, else O(i,j)=0.

Figure 20C:
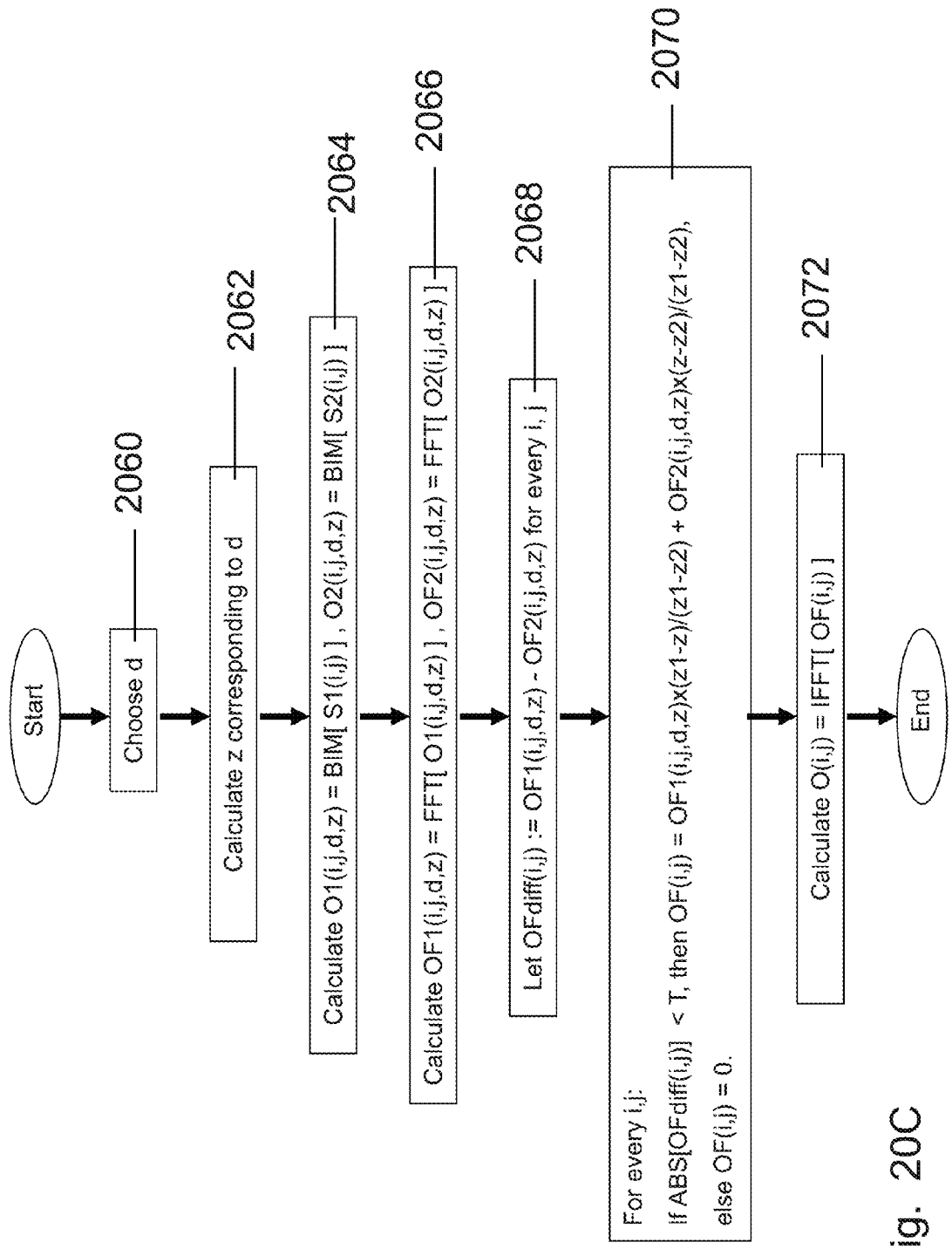

FIG. 20C illustrates another algorithm by which a plane of distance d from the lens 2012 is chosen by the viewer and the image on that plane may be transformed in Fourier space, reconstructed, then transformed back in real space, and is outlined here as Algorithm 20B:
Step A (2060): choose d>>f, d1<=d<=d2
Step B (2062): calculate z from d using the lens-maker's formula
Step C (2064): O1 and O2 are calculated by BIM operations on S1 and S2 respectively
Step D (2066): OF1 and OF2 are calculated by FFT operations on O1 and O2 respectively
Step E (2068): OFdiff:=OF1−OF2 is calculated for every element in the matrices OF1 and OF2
Step F (2070): Calculate the linear distance weighted estimate of the reconstructed object OF(i,j) in Fourier space as expressed by:
For every i,j:

If $ABS[OFdiff(i,j)] < T$, then $OF(i,j) = OF1(i,j,d,z) \times (z1-z)/(z1-z2) + OF2(i,j,d,z) \times (z-z2)/(z1-z2)$, else OF(i,j)=0.
Step G (2072): O(i,j) is extracted in real space by performing the IFFT operation on OF(i,j)

Figure 20D:
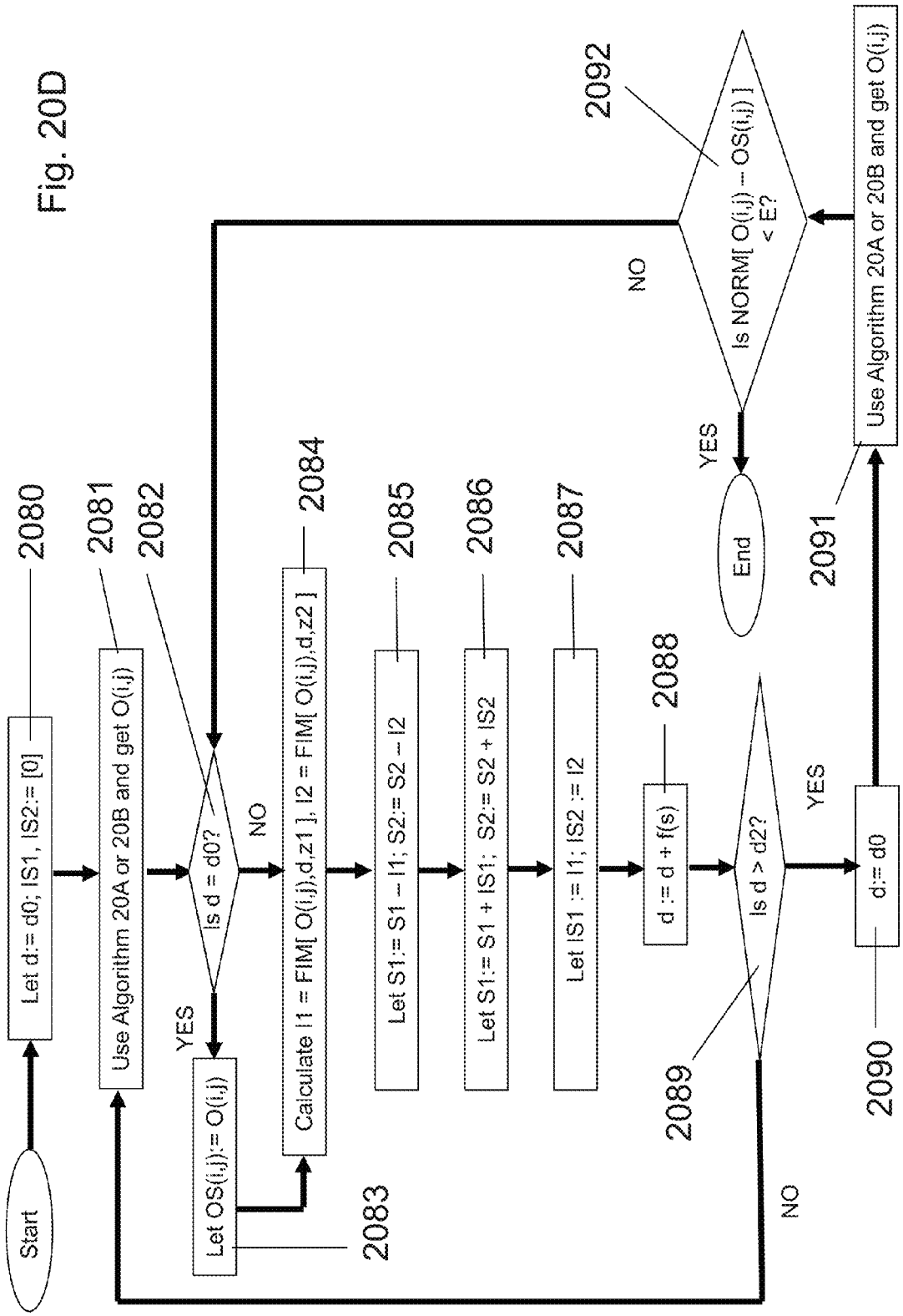

FIG. 20D illustrates an iterative algorithm by which the workspace may be reconstructed using planes at intervals of the distance d from the lens 2012 between d1 and d2. A stepping algorithm may be performed wherein d marches from d1 towards d2 which may use nonlinear intervals such as a geometric relationship. Upon completion, the cycle may be repeated and the reconstructed image of a plane at a particular d is compared to the image of the same plane from the previous cycle. If the difference between these two images are within some error tolerance, then the set of images from that particular cycle may be accepted as the reconstruction of the workspace. Otherwise, the cycle may continue through another iteration. The algorithm is outlined here as Algorithm 20C:
Step A (2080): Start with d=d0, d1<=d0<=d2, initialize IS1, IS2 as zero matrices
Step B (2081): Use Algorithm 20A or Algorithm 20B to calculate O(i,j)
Step C (2082): Check if d=d0, if yes go to Step D otherwise continue to Step E
Step D (2083): Store O(i,j) into OS(i,j)
Step E (2084): Calculate I1 and I2 by FIM operations on O(i,j)
Step F (2085): Take I1 and I2 out from sensor data S1 and S2 respectively.
Step G (2086): Add stored data IS1 and IS2 (I1 and I2 from previous step) to sensor data S1 and S2 respectively.
Step H (2087): Store current I1 and I2 into IS1 and IS2 respectively.
Step I (2088): Increment d by some interval function such as a geometric relationship.
Step J (2089): If d has not exceeded d2, loop back to Step B (2081) and continue from there
Step K (2090): If d has exceeded d2, reset d=d0
Step L (2091): Use Algorithm 20A or Algorithm 20B to calculate O(i,j)
Step M (2092): Compare O(i,j) with OS(i,j) using a matrix norm operation, and if within error tolerance, algorithm ends. Else algorithm loops back to Step C (2082) and continues on.

Figure 21A:
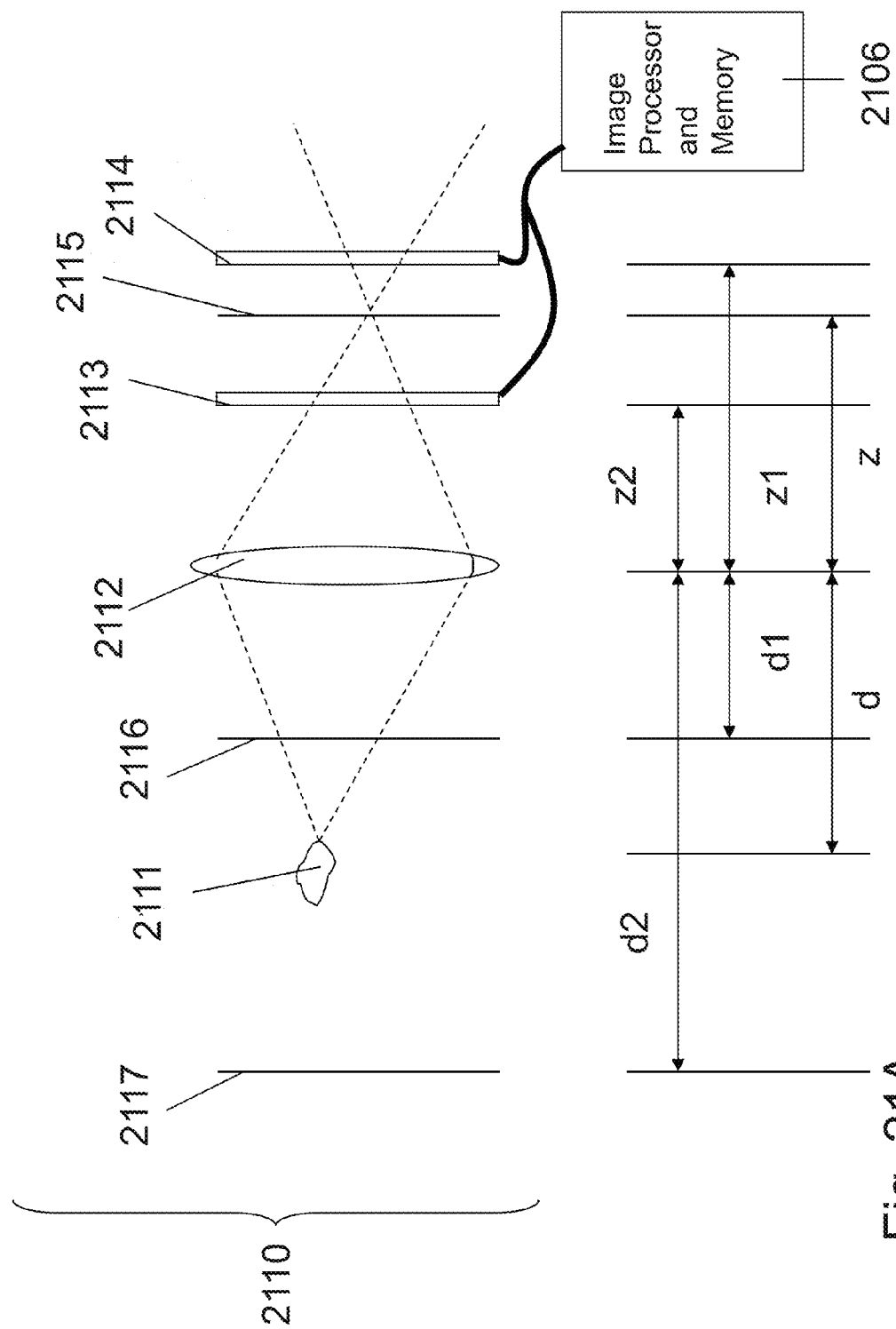
FIGS. 21A-21C illustrate an embodiment of this invention, where algorithms are described to reconstruct an object of unknown distance from the lens imaged by a camera system that includes a lens and two image sensor arrays parallel to each other and to the lens, wherein each sensor array is of distinct distance from the lens.

FIG. 21A illustrates an embodiment of the invention, where an imaging system 2110 may include a lens 2112 with focal length f and aperture of size R, a front image sensor 2113 set at distance z2 from the lens 2112 on its image side (the location of which corresponds to the image focal plane of another plane 2117 at distance d2 from the lens 2112 on its real side), a back image sensor 2114 set at distance z1 from the lens 2112 on its image side (the location of which corresponds to the image focal plane of another plane 2116 at distance d1 from the lens 2112 on its real side). The real workspace on the real side of the lens 2112 may be bounded by plane 2116 and plane 2117 at distances d1 and d2 respectively from the lens 2112 on the real side. A distinct object 2111 lies on a plane at an unknown distance d from the lens 2112, and assuming a general situation where d is neither equal to d1 nor d2, the images of the object 2111 on front image sensor 2113 and back image sensor 2114 will not be in sharp focus (blurred), and the object's image focal plane 2115 will lie between the sensor planes, front image sensor 2113 and back image sensor 2114. The images may be processed and stored by an integrated image processor and memory system 2106 connected to the image sensor arrays front image sensor 2113 and back image sensor 2114. Front image sensor 2113 and back image sensor 2114 may be parallel with respect to each other.

Figure 21B:
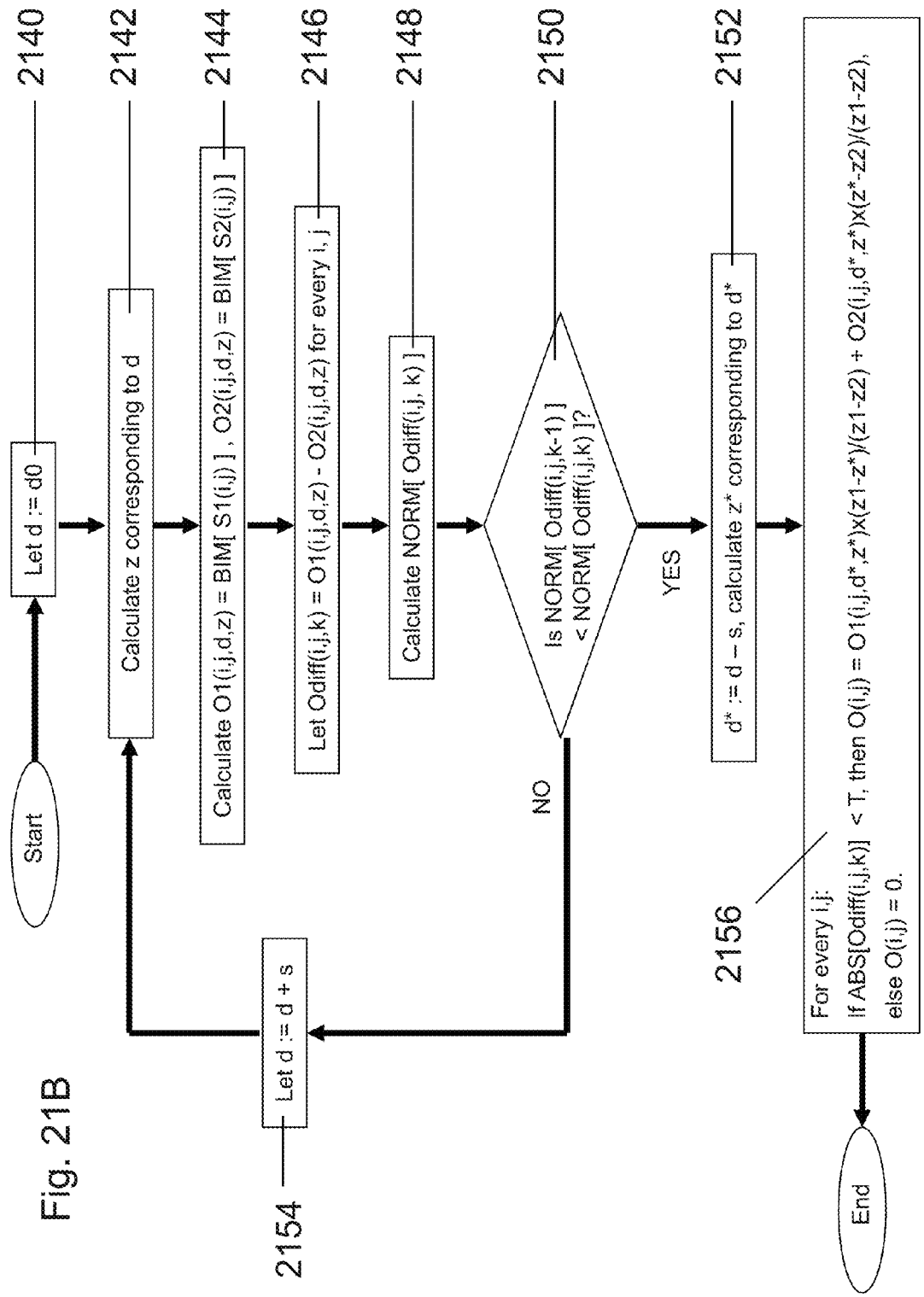

FIG. 21B illustrates an algorithm by which a single distinct object of unknown distance d from the lens 2112 is present and its image may be reconstructed. Determination of distance d of the object 2111 may be achieved through a marching algorithm searching for the minimum of Odiff(i,j) indicating best match, and is outlined here as Algorithm 21A:
Step A (2140): starting d=d0 is chosen, d1<=d0<=d2
Step B (2142): calculate z from d using the lens-maker's formula
Step C (2144): O1 and O2 are calculated by BIM operations on S1 and S2 respectively
Step D (2146): Odiff:=O1−O2 is calculated for every element in the matrices O1 and O2
Step E (2148): NORM operation is performed on Odiff
Step F (2150): If the result of the NORM operation reveals a minimum,
then
Step G (2152): d* is found and z* is calculated,
else
Step H (2154): d is incremented by s and the steps B-F are repeated.
Step I (2156): Calculate the linear distance weighted estimate of the reconstructed object O(i,j) as expressed by:
For every i,j:

If $ABS[Odiff(i,j)] < T$, then $O(i,j) = O1(i,j,d,z) \times (z1-z)/(z1-z2) + O2(i,j,d,z) \times (z-z2)/(z1-z2)$, else O(i,j)=0.

Figure 21C:
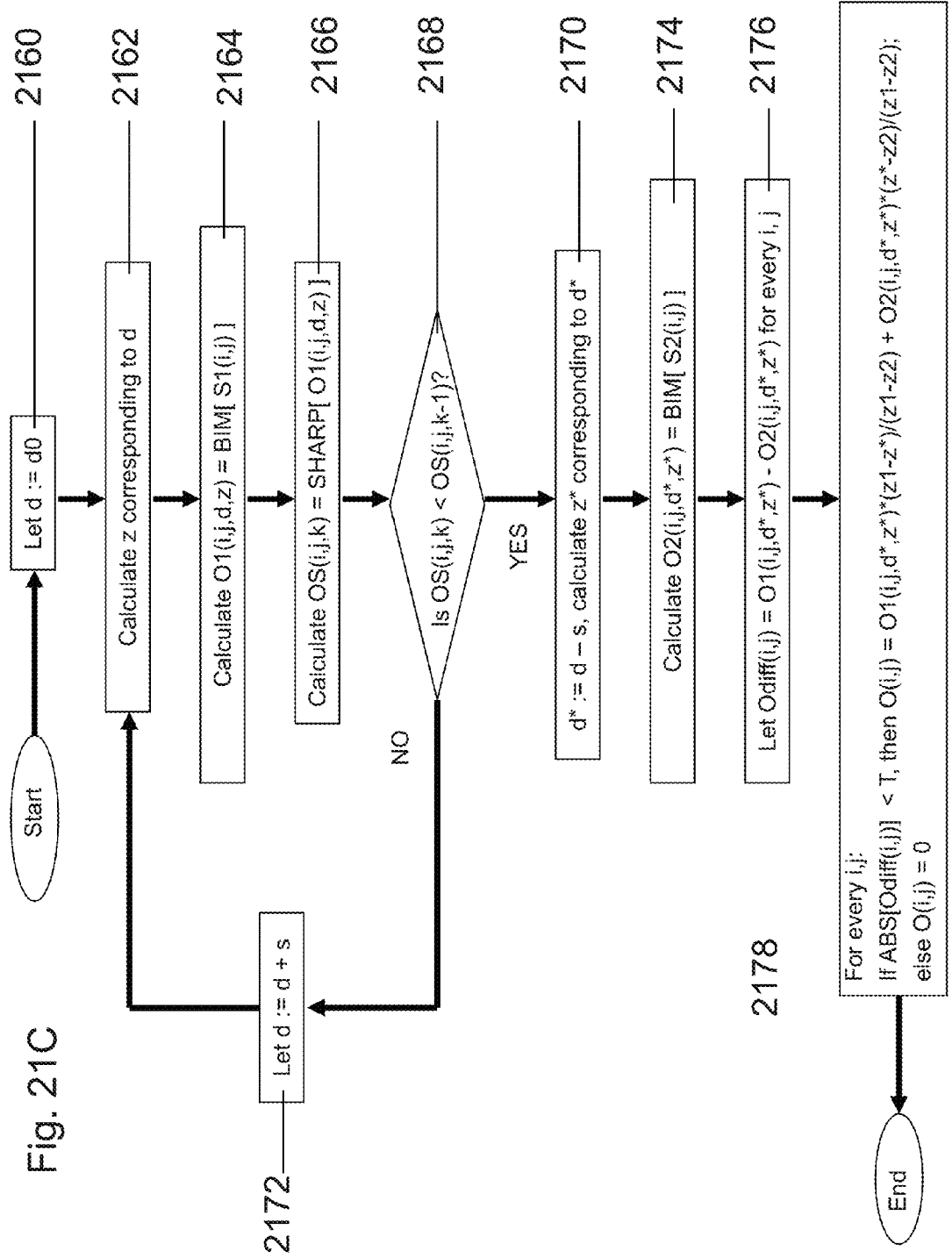

FIG. 21C illustrates another algorithm by which a single distinct object of unknown distance d from the lens 2112 is present and its image may be reconstructed. Determination of distance d of the object 2111 may be achieved through a marching algorithm searching for the maximum sharpness of O1(i,j) indicating best match. Sharpness may be calculated by any of known methods such as contrast and high-frequency content calculations. The algorithm is outlined here as Algorithm 21B:
Step A (2160): starting d=d0 is chosen, d1<=d0<=d2
Step B (2162): calculate z from d using the lens-maker's formula
Step C (2164): O1 is calculated by BIM operation on S1
Step D (2166): Sharpness value of O1 is calculated and stored in OS
Step E (2168): If a sharpness maximum is found, then
Step F (2170): d* is determined and z* is calculated else
Step G (2172): d is incremented by s and steps B-E are repeated.
Step H (2174): O2 is calculated using BIM operation on S2 with d* and z*
Step I (2176): Odiff:=O1−O2 is calculated for every element in the matrices O1 and O2
Step J (2178): Calculate the linear distance weighted estimate of the reconstructed object O(i,j) as expressed by:
For every i,j:

If $ABS[Odiff(i,j)] < T$, then $O(i,j) = O1(i,j,d,z) \times (z1-z)/(z1-z2) + O2(i,j,d,z) \times (z-z2)/(z1-z2)$, else O(i,j)=0.

Figure 22A:
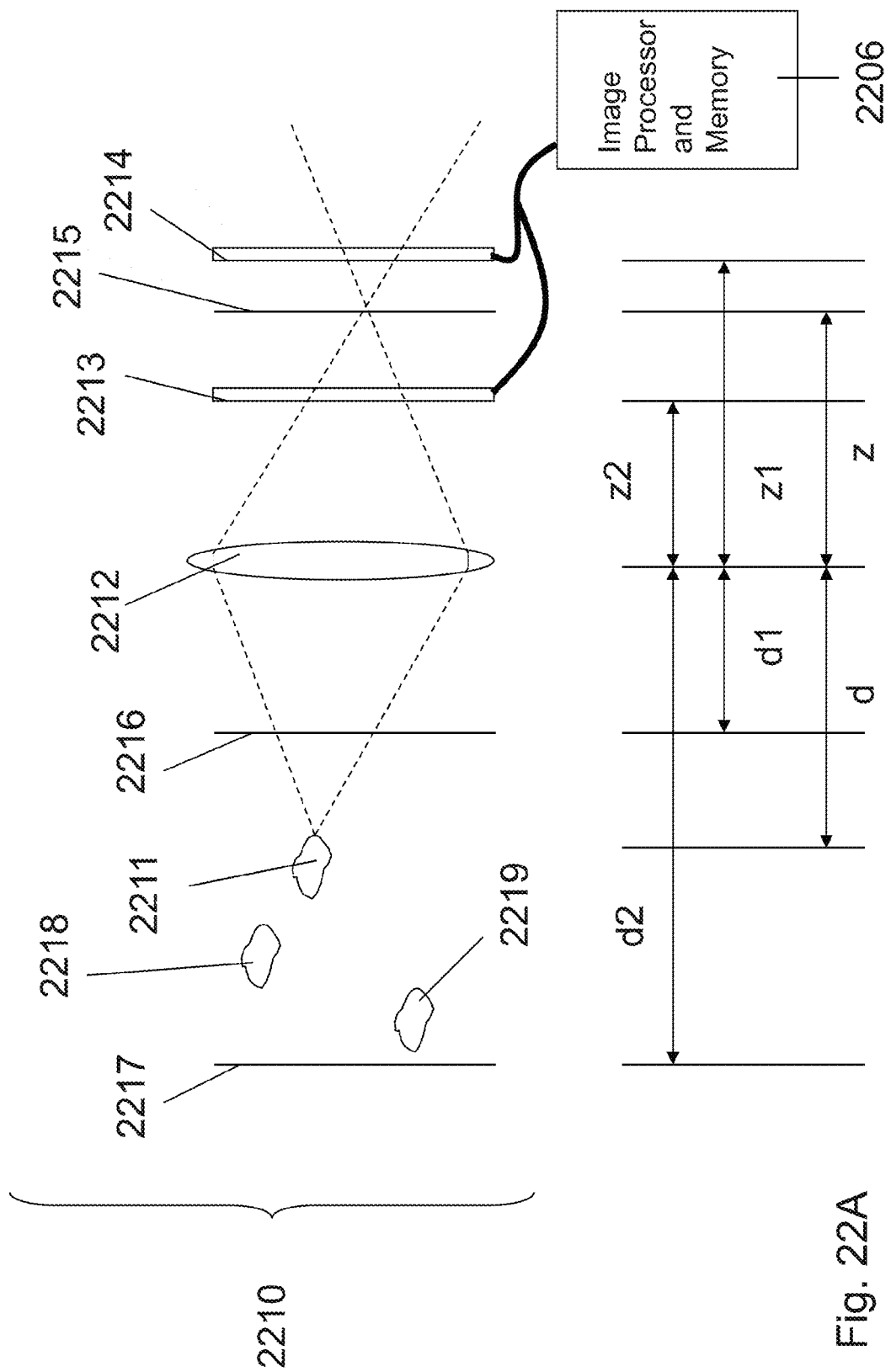
FIGS. 22A-22B illustrate an embodiment of this invention, where an algorithm is described to reconstruct multiple objects of unknown distances from the lens imaged by a camera system that includes a lens and two image sensor arrays parallel to each other and to the lens, wherein each sensor array is of distinct distance from the lens.

FIG. 22A illustrates an embodiment of the invention, where an imaging system 2210 may include a lens 2212 with focal length f and aperture of size R, a front image sensor 2213 set at distance z2 from the lens 2212 on its image side (the location of which corresponds to the image focal plane of another plane 2217 at distance d2 from the lens 2212 on its real side), a back image sensor 2214 set at distance z1 from the lens 2212 on its image side (the location of which corresponds to the image focal plane of another plane 2216 at distance d1 from the lens 2212 on its real side). The real workspace on the real side of the lens 2212 may be bounded by plane 2216 and plane 2217 at distances d1 and d2 respectively from the lens 2212 on the real side. Multiple distinct objects 2211, 2218, 2219 lie on a plane at unknown distances d, d4, d5 from the lens 2212. For example, distinct object 2211 in the workspace bounded by plane 2217 and plane 2216 may have a corresponding image focal plane 2215 on the image side of lens 2212, which may lie between front image sensor 2213 and back image sensor 2214. The images may be processed and stored by an integrated image processor and memory system 2206 connected to the image sensor arrays front image sensor 2213 and back image sensor 2214. Front image sensor 2213 and back image sensor 2214 may be parallel with respect to each other.

Figure 22B:
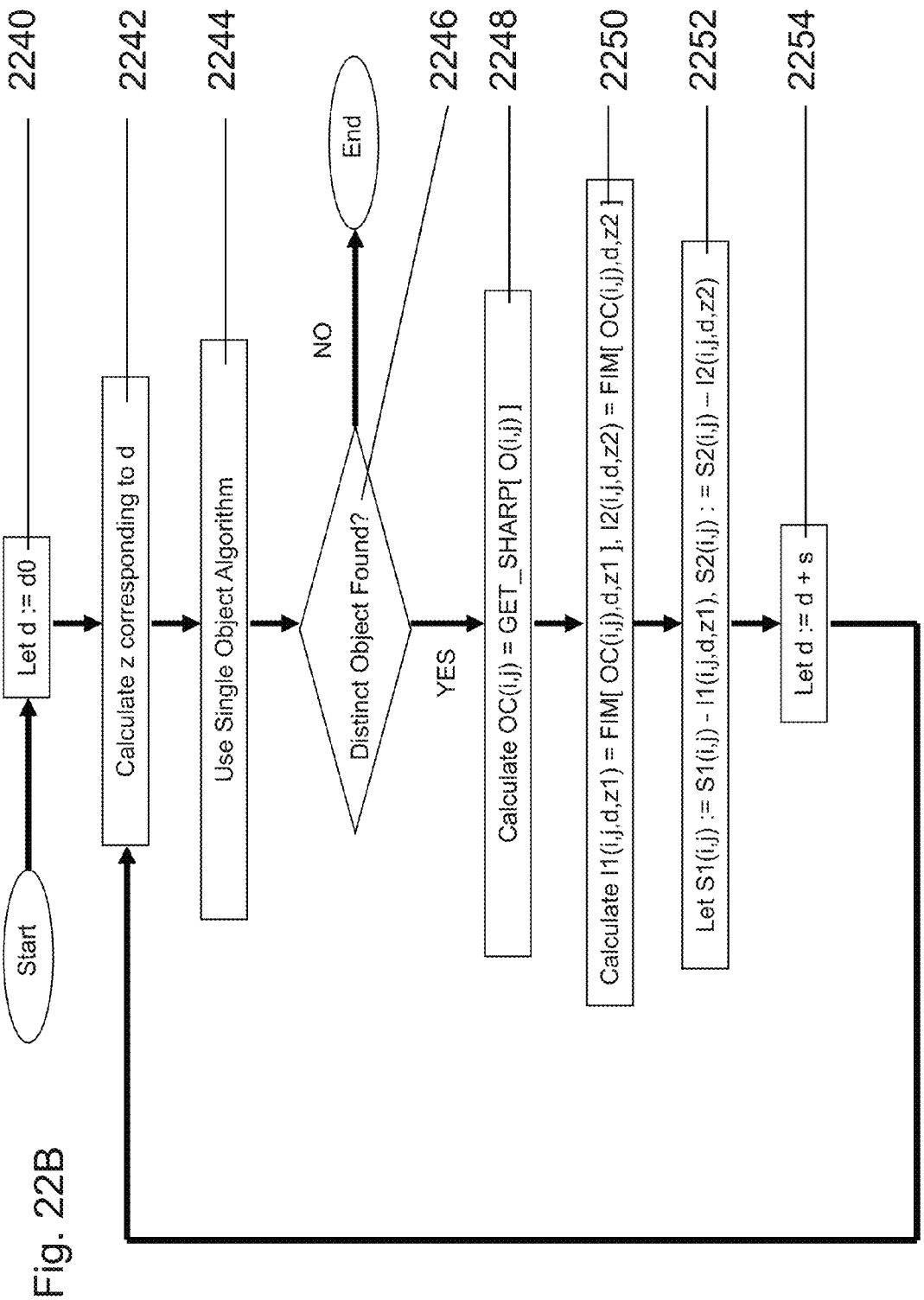

FIG. 22B illustrates an algorithm by which multiple distinct objects of unknown distances d, d4, d5 from the lens 2212 are present and their images may be successively reconstructed. Reconstruction of the objects may be achieved through a marching algorithm searching for each object from near to far from the lens in succession and performing an image subtraction operation after each object is found. The algorithm is outlined here as Algorithm 22A:
Step A (2240): starting d=d0 is chosen
Step B (2242): calculate z from d using the lens-maker's formula
Step C (2244): Use algorithms 20A, 21A or 21B to find nearest object.
Step D (2246): If no object is found, algorithm stops.
Step E (2248): If object is found, the GET_SHARP operation is performed to extract image of only the object OC from O
Step F (2250): I1 and I2 are calculated by FIM operations on OC upon front image sensor 2213 and back image sensor 2214 respectively: I1=FIM(OC, d, z1), I2=FIM(OC, d, z2)
Step G (2252): The sensor image data S1 and S2 are updated by subtracting I1 and I2 respectively.
Step H (2254): d is incremented to look for the next object.

Figure 23:
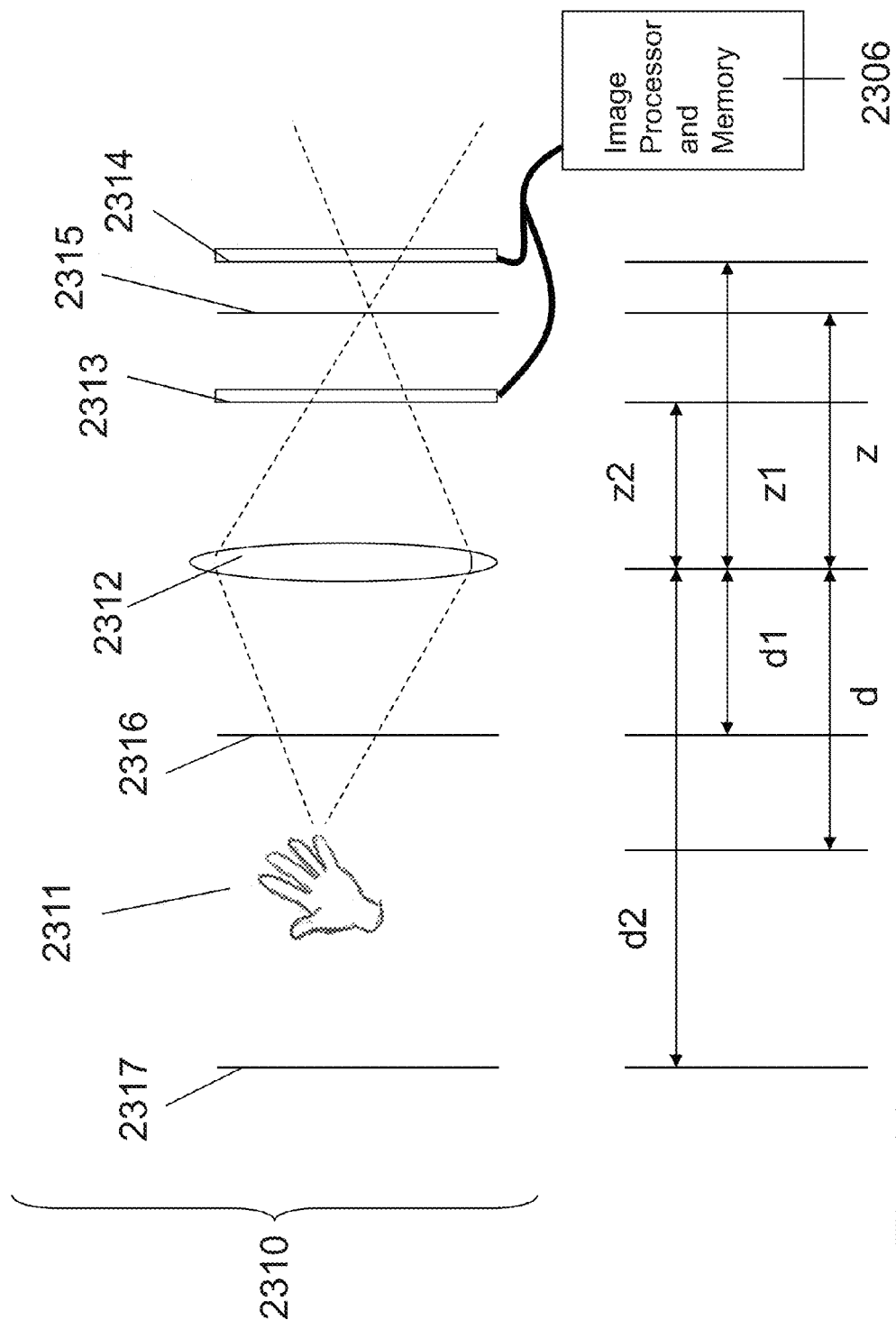
FIG. 23 illustrates an embodiment of this invention, where a remote control system uses hand gestures which are reconstructed by a camera system that includes a lens and two image sensor arrays parallel to each other and to the lens, wherein each sensor array is of distinct distance from the lens.

FIG. 23 illustrates an embodiment of the invention, where an imaging system 2310 may be set up as a gesture control system including a lens 2312 with focal length f and aperture of size R, a front image sensor 2313 set at distance z2 from the lens 2312 on its image side (the location of which corresponds to the image focal plane of another plane 2317 at distance d2 from the lens 2312 on its real side), a back image sensor 2314 set at distance z1 from the lens 2312 on its image side (the location of which corresponds to the image focal plane of another plane 2316 at distance d1 from the lens 2312 on its real side). The real workspace on the real side of the lens 2312 may be bounded by plane 2316 and plane 2317 at distances d1 and d2 respectively from the lens 2312 on the real side. An isolated hand 2311 or similar such object may be placed within the real workspace, and may be isolated from other objects within the real space by, for example, a technique using a glove over the hand with a specific color and using a filter gel over the lens with the same color as the glove. Isolated hand 2311 may have a corresponding image focal plane 2315 on the image side of lens 2312, which may lie between front image sensor 2313 and back image sensor 2314. At a fixed time t, isolated hand 2311 will then practically lie on the plane at some unknown distance d from the lens, and Algorithm 21A or Algorithm 21B may be used to reconstruct and image of the isolated hand 2311. An image recognition program may be used to recognize the gesture of the isolated hand 2311 at this point in time and a specific action that may be remote to the position of the isolated hand may be controlled accordingly. Time-stepping through multiple images of the isolated hand 2311 may allow a series of remote commands to be relayed or a combining of multiple gestures to relay a more complicated remote command. The images may be processed and stored by an integrated image processor and memory system 2306 connected to the image sensor arrays front image sensor 2313 and back image sensor 2314. Front image sensor 2313 and back image sensor 2314 may be parallel with respect to each other.

FIG. 24A illustrates an embodiment of the invention where a system similar to imaging system 4210 in FIG. 21A may be used in a surveillance camera system wherein by time-stepping through the image data recorded by the front image sensor 2113 and back image sensor 2114, static objects may be removed from the data and dynamic objects may be isolated and tracked. Algorithm 21A or Algorithm 21B may then be used at each time-step to reconstruct the image of the moving object. The desired time-step may typically be determined as the inverse of the frame rate of the camera recording. For example, Scene 1 2410 on front image sensor 4213 may show at time t=t0 static objects building 2412 and tree 2414. Scene 2 2420 on front image sensor 4213 shows at time t=t0+ts (the next time step ts after t0) static objects building 2412 and tree 2414, and new object, person 2416. The data S1 from the front image sensor 4213 that will be used for image reconstruction may then be updated by subtracting the difference between Scene 2 2420 and Scene 1 2410 to form differential scene 2430, thus removing static objects building 2412 and tree 2414, and leaving just dynamic object person 2416. Similar steps may be applied to back image sensor 2114. Algorithm 21A or Algorithm 21B may then be applied to differential scene 2430 to reconstruct the image. If multiple dynamic objects are present in the scene, Algorithm 22A may be used to track and reconstruct the objects.

Figure 24B:
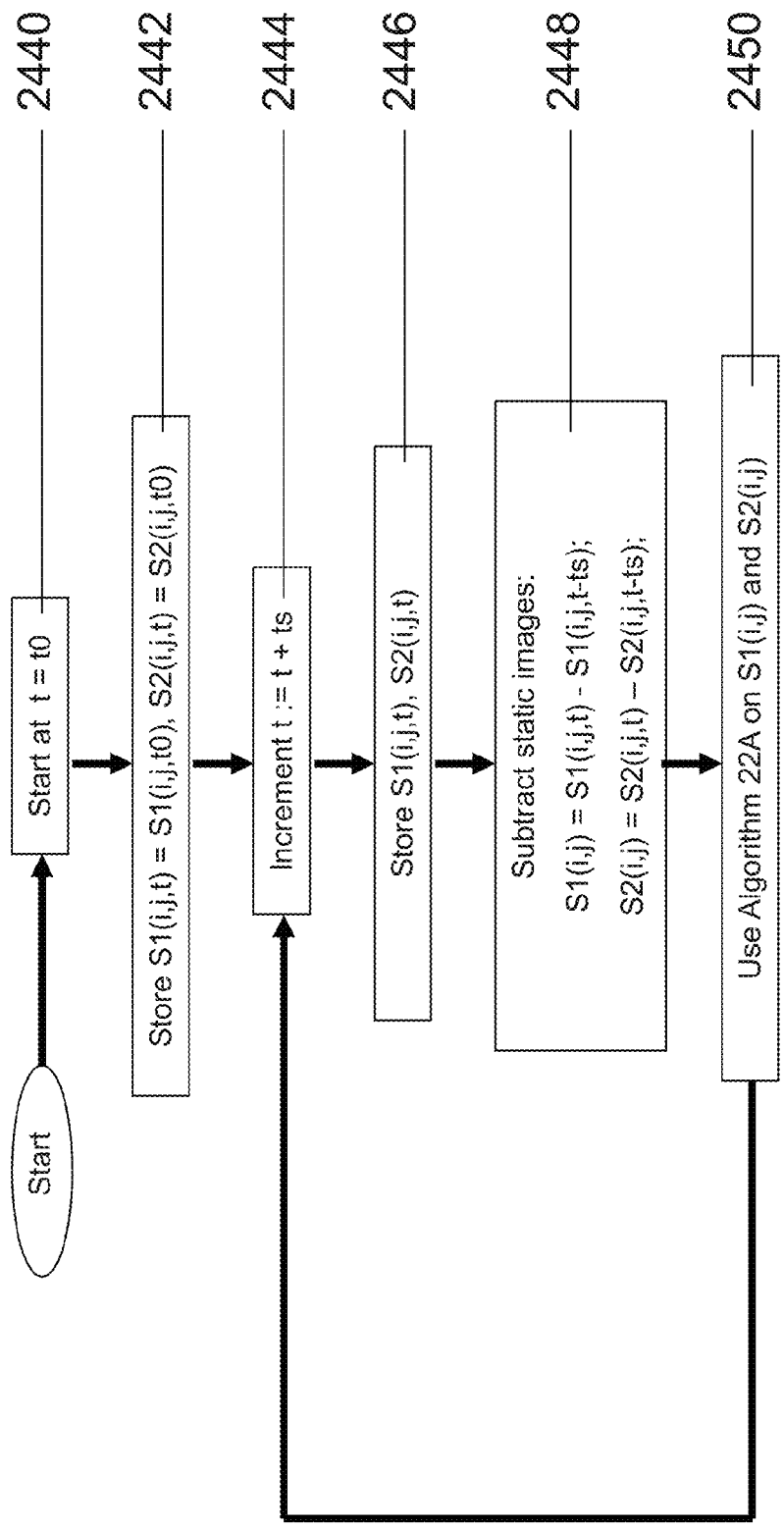

FIG. 24B illustrates an algorithm by which a surveillance camera system through time-stepping may track and reconstruct multiple distinct dynamic objects of unknown distances from the lens. The algorithm is outlined here as Algorithm 24A:
Step A (2440): Start at t=t0
Step B (2442): Store sensor data S1 and S2 at t=t0
Step C (2444): Increment time by time-step ts: t:=t+ts
Step D (2446): Store sensor data S1 and S2 at new time t
Step E (2448): Calculate differential sensor data by subtracting sensor data S1 and S2 of previous time-step from sensor data S1 and S2 of current time-step, eliminating images of static objects.
Step F (2450): Perform Algorithm 22A with differential sensor data as inputs S1 and S2
Step G: Go back to Step C (2444) and continue until desired.

Figure 25A:
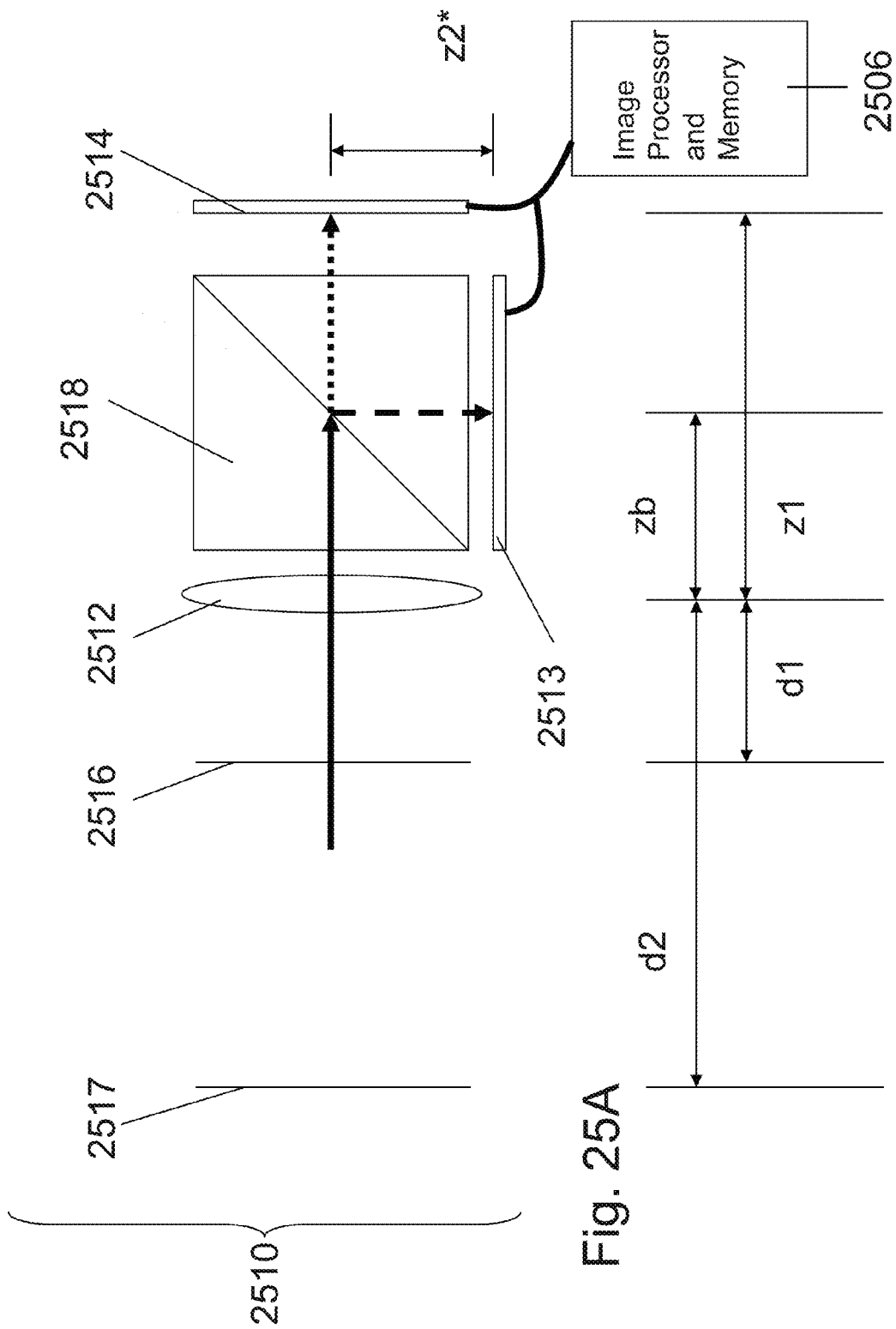
FIG. 25A illustrates an embodiment of this invention, where a camera system includes a lens, a beam-splitter and two image sensor arrays wherein images in front of the lens are split by the beam-splitter to the two image sensors wherein each sensor array is of distinct effective distance from the lens.

FIG. 25A illustrates another embodiment of the invention where a system similar to imaging system 2110 in FIG. 21A may be achieved with the use of a beam-splitter to split the image between the two image sensors. The imaging system 2510 may include a lens 2512 with focal length f and aperture of size R, a beam-splitter 2518 whose center is of distance zb from lens 2512 on its image side, a perpendicular image sensor 2513 (perpendicular in relation to the lens 2512) set at distance z2* from the center of the beam-splitter 2518, and whose effective distance from the lens, z2=zb+z2*, corresponds to the image focal plane of another plane 2517 at distance d2 from the lens 2512 on its real side, a parallel image sensor 2514 (parallel in relation to the lens 2512) set at distance z1 from the lens 2512 on its image side which corresponds to the image focal plane of another plane 2516 at distance d1 from the lens 2512 on its real side. The real workspace on the real side of the lens 2512 may be bounded by plane 2516 and plane 2517 at distances d1 and d2 respectively from the lens 2512. The images may be processed and stored by an integrated image processor and memory system 2506 connected to the image sensor arrays perpendicular image sensor 2513 and parallel image sensor 2514. Pixel alignment of the perpendicular image sensor 2513 and parallel image sensor 2514 may be achieved using the method described by FIG. 19C. Image reconstruction algorithms described in FIGS. 20-24 are applicable to the imaging system described in FIG. 25A.

Figure 25B:
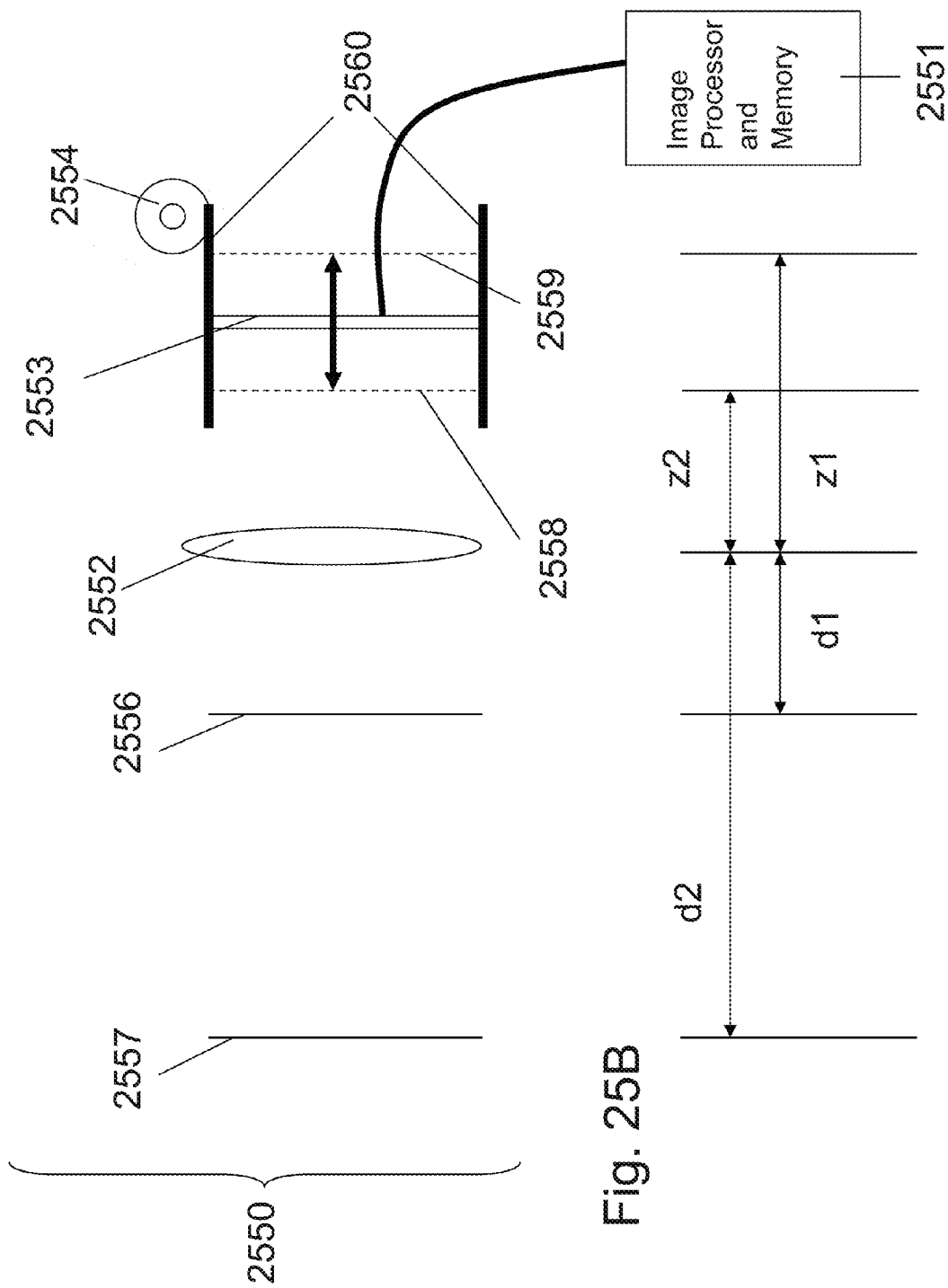
FIG. 25B illustrates an embodiment of this invention, where a camera system includes a lens, a fast motor and one image sensor array wherein images in front of the lens are detected by the image sensor while it is at two distinct positions relative to the lens within the time duration of interest. The image sensor is actuated back and forth with respect to the lens by the fast motor.

FIG. 25B illustrates another embodiment of this invention where a system similar to imaging system 2110 in FIG. 21A may be achieved with the use of a single image sensor that may be actuated back-and-forth from the lens by a fast motor. The single image sensor imaging system 2550 may include a lens 2552 with focal length f and aperture of size R, an image sensor 2553 parallel in relation to the lens 2512 set on rails 2560 on the image side of the lens 2552, and an actuation motor 2554 that drives the lens along the rails 2560 with respect to the lens 2552.

The image sensor 2553 may be actuated between two positions of distances z1 and z2 from the lens 2552. z1 is the location of image focal plane 2559 which corresponds to another plane 2556 at distance d1 from the lens 2552 on its real side, while z2 is the location of image focal plane 2558 which corresponds to another plane 2557 at distance d2 from the lens 2552 on its real side. The real workspace on the real side of the lens 2552 is bounded by plane 2556 and plane 2557 at distances d1 and d2 respectively from the lens 2552. The image sensor 2553 stores images of scenes within the real workspace when it is at locations z1 and z2 from the lens 2552. In this manner, it is behaving like two independent image sensors located at distances z1 and z2 from the lens 2552, similar to the imaging system 2010, and may have the advantage of not attenuating any of the light coming from the scene. The actuation motor 2554 may be a type of piezoelectric drive which typically has maximum linear speeds of 800,000 microns per second and precision of a few nanometers. For example, with a real workspace defined by the space from 1 to 10 meters from the lens of typical focal length about 5 mm, the distance between z1 and z2 with air in between will be about 22.5 microns, which allows the image sensor 2553 to move back and forth between the positions z1 and z2 at a rate of more than 15,000 times per second. Typically, this will be enough for a camera system to collect the two images where the frame rate is about 30 frames per second, even accounting for shutter speed and shutter delay. The collected images from image sensor array 2553 may be processed and stored by an integrated image processor and memory system 2051 connected to the image sensor array 2553.

Pixel alignment of the image sensor 2553 along the rails 2560 specifically at positions z1 and z2 may be achieved using the method described by FIG. 19C where in this case the location of the photo-detector that detects the laser beam is inspected at positions z1 and z2, and adjustments are made in the event of discrepancies. Image reconstruction algorithms described in FIGS. 20-24 are applicable to the imaging system described in FIG. 25A.

Several material systems have been illustrated as examples for various embodiments of this invention in this patent application. It will be clear to one skilled in the art based on the present disclosure that various other material systems and configurations can also be used without violating the concepts described. It will also be appreciated by persons of ordinary skill in the art that the present invention is not limited to what has been particularly shown and described hereinabove. Rather, the scope of the invention includes both combinations and sub-combinations of the various features described herein above as well as modifications and variations which would occur to such skilled persons upon reading the foregoing description. Thus the invention is to be limited only by the appended claims.

We claim:
1. An image sensor, comprising:
   a mono-crystallized silicon layer comprising a plurality of image sensor pixels, said mono-crystallized silicon layer bonded to a carrier wafer,
   wherein said mono-crystallized silicon layer bonded to said carrier wafer leaves a re-useable base wafer used to hold said mono-crystallized silicon layer;
   an oxide overlaying said mono-crystallized silicon layer; and
   a second mono-crystal layer overlaying said oxide,
   wherein said second mono-crystal layer comprises a plurality of single crystal transistors aligned to said image sensor pixels,
   wherein said plurality of single crystal transistors overlay said image sensor pixels, and wherein said second mono-crystal layer is less than 2 microns thick.
2. An image sensor wafer, comprising:
   a mono-crystallized silicon layer comprising a plurality of image sensor pixels, said mono-crystallized silicon layer bonded to a carrier wafer, wherein said mono-crystallized silicon layer bonded to said carrier wafer leaves a re-useable base wafer used to hold said mono-crystallized silicon layer; an oxide overlaying said mono-crystallized silicon layer; and a second mono-crystal layer overlaying said oxide, wherein said second mono-crystal layer comprises a plurality of single crystal transistors aligned to said image sensor pixels, wherein said plurality of single crystal transistors overlay said image sensor pixels, and wherein said single crystal transistors form a plurality of pixel control circuits.

3. An image sensor wafer, comprising:
   a mono-crystallized silicon layer comprising a plurality of image sensor pixels, said mono-crystallized silicon layer bonded to a carrier wafer,
   wherein said mono-crystallized silicon layer bonded to said carrier wafer leaves a re-useable base wafer used to hold said mono-crystallized silicon layer; an oxide overlaying said mono-crystallized silicon layer; and
a second mono-crystal layer overlaying said oxide, wherein said second mono-crystal layer comprises a plurality of single crystal transistors aligned to said image sensor pixels, and wherein said plurality of single crystal transistors overlay said image sensor pixels.

4. An image sensor wafer according to claim 3,
   wherein said second mono-crystal layer is less than 2 microns thick.

5. An image sensor wafer according to claim 3,
   wherein said mono-crystallized silicon layer comprises two crystalline layers,
   wherein said two crystalline layers comprise a first image sensor layer and a second image sensor layer.

6. An image sensor wafer according to claim 3,
   wherein said mono-crystallized silicon layer comprises two crystalline layers,
   wherein said two crystalline layers comprise a first transistors layer and a second transistors layer.

7. An image sensor wafer according to claim 3,
   wherein said mono-crystallized silicon layer is less than 6 microns thick.

8. An image sensor wafer according to claim 3,
   wherein said single crystal transistors form a plurality of pixel control circuits.

9. An image sensor wafer, comprising:
   a mono-crystallized silicon layer comprising a plurality of image sensor pixels, said mono-crystallized silicon layer bonded to a carrier wafer;
   wherein said carrier wafer comprises a mono-crystal layer comprising a plurality of single crystal transistors,
   wherein said plurality of single crystal transistors are aligned to said image sensor pixels with less than 100 nm alignment error, and
   wherein said plurality of single crystal transistors overlay said image sensor pixels.

10. An image sensor wafer according to claim 9, further comprising:
    an oxide layer between said mono-crystallized silicon layer and said carrier wafer.

11. An image sensor wafer according to claim 9,
    wherein said mono-crystallized silicon layer is less than 2 microns thick.

12. An image sensor wafer according to claim 9,
    wherein said image sensor pixels layer comprises two crystalline layers, and
    wherein said two crystalline layers comprise a first image sensor layer and a second image sensor layer.

13. An image sensor wafer according to claim 9,
    wherein said carrier wafer comprises two crystalline layers,
    wherein said two crystalline layers comprise a first transistor layer and a second transistor layer.

14. An image sensor wafer according to claim 9,
    wherein said image sensor pixels layer is less than 6 microns thick.

15. An image sensor wafer according to claim 9,
wherein said mono-crystallized silicon layer bonded to said carrier wafer leaves a re-useable base wafer used to hold said mono-crystallized silicon layer.

* * * * *